United States Patent [19]
Maeno

[11] Patent Number: 5,848,074
[45] Date of Patent: Dec. 8, 1998

[54] METHOD AND DEVICE FOR TESTING CONTENT ADDRESSABLE MEMORY CIRCUIT AND CONTENT ADDRESSABLE MEMORY CIRCUIT WITH REDUNDANCY FUNCTION

[75] Inventor: Hideshi Maeno, Tokyo, Japan

[73] Assignee: Mitsubishi Denki Kabushiki Kaisha, Tokyo, Japan

[21] Appl. No.: 649,281

[22] Filed: May 17, 1996

[30] Foreign Application Priority Data

Dec. 25, 1995 [JP] Japan ................................. 7-337064

[51] Int. Cl.⁶ .............................. G11C 29/00; G01R 31/78
[52] U.S. Cl. ..................... 371/21.3; 371/27.1; 371/21.1; 371/22.31
[58] Field of Search ................... 371/21.1, 21.2, 371/22.31, 67.1, 21.3, 27.1, 27.5, 27.6, 24; 365/201

[56] References Cited

U.S. PATENT DOCUMENTS

| | | | |
|---|---|---|---|
| 4,296,475 | 10/1981 | Nederlof | 365/49 |
| 4,532,606 | 7/1985 | Phelps | 365/49 |
| 4,959,811 | 9/1990 | Szczepanek | 365/49 |
| 4,982,362 | 1/1991 | Johnson et al. | 371/10.1 |
| 5,047,712 | 9/1991 | Koyama | 324/158 R |
| 5,130,945 | 7/1992 | Hamamoto et al. | 365/49 |
| 5,388,066 | 2/1995 | Hamamoto et al. | 365/189.07 |
| 5,400,342 | 3/1995 | Matsumura et al. | 371/21.2 |
| 5,491,703 | 2/1996 | Barnaby et al. | 371/40.1 |
| 5,561,671 | 10/1996 | Akiyama | 371/21.1 |
| 5,719,876 | 2/1998 | Warren | 371/22.3 |

*Primary Examiner*—Hoa T. Nguyen
*Attorney, Agent, or Firm*—Oblon, Spivak, McClelland, Maier & Neustadt, P.C.

[57] ABSTRACT

Automatic generation of a test pattern for test data to test a content addressable memory for failure is disclosed. An inverter (INV1) inverts a scan signal (SODI) outputted from a scan path to apply the inverted scan signal to a 1-input of a selector (SEL1). A scan input (SIDI) is the inverted version of a scan output from a scan flip-flop (SFF-D12). To test a content addressable memory (100), a test signal (CAMTEST) is set to "1", thereby producing input signals (DI0, DI1, DI2) in such a looped manner as: (0, 0, 0)→(1, 0, 0)→(1, 1, 0)→(1, 1, 1)→(0, 1, 1)→(0, 0, 1)→ (0, 0, 0)→ . . . .

20 Claims, 79 Drawing Sheets

F I G. 3 7
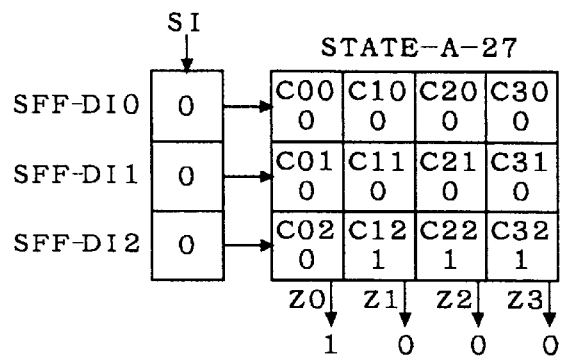
F I G. 3 8
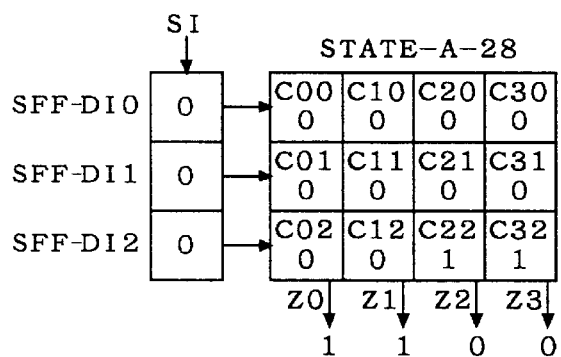
F I G. 3 9
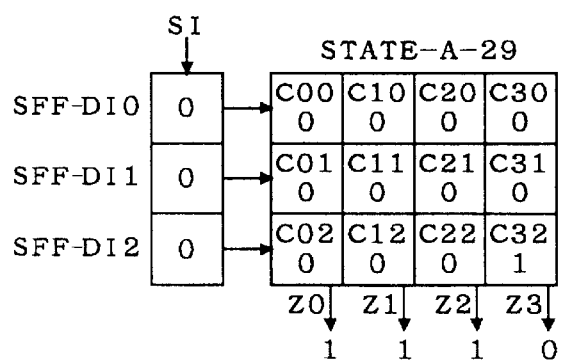

F I G. 6 2
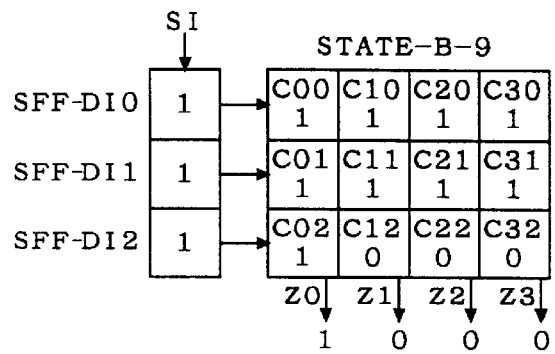
F I G. 6 3
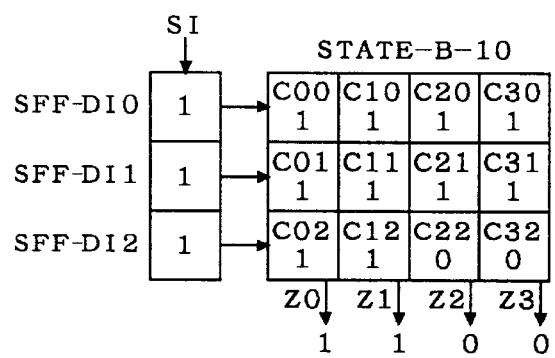
F I G. 6 4
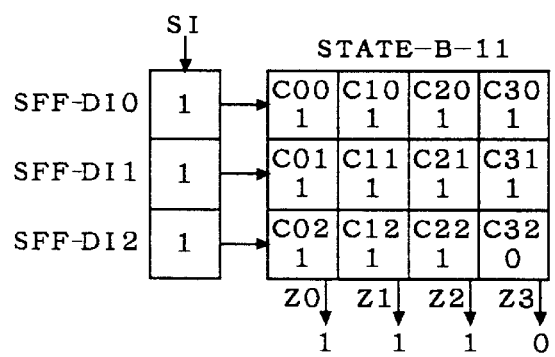

F I G. 1 4 0
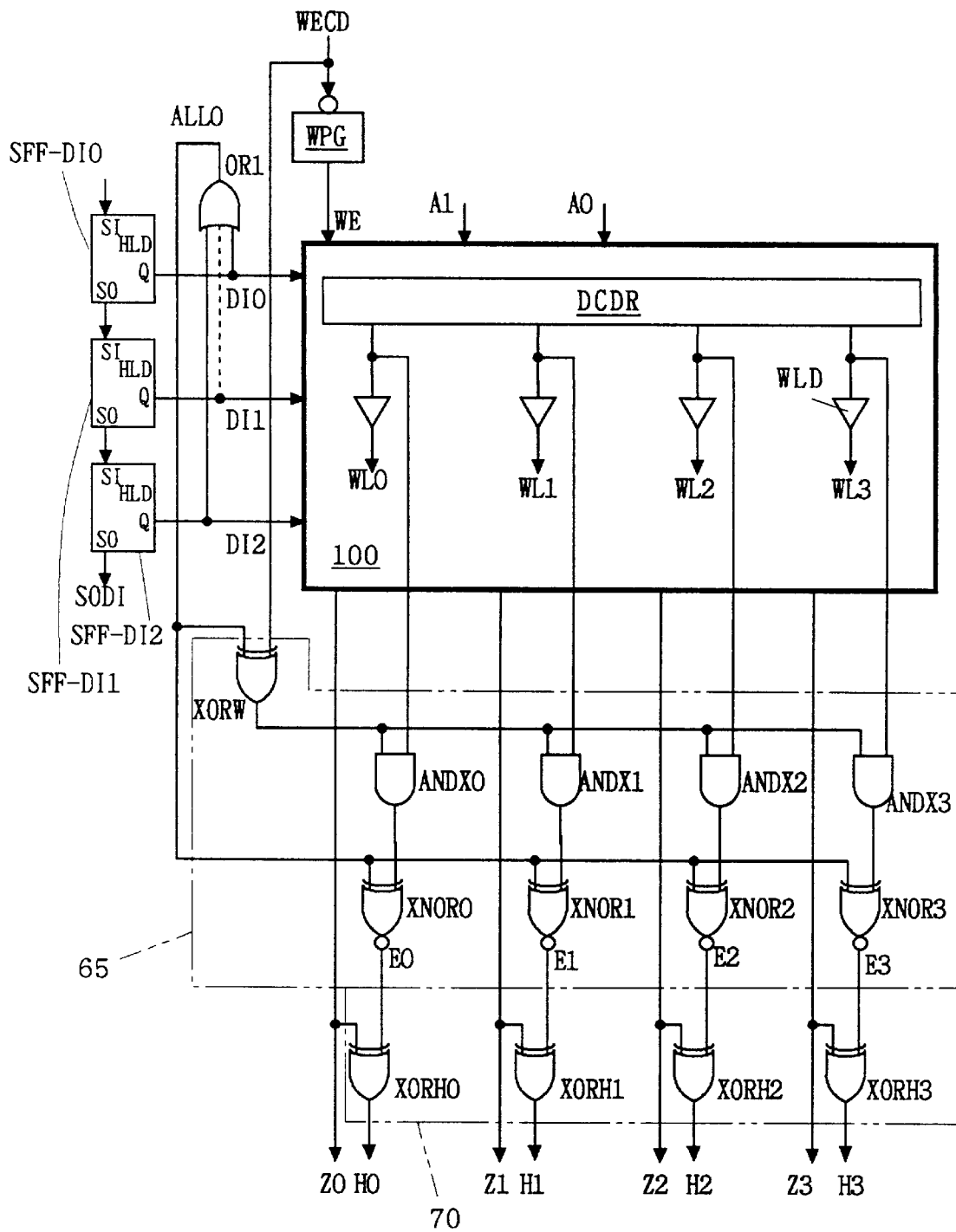

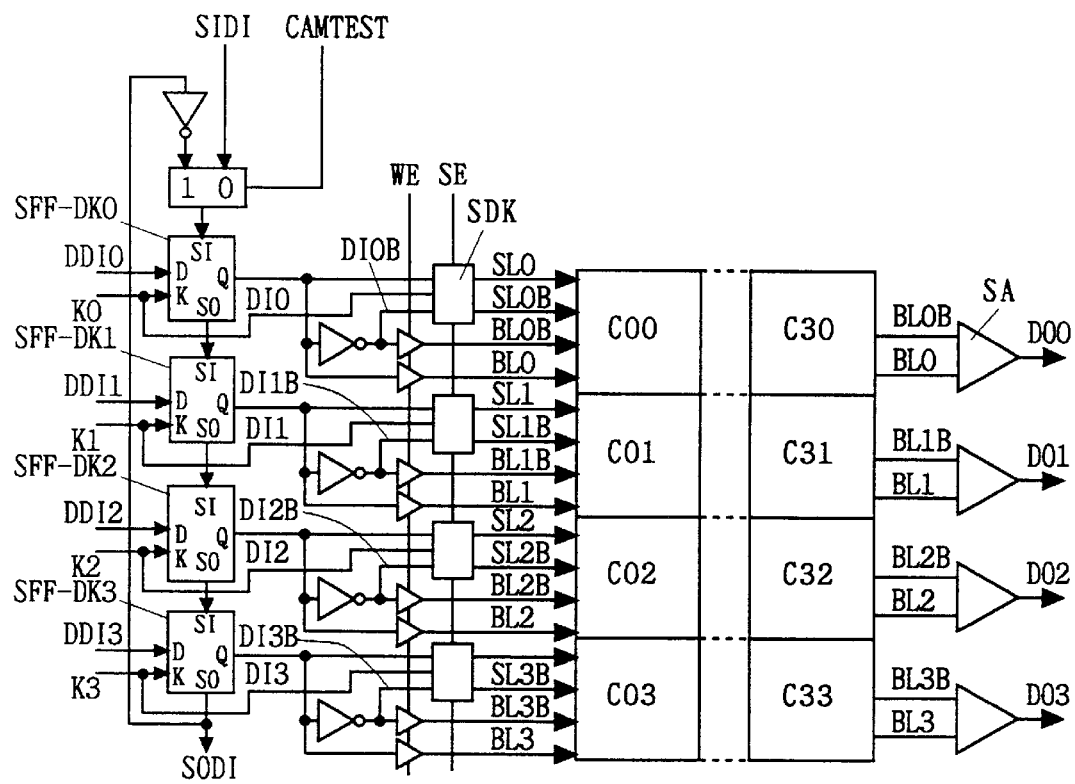
F I G. 1 5 5

METHOD AND DEVICE FOR TESTING CONTENT ADDRESSABLE MEMORY CIRCUIT AND CONTENT ADDRESSABLE MEMORY CIRCUIT WITH REDUNDANCY FUNCTION

BACKGROUND OF THE INVENTION

1. Field of the Invention

The present invention relates to a content addressable memory (CAM) and, more particularly, to a technique for detecting failures in a content addressable memory.

2. Description of the Background Art

FIG. 163 is a circuit diagram conceptually showing a conventional CAM 200. FIG. 164 is a circuit diagram of a content addressable memory cell Cij of the CAM 200.

The content addressable memory cell Cij of the CAM 200 comprises an exclusive-OR circuit XORij in addition to a random access memory cell Mij.

The exclusive-OR circuit XORij compares the data held in the memory cell Mij with the data on a search line SLj to provide an output Uij which is "0" when both of the data match and is "1" when they do not.

A plurality of content addressable memory cells Cij are used to form a two-dimensional array which has "columns" defined along a word line WLi and "rows" defined in the direction orthogonal to the word line WLi herein. The content addressable memory cells Cij of FIG. 163 are shown as arranged in the form of a matrix with 3 rows and 4 columns (i=0, 1, 2, 3; j=0, 1, 2).

The word line WLi is driven by a word line driver WLD. One of the word line drivers WLD is selectively activated by an output Xi from a decoder DCDR. The word line drivers WLD are sometimes dispensed with.

When a write enable signal WE is enabled, a bit line BLj is driven by a write driver WD in response to an input signal DIj. The state of the bit line BLj is detected by a sense amplifier SA and outputted to a data output DOj.

For each column, the OR of the coincidence outputs Uij is inverted to provide a column coincidence signal Zi. The production of the inversion of the OR is represented by using gate circuits NOR0, NOR1, NOR2, NOR3 in FIG. 163.

The column coincidence signal Zi is "1" when the data held in the content addressable memory cells Ci0, Ci1, Ci2 in an i-th column match the search data SL0, SL1, SL2, respectively. If a mismatch occurs in the i-th column, the column coincidence signal Zi is "0".

An OR circuit ORH performs an OR operation of all of the column coincidence signals Zi to provide a hit signal HIT. Thus, if at least one of the columns of the content addressable memory cells Cij stores a group of data matching the search data group (SL0, SL2, SL3), the hit signal HIT is "1".

To test such a CAM for failure, it is necessary to compare predetermined contents previously stored in the content addressable memory cells Cij of the CAM with test data in the form of the input signals DI0, DI1, DI2 while varying the test data and the predetermined contents into various patterns. It requires a great amount of time and handling to store huge patterns for testing (test patterns) in the content addressable memory cells Cij and to input the test data one by one.

SUMMARY OF THE INVENTION

A first aspect of the present invention is intended for a method of testing a content addressable memory circuit having an m by n array of content addressable memory cells, each of the content addressable memory cells being located in an i-th column ($0 \leq i \leq n-1$), a j-th row ($0 \leq j \leq m-1$). According to the present invention, the method comprises the steps of: (a) initializing all of the content addressable memory cells; (b) initializing a test pattern including zeroth to (m−1)-th input signals; (c) inverting the logic of the j-th input signal while updating a row number j to update the test pattern; (d) writing the test pattern into the i-th column of content addressable memory cells while updating a column number i; and (e) comparing the content held in the j-th row of content addressable memory cells for each column with the j-th input signal.

Preferably, according to a second aspect of the present invention, the steps (d) and (e) are repeated pairwise each time the row number j is updated in the step (c).

Preferably, according to a third aspect of the present invention, the steps (c), (e) and the steps (d), (e) are repeated pairwisek, respectively.

Preferably, according to a fourth aspect of the present invention, the steps (c) and (e) are repeated pairwise each time the column number i is updated in the step (d).

A fifth aspect of the present invention is intended for a test circuit for testing a content addressable memory circuit having an m by n array of content addressable memory cells, each of the content addressable memory cells being located in an i-th column ($0 \leq i \leq n-1$), a j-th row ($0 \leq j \leq m-1$). According to the present invention, the test circuit comprises: a first inverter having an input and an output; a j-th input scan flip-flop corresponding to the j-th row of content addressable memory cells and having a scan input and a scan output, the j-th input scan flip-flop being controlled by the same clock signal; the input of the zeroth input scan flip-flop being connected to the output of the first inverter; the input of the p-th input scan flip-flop ($1 \leq p \leq m-1$) being connected to the output of the (p−1)-th input scan flip-flop; the output of the (m−1)-th input scan flip-flop being connected to the input of the first inverter; the j-th input scan flip-flop holding a j-th input signal written to the j-th row of content addressable memory cells for each content addressable memory cell in the i-th column; and the content held in the j-th row of content addressable memory cells being compared for each column with the input signal held by the j-th input scan flip-flop.

Preferably, according to a sixth aspect of the present invention, whether an input hold signal for causing the zeroth to (m−1)-th input scan flip-flops to hold the zeroth to (m−1)-th input signal, respectively, is active/inactive is determined in response to a last address detection signal for detecting the selection of the (n−1)-th column of content addressable memory cells, and the test circuit further comprises: a counter for executing/stopping a counting function responsive to the clock signal when an address hold signal is inactive/active, respectively, to update a column number i by the counting function; a scan flip-flop for holding the last address detection signal in response to the clock signal to output the last address detection signal as the address hold signal after an elapse of one clock cycle; and a write enable signal generating portion for generating a write enable signal for permitting the input signal to be written into the content addressable memory cells in response to the clock signal when the address hold signal is inactive.

Preferably, according to a seventh aspect of the present invention, the test circuit further comprises: a counter for executing/stopping a counting function responsive to the clock signal when an address hold signal is inactive/active, respectively, to update a column number i by the counting function, the counter counting up/down when a count direction signal is inactive/active, respectively, while the counting function is performed; a selector having a first input receiving a last address detection signal for detecting the selection of the (n−1)-th column of content addressable memory cells, a second input receiving a first address detection signal for detecting the selection of the zeroth column of content addressable memory cells, and an output for outputting a specific address detection signal, the specific address detection signal being the value at the first/second input when the count direction signal is inactive/active, respectively; and a first logic circuit for generating the count direction signal in response to the zeroth input signal; and a second logic circuit for outputting as the address hold signal the AND of the output from the selector and the exclusive OR of the zeroth input signal and the inverted version of the logic at the output of the (m−1)-th input scan flip-flop, wherein whether an input hold signal for causing all of the zeroth to (m−1)-th input scan flip-flops to hold the zeroth to (m−1)-th input signal, respectively, is active/inactive is determined in response to the specific address detection signal.

Preferably, according to an eighth aspect of the present invention, the test circuit further comprises: a counter for executing/stopping a counting function responsive to the clock signal when an address hold signal is inactive/active, respectively, to update a column number i by the counting function; a scan flip-flop having an input and an output for holding a value at its input in response to the clock signal to output the value after an elapse of one clock cycle; a second inverter having an input connected to the output of the scan flip-flop, and an output connected to the input of the scan flip-flop; and a write enable signal generating portion for generating a write enable signal for permitting the input signal to be written into the content addressable memory cells in response to the clock signal when the output from the scan flip-flop is inactive, wherein the address hold signal is active when the j-th input signal has a specific logic and the output from the scan flip-flop is inactive, and wherein the output from the scan flip-flop acts as an input hold signal for causing the zeroth to (m−1)-th input scan flip-flops to hold the zeroth to (m−1)-th input signal, respectively.

Preferably, according to a ninth aspect of the present invention, the test circuit further comprises: a logic circuit for receiving the zeroth and (m−1)-th input signals and the output from the scan flip-flop to output the address hold signal.

Preferably, according to a tenth aspect of the present invention, the content addressable memory circuit further includes a decoder for decoding the output from the counter to output an i-th decode output for selecting the i-th column of content addressable memory cells, and the test circuit further comprises: an expected value generator circuit receiving the output from the scan flip-flop and the zeroth to (n−1)-th decode outputs, the expected value generator circuit for generating a group of expected values indicative of the results of comparison between the content held in the content addressable memory cells and the input signal held in the j-th input scan flip-flop when the content addressable memory cells are under normal condition, the expected value generator circuit including a q-th OR circuit ($0 \leq q \leq n-2$) for outputting the OR of the q-th to (n−1)-th decode outputs, a q-th AND circuit for receiving the output from the q-th OR circuit and the inverted logic of the output from the scan flip-flop to output a q-th expected value associated with the q-th column, and an (n−1)-th AND circuit for receiving the (n−1)-th decode output and the output from the scan flip-flop to output an (n−1)-th expected value associated with the (n−1)-th column, wherein the group of expected values are the zeroth to (n−1)-th expected values.

Preferably, according to an eleventh aspect of the present invention, the content addressable memory circuit further includes a decoder for decoding the output from the counter to output an i-th decode output for selecting the i-th column of content addressable memory cells, and the test circuit further comprises: an expected value generator circuit receiving the output from the scan flip-flop and the zeroth to (n−1)-th decode outputs, the expected value generator circuit for generating a group of expected values indicative of the results of comparison between the content held in the content addressable memory cells and the input signal held in the j-th input scan flip-flop when the content addressable memory cells are under normal condition, the expected value generator circuit including an i-th RS flip-flop having a reset terminal receiving the output from the scan flip-flop, a set terminal receiving the i-th decode output, and an output for outputting an i-th expected value associated with the i-th column, wherein the group of expected values are the zeroth to (n−1)-th expected values.

Preferably, according to a twelfth aspect of the present invention, the content addressable memory circuit further includes a decoder for decoding the output from the counter to output an i-th decode output for selecting the i-th column of content addressable memory cells, and the test circuit further comprises: an expected value generator circuit receiving the specific address detection signal, the count direction signal, and the zeroth to (n−1)-th decode outputs, the expected value generator circuit for generating a group of expected values indicative of the results of comparison between the content held in the content addressable memory cells and the input signal held in the j-th input scan flip-flop when the content addressable memory cells are under normal condition, the expected value generator circuit including a flip-flop receiving the specific address detection signal for operating in response to the clock signal, an i-th RS flip-flop having a reset terminal receiving the output from the flip-flop, and a set terminal receiving the i-th decode output, a first OR circuit for outputting the OR of the inverted logic of the count direction signal and the output from the zeroth RS flip-flop as a zeroth expected value associated with the zeroth column, and a second OR circuit for outputting the OR of the count direction signal and the output from the (n−1)-th RS flip-flop as an (n−1)-th expected value associated with the (n−1)-th column, wherein the outputs from the first to (n−2)-th RS flip-flops are used as first to (n−2)-th expected values associated with the first to (n−2)-th columns, respectively, and wherein the group of expected values are the zeroth to (n−1)-th expected values.

Preferably, according to a thirteenth aspect of the present invention, the content addressable memory circuit further includes a decoder for decoding the output from the counter to output an i-th decode output for selecting the i-th column of content addressable memory cells, and the test circuit further comprises: an expected value generator circuit receiving the specific address detection signal and the zeroth to (n−1)-th decode outputs, the expected value generator circuit for generating a group of expected values indicative of the results of comparison between the content held in the content addressable memory cells and the input signal held in the j-th input scan flip-flop when the content addressable memory cells are under normal condition, the expected value generator circuit including a flip-flop receiving the specific address detection signal for operating in response to the clock signal, an i-th RS flip-flop having a reset terminal receiving the output from the flip-flop, a set terminal receiving the i-th decode output, a non-inverted output, and an inverted output, a first inverter having an input connected to the inverted output of the zeroth RS flip-flop, and an output for outputting a zeroth expected value associated with the zeroth column, and a second inverter having an input connected to the inverted output of the (n−1)-th RS flip-flop, and an output for outputting an (n−1)-th expected value associated with the (n−1) th column, wherein the values at the non-inverted outputs of the first to (n−2)-th RS flip-flops are used as first to (n−2)-th expected values associated with the first to (n−2)-th columns, respectively, and wherein the group of expected values are the zeroth to (n−1)-th expected values.

Preferably, according to a fourteenth aspect of the present invention, the content addressable memory circuit further includes a decoder for decoding the output from the counter to output an i-th decode output for selecting the i-th column of content addressable memory cells, and the test circuit further comprises: an input value detecting circuit for detecting the j-th input signal having a specific logic; and an expected value generator circuit receiving the output from the input value detecting circuit, the output from the scan flip-flop, and the zeroth to (n−1)-th decode outputs, the expected value generator circuit for generating a group of expected values indicative of the results of comparison between the content held in the content addressable memory cells and the input signal held in the j-th input scan flip-flop when the content addressable memory cells are under normal condition, the expected value generator circuit including a reset pulse generator circuit for outputting a reset signal in response to the OR of the output from the input value detecting circuit and the output from the scan flip-flop, an i-th RS flip-flop having a reset terminal receiving the reset signal, a set terminal receiving the i-th decode output, a non-inverted output, and an inverted output, and an i-th selector having first and second inputs connected to the inverted output and non-inverted output of the i-th RS flip-flop, respectively, and an output for selectively outputting the value at its first or second input as an i-th expected value associated with the i-th column in response to the output from the input value detecting circuit, wherein the group of expected values are the zeroth to (n−1)-th expected values.

Preferably, according to a fifteenth aspect of the present invention, the content addressable memory circuit further includes a decoder for decoding the output from the counter to output an i-th decode output for selecting the i-th column of content addressable memory cells, and the test circuit further comprises: an input value detecting circuit for detecting the j-th input signal having a specific logic; and an expected value generator circuit receiving the output from the input value detecting circuit, the output from the scan flip-flop, and the zeroth to (n−1)-th decode outputs, the expected value generator circuit for generating a group of expected values indicative of the results of comparison between the content held in the content addressable memory cells and the input signal held in the j-th input scan flip-flop when the content addressable memory cells are under normal condition, the expected value generator circuit including an exclusive-OR circuit for receiving the output from the input value detecting circuit and the output from the scan flip-flop, an i-th AND circuit for receiving the output from the exclusive-OR circuit and the i-th decode output, and an i-th exclusive-NOR circuit for receiving the output from the i-th AND circuit and the output from the input value detecting circuit to output an i-th expected value associated with the i-th column, wherein the group of expected values are the zeroth to (n−1)-th expected values.

A sixteenth aspect of the present invention is intended for a content addressable memory circuit with redundancy function having zeroth to (n−1)-th columns of content addressable memory cells arranged in m rows each, and an n-th column of content addressable memory cells arranged in m rows, the content addressable memory circuit with redundancy function for determining whether or not external test data match comparison data stored in the zeroth to n-th columns of content addressable memory cells. According to the present invention, the content addressable memory circuit with redundancy function comprises: (a) an output portion for storing an i-th acceptance/failure data indicative of an active/inactive state when the i-th column of content addressable memory cells ($0 \leq i \leq n-1$) are acceptable/failed to output an i-th coincidence determination signal candidate and an n-th coincidence determination signal candidate, the i-th coincidence determination signal candidate indicating whether or not the comparison data stored in the i-th column of content addressable memory cells match the test data, the n-th coincidence determination signal candidate indicating whether or not the comparison data stored in the n-th column of content addressable memory cells match the test data; (b) a first control circuit receiving the zeroth to (n−1)-th acceptance/failure data and the zeroth to n-th coincidence determination signal candidates and including (b−1) a group of gates for outputting zeroth to (n−1)-th control signals, and (b−2) a group of selectors for outputting as an i-th coincidence determination signal the i-th coincidence determination signal candidate or the (i+1)-th coincidence determination signal candidate in response to an active/inactive state of the i-th control signal; (c) a second control circuit receiving first to n-th column specifying raw signals corresponding respectively to the zeroth to (n−1)-th columns of content addressable memory cells and alternatively activated, the second to n-th control signals, and the first to n-th acceptance/failure data and including (c−1) a group of selectors for outputting as a (t+1)-th column specifying signal candidate ($0 \leq t \leq n-2$) the t-th column specifying raw signal or the (t+1)-th column specifying raw signal in response to an active/inactive state of the t-th control signal, and outputting as an n-th column signal specifying candidate the (n−1)-th column specifying raw signal or "0" in response to an inactive/active state of the (n−1)-th control signal, and (c−2) a group of gates for determining the AND of the i-th column specifying signal candidate and the i-th acceptance/failure data to output an i-th column specifying signal; the group of gates of the first control circuit outputting the zeroth acceptance/failure data as the zeroth control signal and the AND of the k-th acceptance/failure data ($1 \leq k \leq n-1$) and the (k−1)-th control signal as the k-th control signal; the zeroth column specifying signal candidate being the zeroth column specifying raw signal; the n-th column specifying signal candidate being the n-th column specifying signal; and the zeroth to n-th columns of content addressable memory cells being selected in response to the zeroth to n-th column specifying signals.

Preferably, according to a seventeenth aspect of the present invention, the group of selectors of the second control circuit include a logic gate for outputting as the n-th column signal specifying candidate the AND of the inverted logic of the (n−1)-th control signal and the (n−1)-th column specifying raw signal.

Preferably, according to an eighteenth aspect of the present invention, the output portion comprises zeroth to n-th output elements, the s-th output element ($0 \leq s \leq n$) including (a-1) a flip-flop for storing the s-th acceptance/failure data, and (a-2) a first selector having an output connected to the input of the flip-flop, a first input receiving the s-th coincidence determination signal candidate, a second input receiving the result of comparison between the s-th coincidence determination signal candidate and its associated expected value, and a control end receiving a shift mode signal, the output of the first selector being connected to the first or second input when the shift mode signal is inactive/active, respectively.

A nineteenth aspect of the present invention is intended for a content addressable memory circuit with redundancy function having zeroth to (m-1)-th rows of content addressable memory cells arranged in n columns each, and an m-th row of content addressable memory cells arranged in n columns, the content addressable memory circuit with redundancy function for determining whether or not external test data match comparison data stored in the zeroth to n-th columns of content addressable memory cells. According to the present invention, the content addressable memory circuit with redundancy function comprises: (a) an output portion receiving the outputs from the zeroth to m-th rows of content addressable memory cells and their associated expected values to output zeroth to m-th acceptance/failure data and zeroth to m-th output signal candidates, the zeroth to m-th acceptance/failure data being active/inactive when the zeroth to m-th rows of content addressable memory cells are acceptable/failed, respectively, the zeroth to m-th output signal candidates being the outputs from the zeroth to m-th rows of content addressable memory cells; (b) a j-th input scan flip-flop ($0 \leq j \leq m$) including a selector having (b-1) a scan input terminal, (b-2) a flip-flop, and (b-3) a scan output terminal having a first input connected to the scan input terminal, a second input connected to the scan input terminal through the flip-flop, and an output connected to the first or second input when the j-th acceptance/failure data is active/inactive, respectively, the zeroth to m-th input scan flip-flops being sequentially connected in series; and (c) an inverter having an input connected to the m-th scan output terminal, and an output connected to the zeroth scan input terminal.

Preferably, according to a twentieth aspect of the present invention, the content addressable memory circuit with redundancy function further comprises: (d) a group of gates receiving the zeroth to m-th acceptance/failure data to output zeroth to m-th control signals; (e) a first group of selectors receiving zeroth to (m-1)-th input signal candidates, the first group of selectors using the zeroth input signal candidate as a zeroth raw input signal when the zeroth control signal is active, the first group of selectors using as a p-th raw input signal ($1 \leq p \leq m-1$) the (p-1)-th input signal candidate or the p-th input signal candidate when the p-th control signal is inactive/active, respectively, the first group of selectors using the (m-1)-th input signal candidate as an m-th raw input signal when the m-th control signal is inactive, the first group of selectors applying the zeroth to m-th raw input signals to the zeroth to m-th input scan flip-flops, respectively; (f) a second group of selectors receiving zeroth to m-th output signal candidates outputted respectively from the zeroth to m-th rows of content addressable memory cells, the second group of selectors outputting as a u-th output signal ($0 \leq u \leq m-1$) the u-th output signal candidate or the (u+1)-th output signal candidate when the u-th control signal is inactive/active, respectively; the zeroth acceptance/failure data being used as the zeroth control signal; and the j-th input scan flip-flop applying the j-th raw input signal to the j-th row of content addressable memory cells through the flip-flop thereof.

In the method of testing the content addressable memory circuit according to the first aspect of the present invention, the test pattern is updated in accordance with a predetermined rule. For example, when m=3 and the initialized test pattern is (0, 0, 0), the test pattern being updated changes sequentially as follows: (1, 0, 0)→(1, 1, 0)→(1, 1, 1)→(0, 1, 1)→(0, 0, 1)→(0, 0, 0)→ . . . . Since the test pattern of the present invention is updated in the above described manner, when the zeroth and (m-1)-th input signals have an equal value, other input signals do not have different values. Thus, the present invention provides less than $2^m$ types of the test pattern.

A test pattern is written to the content addressable memory cells, and this test pattern or the next test pattern updated is compared with the contents held in the content addressable memory cells. The contents held in the content addressable memory cells may sometimes match the test pattern, and sometimes do not. In both cases, the content addressable memory cells may be tested by using less types of the test pattern.

In the method of testing the content addressable memory circuit according to the second aspect of the present invention, the test may be performed on all combinations of the contents held in the content addressable memory cells and the input signals.

In the method of testing the content addressable memory circuit according to the third aspect of the present invention, the test of the content addressable memory circuit requires less steps than the method of testing the content addressable memory circuit according to the second aspect of the present invention.

In the method of testing the content addressable memory circuit according to the fourth aspect of the present invention, the test may be performed on all combinations of the contents held in the content addressable memory cells and the input signals.

In the test circuit for testing the content addressable memory circuit according to the fifth aspect of the present invention, the inverter allows the content held in the (m-1)-th input scan flip-flop during the immediately previous clock cycle to be shifted into the zeroth input scan flip-flop. The content held in the (p-1)-th input scan flip-flop ($1 \leq p \leq m-1$) during the immediately previous clock cycle is shifted into the p-th input scan flip-flop. The sequentially updated entire contents held in the zeroth to (m-1)-th input scan flip-flops are grasped as a test pattern. A particular test pattern is written to the content addressable memory cells, and this test pattern or the next test pattern updated is compared with the contents held in the content addressable memory cells.

The test pattern according to the present invention which is produced by the zeroth to (m-1)-th input scan flip-flops in the above described manner is identical with the test pattern used in the method of testing the content addressable memory circuit of the first aspect and has less than $2^m$ types. However, the contents held in the content addressable memory cells may sometimes match the test pattern, and sometimes do not. In both cases, the content addressable memory cells may be tested by using less types of the test pattern.

In the test circuit according to the sixth aspect of the present invention, the last address detection signal is inactive until the (n-1)-th column is selected. Then the column number i is updated by the counter, and the write operation to the content addressable memory circuit is enabled. Additionally, while the input hold signal is active, the input signal is not updated. Thus, the test pattern is not updated before all columns of memory cells are written.

Selecting the (n−1)-th column activates the last address detection signal. Since the address hold signal stops counting of the counter one clock cycle later, the column number i=0 is held in the counter during the clock cycle next to the selection of the zeroth column. Selecting the (n−1)-th column inactivates the input hold signal, thereby permitting the update of the input signal. This allows the execution of the method of testing the content addressable memory circuit of the second aspect.

In the test circuit according to the seventh aspect of the present invention, the count direction signal is "1"/"0", for example, when the zeroth input signal is "0"/"1", respectively (or vice versa). Then, when the test pattern is initialized so that all of the j-th input signals are "0", the first inverter sets the zeroth input signal to "1" and the count direction signal is "0". The test pattern is not updated so that all of the j-th input signals are "1", or the address hold signal is inactive until (n−1)-th column is selected. Thus, the counter function as an up-counter to increment the column number i while updated.

Further, since the input hold signal is active, the input signal is not updated during the increment if the zeroth to (n−2)-th columns are selected. Then, the test pattern is not updated before all columns of memory cells are written. Selecting the (n−1)-th column activates the last address detection signal. The count direction signal is "0", and the selector outputs the last address detection signal. The input hold signal is inactivated to update the test pattern.

In this manner, the content addressable memory circuit is tested so that the column number i is incremented for the test pattern, and the test pattern is updated.

However, if the test pattern is updated so that all of the j-th input signals are "1" and the content addressable memory cells in all columns are tested for the test pattern (or the (n−1)-th column is selected), the address hold signal outputted from the second logic circuit is activated, and the counting of the counter is suspended.

The test pattern is updated and the zeroth input signal makes a "1" to "0" transition, setting the count direction signal to "1". The address hold signal is inactivated, and the counter functions as a down counter. The content addressable memory circuit is tested so that the column number i is decremented for the test pattern until the test pattern is updated so that all of the j-th input signals are "0", and the test pattern is updated.

If the test pattern is updated so that all of the j-th input signals are "0" and the content addressable memory cells in all column are tested for the test pattern (or the zeroth column is selected), the address hold signal outputted from the second logic circuit is activated, and the counting of the counter is suspended. The above described operation is repeated.

Therefore, the method of testing the content addressable memory circuit of the third aspect of the present invention may be executed in such a manner that the direction of the update of the column number i is reversed in the step (d) at a point of time when the zeroth to (m−1)-th input signals have the same value without initializing the column number i.

In the content addressable memory circuit according to the eighth aspect of the present invention, the write enable signal is alternately activated/inactivated when the clock signal makes a transition. The input hold signal is accordingly inactivated/activated. The address hold signal is active only when the input signal has a particular logic (e.g., all "0") and the write enable signal is inactive. Thus, the column number i is not updated before the test pattern is updated to complete all variations thereof. This allows the execution of the method of testing the content addressable memory circuit of the fourth aspect.

In the test circuit according to the ninth aspect of the present invention, the test pattern is identical with that used in the method of testing the content addressable memory circuit of the first aspect. Such a test pattern is required only to examine the zeroth input signal and the (m−1)-th input signal to determine whether or not the input signal has a particular logic. Thus, other input signals need not be detected to determine whether the address hold signal is active or inactive.

The content addressable memory circuit in accordance with the tenth aspect of the present invention may generate the expected values for the content addressable memory circuit of the sixth aspect.

The content addressable memory circuit in accordance with the eleventh aspect of the present invention may generate the expected values for the content addressable memory circuit of the sixth aspect.

The content addressable memory circuit in accordance with the twelfth aspect of the present invention may generate the expected values for the content addressable memory circuit of the seventh aspect.

The content addressable memory circuit in accordance with the thirteenth aspect of the present invention may generate the expected values for the content addressable memory circuit of the seventh aspect.

The content addressable memory circuit in accordance with the fourteenth aspect of the present invention may generate the expected values for the content addressable memory circuit of the eighth aspect.

The content addressable memory circuit in accordance with the fifteenth aspect of the present invention may generate the expected values for the content addressable memory circuit of the eighth aspect.

In the content addressable memory circuit with redundancy function according to the sixteenth aspect of the present invention, the column having a failed content addressable memory cell is not selected because the associated acceptance/failure data is inactive. The redundancy column, or the n-th column, of content addressable memory cells are used in place of the failed column of memory cells. When the replacement is performed, the control signal functions to convert the column specifying row signal into the column signal specifying candidate, but the sequence of the columns is not changed.

In the content addressable memory circuit with redundancy function according to the seventeenth aspect of the present invention, no selector is used to provide the n-th column signal specifying candidate by the logic gate, reducing the number of gates to be used.

In the content addressable memory circuit with redundancy function according to the eighteenth aspect of the present invention, the s-th coincidence determination signal candidate is compared with the associated expected value to determine the s-th acceptance/failure data.

In the content addressable memory circuit with redundancy function according to the nineteenth aspect of the present invention, at least one of the input scan flip-flops which is associated with the row judged as failed permits the data scanned in to pass through. This allows the execution of the method of testing the content addressable memory circuit of the first to fourth aspects without using the failed row.

In the content addressable memory circuit with redundancy function according to the twenties aspect of the present invention, the zeroth to (m−1)-th input signal candidates are used as some of the zeroth to m-th raw input signals on the basis of the zeroth to m-th control signals. A raw input signal as a dummy is generated in corresponding relation to the row judged as containing the failed content addressable memory cell. The output signal candidate associated with the row judged as containing the failed content addressable memory cell is removed from the output signals.

Then, the raw input signal may be applied to the content addressable memory cells, and the output signal candidate may be provided from the content addressable memory cells in response to the raw input signal. The information about the failed row is removed. In terms of the relation between the input signal candidate and output signal, the content addressable memory circuit may be used without using the failed row.

It is therefore a primary object of the present invention to provide a technique for automatically producing test patterns for test data and patterns to be stored in content addressable memory cells to readily test a CAM for failure.

It is another object of the invention to provide a technique for replacing a failed column or row with another redundant column or row.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 10 through 39 conceptually illustrate states of data being subjected to a first technique in sequential order;

FIGS. 53 through 76 conceptually illustrate states of data being subjected to a second technique in sequential order;

FIGS. 139 and 140 are circuit diagrams of an eleventh preferred embodiment according to the present invention;

FIGS. 155 through 162 are circuit diagrams of a seventeenth preferred embodiment according to the present invention.

DESCRIPTION OF THE PREFERRED EMBODIMENTS

A. Precursory Concepts of the Present Invention

Precursory concepts of the present invention will be described prior to the detailed description of the present invention.

Figure 1:
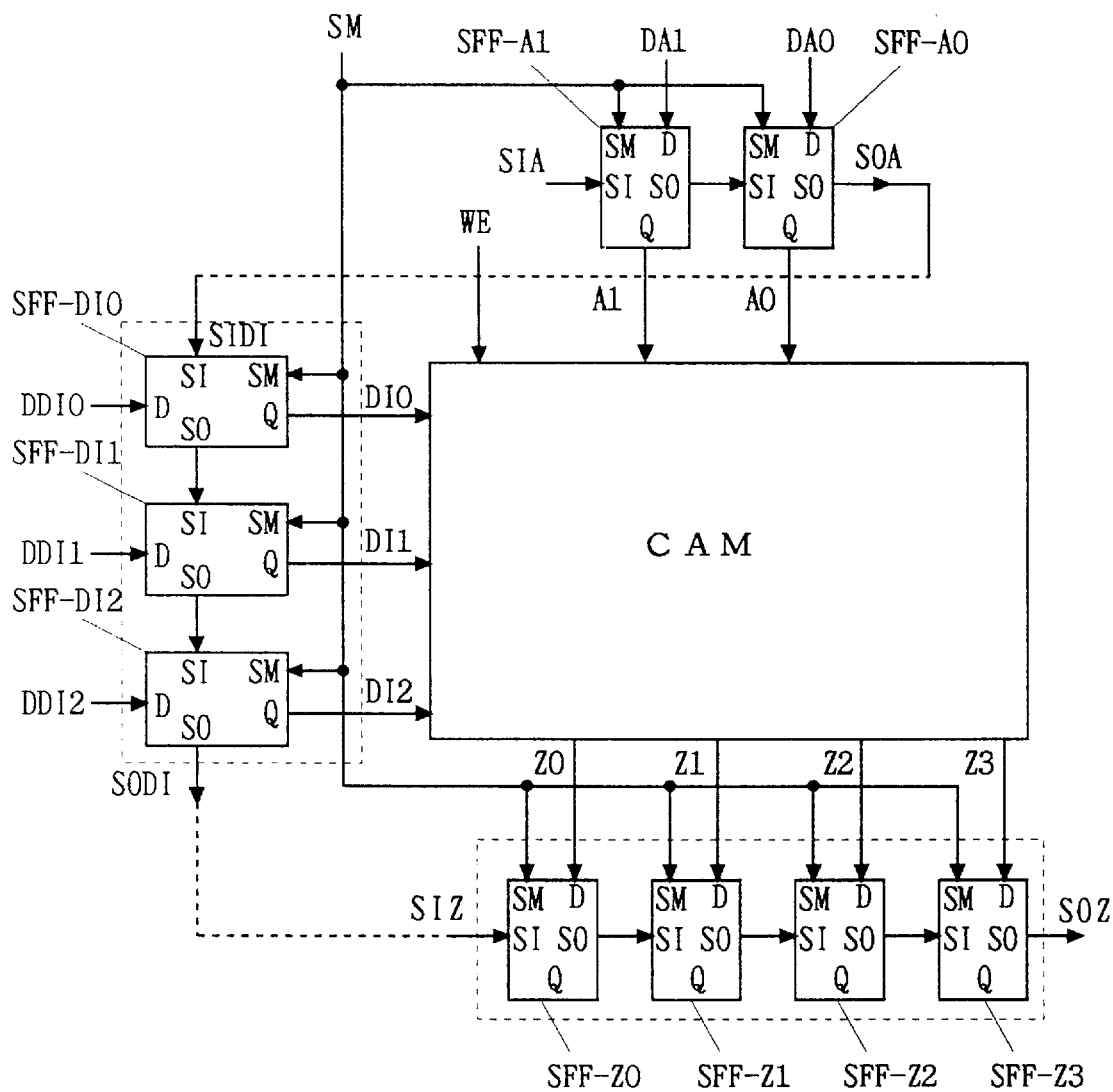
FIGS. 1 and 2 are circuit diagrams showing precursory concepts of the present invention.

FIG. 1 is a circuit diagram of a test circuit for a CAM. A simple scan path method test circuit for use in normal LSI design may be added to the CAM.

Scan flip-flops SFF-A0 and SFF-A1 which form a scan path for addresses receive external address signals DA0 and DA1 or a scan signal SIA to output address signals A0 and A1 for the CAM, respectively. Scan flip-flops SFF-DI0, SFF-DI1, SFF-DI2 which form a data input scan path receive external input signals DDI0, DDI1, DDI2 or a scan input signal SIDI to output input signals DI0, DI1, DI2 to the CAM, respectively. Scan flip-flops SFF-Z0, SFF-Z1, SFF-Z2, SFF-Z3 which form a scan path for column coincidence signals receive column coincidence signals Z0, Z1, Z2, Z3 for the CAM or a scan signal SIZ to output a scan signal SOZ, respectively. A shift mode signal SM is applied to all of the scan flip-flops which in turn function as normal flip-flops when the shift mode signal SM is "0" and form the scan paths to transmit the scan signals when the shift mode signal SM is "1".

In FIG. 1, the scan signal SOA outputted from the scan path for addresses acts as the scan input signal SIDI applied to the data input scan path, and the scan signal SODI outputted from the data input scan path acts as the scan input signal SIZ applied to the scan path for the column coincidence signals. That is, the scan path for addresses, the data input scan path, and the scan path for the column coincidence signals establish, but not limited to, an in-series connection.

Figure 2:
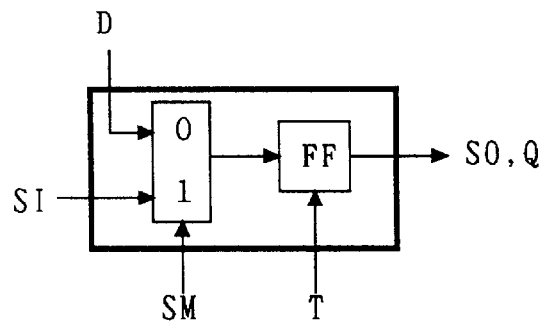

FIG. 2 is a circuit diagram of a scan flip-flop which may be used for any of the above described scan paths. The scan flip-flop of FIG. 2 comprises a selector for outputting an input signal from a scan input terminal SI when the shift mode signal SM is "1" and for outputting an input signal from a D terminal when the shift mode signal SM is "0", and a flip-flop for receiving the output from the selector and operated in response to a clock signal from a terminal T.

The scan path method test circuit performs a shift operation, with the shift mode signal SM being "1", to apply a test pattern to the CAM to be tested. More specifically, the test circuit transmits the scan signal SIA to the scan flip-flops SFF-A0 and SFF-A1 in sequential order to apply the transmitted contents as the address signals A0 and A1 to the CAM, while transmitting the scan input signal SIDI to the scan flip-flops SFF-DI0, SFF-DI1, SFF-DI2 in sequential order to apply the transmitted contents as the input signals DI0, DI1, DI2 to the CAM.

Predetermined contents have been stored in all content addressable memory cells Cij of the CAM and are compared with the input signals DI0, DI1, DI2 serving as test data to determine if there is a match.

With the shift mode signal SM being "0", the test circuit is in a normal operation mode wherein the scan flip-flops SFF-Z0, SFF-Z1, SFF-Z2 receive the column coincidence signal Zi outputted in response to the test data. Then, the shift operation is performed again in the shift mode, and the column coincidence signal Zi is read.

The application of the scan path method to the CAM test allows the CAM to receive the test data from the scan path. In the precursory concepts of the present invention, however, a huge amount of test data patterns (test patterns) serving as the scan input signal SIDI must be produced one by one.

B. Basic Concepts of the Present Invention (First Preferred Embodiment)

Figure 3:
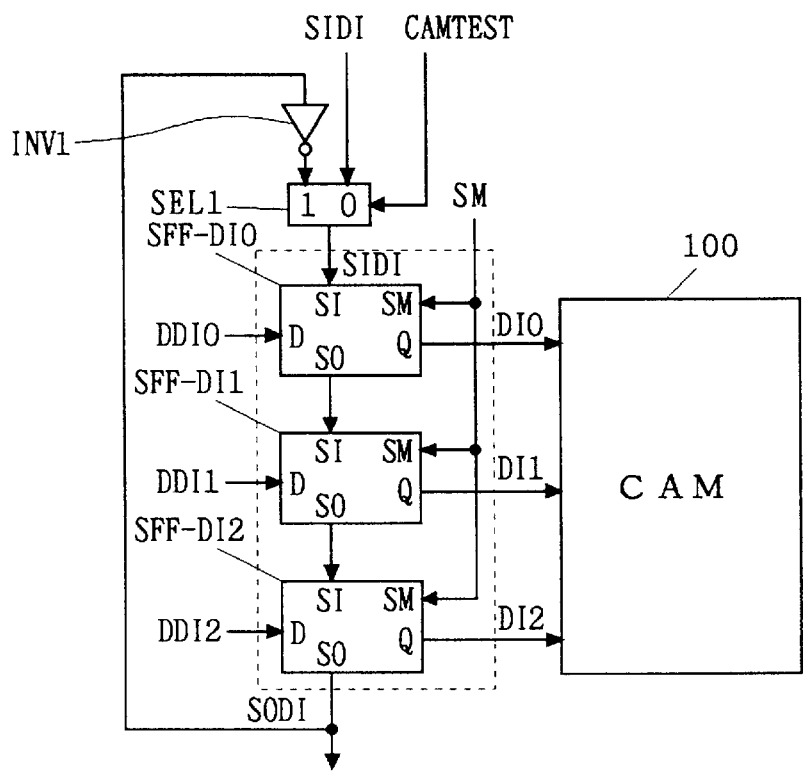
FIGS. 3 through 6 and FIGS. 7A through 7C are circuit diagrams of a first preferred embodiment according to the present invention.

FIG. 3 is a circuit diagram showing the basic concepts of the present invention. For the purpose of illustrating a technique for automatically producing test data patterns for a CAM 100, only the structure for applying the input signals DI0, DI1, DI2 and its adjacent portions are shown in FIG. 3.

Figure 4:
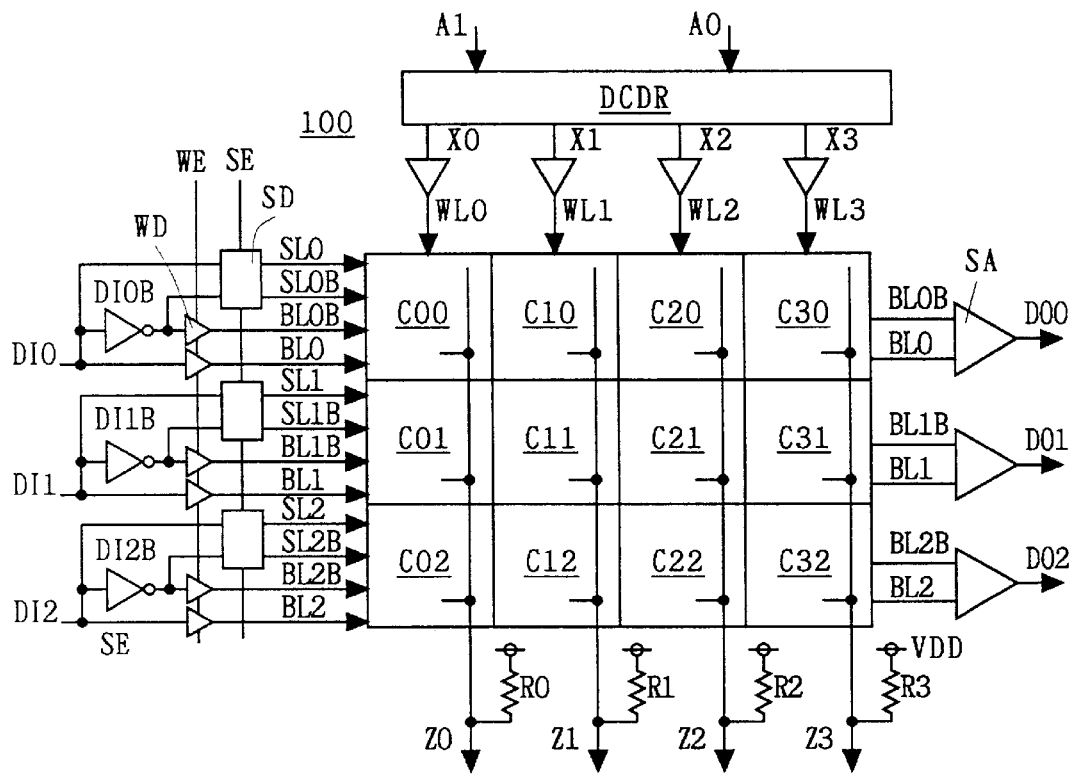
Figure 5:
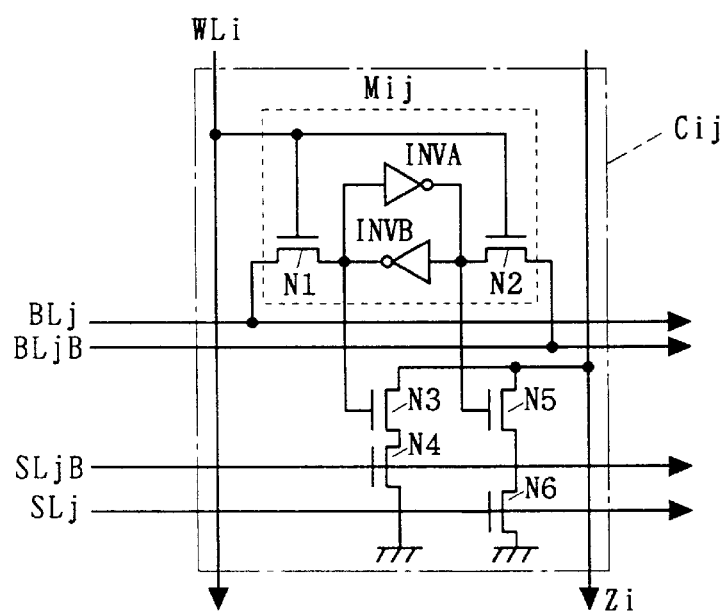
Figure 163:
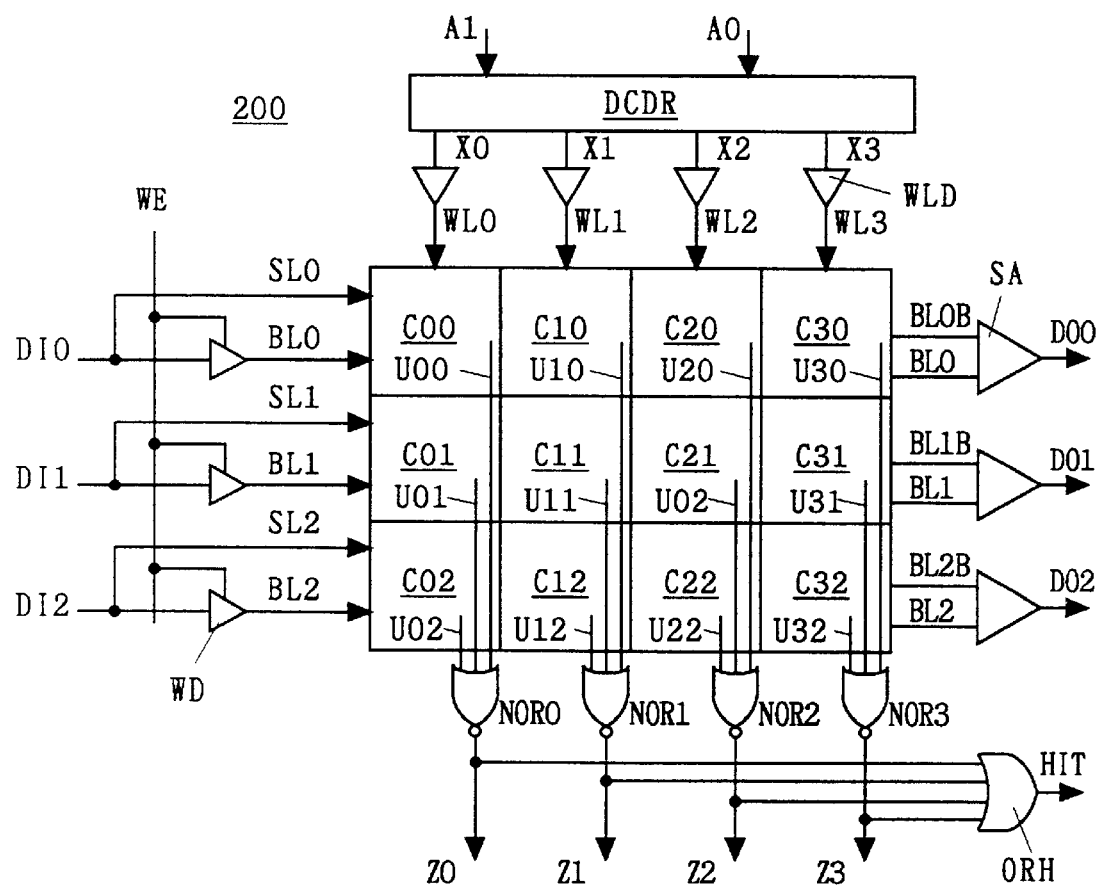
FIGS. 163 and 164 are circuit diagrams showing the background art.
Figure 164:
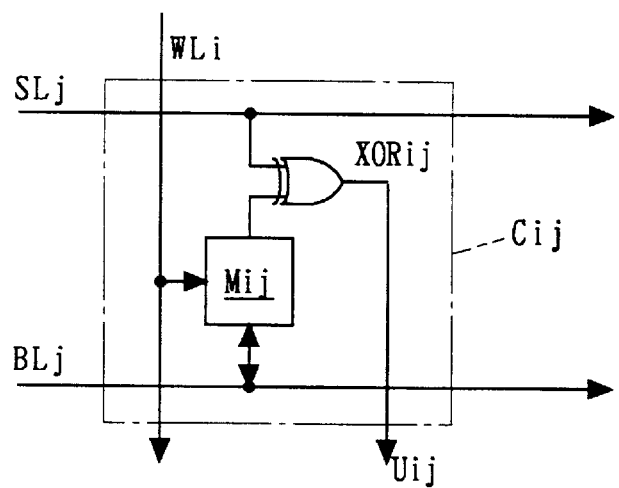

FIGS. 4 and 5 are circuit diagrams corresponding to FIGS. 163 and 164 and illustrate the CAM 100 and the content addressable memory cell Cij, respectively. The CAM 100 is shown as having equivalent functions to the CAM 200 in detail. The OR circuit ORH for producing the hit signal HIT is dispensed with.

FIG. 5 illustrates a circuit including a random access memory cell Mij for use in a general static RAM. Specifically, the memory cell Mij comprises inverters INVA and INVB connected in inverse-parallel, an NMOS transistor N1 for connecting a non-inverted bit line BLj and the input of the inverter INVA together, and an NMOS transistor N2 for connecting an inverted bit line BLjB and the input of the inverter INVB together. The description of the operation of the random access memory cell is dispensed with.

The content addressable memory cell Cij of the CAM comprises NMOS transistors N3, N4, N5, N6 in addition to the random access memory cell Mij. The transistors N3 and N4 are connected in series between the input of the inverter INVA and ground, and the transistors N5 and N6 are connected in series between the input of the inverter INVB and ground. The gates of the transistors N3 and N5 are connected to the inputs of the inverters INVA and INVB, respectively. The gates of the transistors N6 and N4 are connected to a non-inverted search line SLj and an inverted search line SLjB, respectively.

Data held in the memory cell Mij is the value held at the connecting point of the input of the inverter INVA and the output of the inverter INVB. The test data contains a set of search data on the non-inverted search line SLj. For example, if the search data on the non-inverted search lines SL0, SL1, SL2 are "0", "1", "1", the test data is "011".

A transmission line (also denoted as Zi sometimes for purposes of simplicity) for transmitting the column coincidence signal Zi is pulled up to the "H" level (potential VDD corresponding to "1" herein) by a resistor Ri.

The transistors N3, N4, N5, N6 in the content addressable memory cells Ci0, Ci1, Ci2 and the resistor Ri in the i-th column achieve equivalent functions to the exclusive-OR circuits XORi0, XORi1, XORi2 in each column of FIG. 164 and the gate circuit NORi of FIG. 163.

An inverted signal DIiB is produced from an input signal DIi. The pair of signals (DIi and DIiB) are applied to both a write driver WD and a search driver SD.

Figure 6:
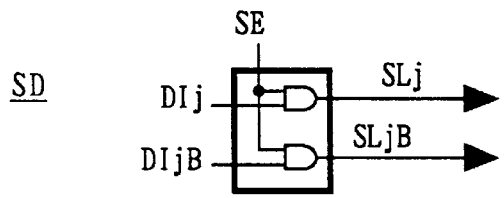

FIG. 6 is a circuit diagram of the search driver SD. The search driver SD applies the signals DIi and DIiB to the non-inverted search line SLj and the inverted search line SLjB, respectively, when a search enable signal SE is "1". This allows a comparison between the test data and the data held in the content addressable memory cells Ci0, Ci1, Ci2 (Mi0, Mi1, Mi2) in the i-th column, that is, the search operation. On the other hand, when the search enable signal SE is "0", the search driver SD applies the logic "0" to both the non-inverted search line SLj and the inverted search line SLjB. This turns off the transistors N4 and N6, allowing no search operation.

Assuming that the data held in one content addressable memory cell Cij is "0", the transistors N3 and N5 are off and on, respectively. Then, if the search data in the j-th row, or the signal on the non-inverted search line SLj, is "0", the transistors N4 and N6 are on and off, respectively. Thus, the transmission line Zi is not grounded in this content addressable memory cell Cij.

Likewise, when the data held in the content addressable memory cell Cij is "1" and the search data is "1", the transistors N3, N4, N5, N6 are on, off, off, on, respectively, and the transmission line Zi is not grounded in this content addressable memory cell Cij.

Thus, if the data stored in one column match the test data, the column coincidence signal Zi is "1" ("H" level; potential VDD) because there is no factor that determines the potential thereof but pulling up the column coincidence signal Zi by the resistor Ri.

If the data held in the content addressable memory cell Cij is "0" and the search data is "1", the transistors N3, N4, N5, N6 are off, off, on, on, respectively, and the transmission line Zi is grounded in this content addressable memory cell Cij. Similarly, if the data held in the content addressable memory cell Cij is "1" and the search data is "0", the transmission line Zi is grounded.

Therefore, the column coincidence signal Zi is "0" when a mismatch occurs, even if partially, between the data stored in one column and the test data.

A precharging transistor may be used in place of the resistor Ri, and a bit line load or a precharging transistor may be connected to the non-inverted bit line BLi and the inverted bit line BLiB.

Turning again to FIG. 3, a signal applied to a selector input represented as "0" (referred to hereinafter as a "0-input") is outputted when the value "0" is given to the control end of the selector and a signal applied to a selector input represented as "1" (referred to hereinafter as a "1-input") is outputted when the value "1" is given to the control end of the selector unless otherwise specified.

The scan signal SIDI to be inputted to the scan path (referred to hereinafter as a "scan input" SIDI) is applied to the 0-input of a selector SEL1, and the output from an inverter INV1 is applied to the 1-input thereof. A test signal CAMTEST is applied to the control end of the selector SEL1 which in turn provides the scan input SIDI when the test signal CAMTEST is "0" and provides the output from the inverter INV1 when the test signal CAMTEST is "1".

The inverter INV1 inverts the scan signal SODI outputted from the scan path (referred to hereinafter as a "scan output" SODI) to apply the inverted signal to the 1-input of the selector SEL1. Thus, when the test signal CAMTEST is "1", the scan flip-flops SFF-DI0, SFF-DI1, SFF-DI2 and the inverter INV1 are connected serially in a loop. The scan input SIDI is an inverted version of the scan output from the scan flip-flop SFF-DI2.

When the test signal CAMTEST is "1" for testing the CAM 100, the data (input signals DI0, DI1, DI2) held in the scan flip-flops SFF-DI0, SFF-DI1, SFF-DI2 change in synchronism with a common clock signal not shown in the following sequence:

(0, 0, 0)→(1, 0, 0)→(1, 1, 0)→(1, 1, 1)→(0, 1, 1)→(0, 0, 1)→(0, 0, 0)→ . . . $\dot{X}$ where the initial values of the data are (0, 0, 0).

This eliminates the need to previously produce the test data one by one and to shift and apply the test data to the respective scan flip-flops. Once the initial values of the data held in the scan flip-flops are set, the test patterns for the input signals DI0 to DI2 are self-produced.

The conventional scan path may be formed by setting the test signal CAMTEST to "0".

Figure 7A:
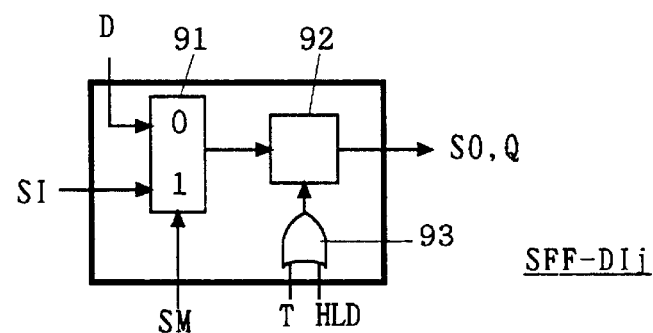
Figure 7B:
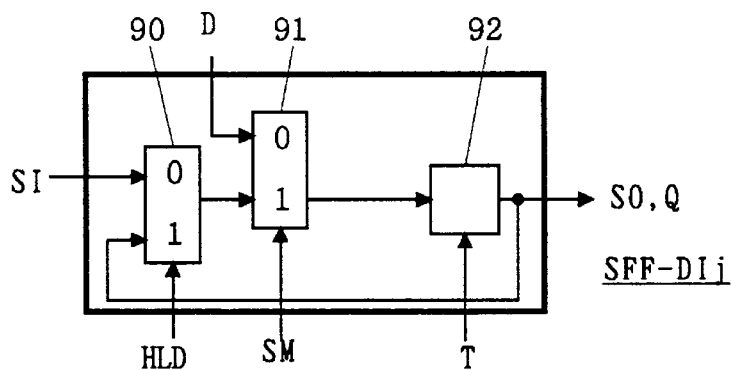
Figure 7C:
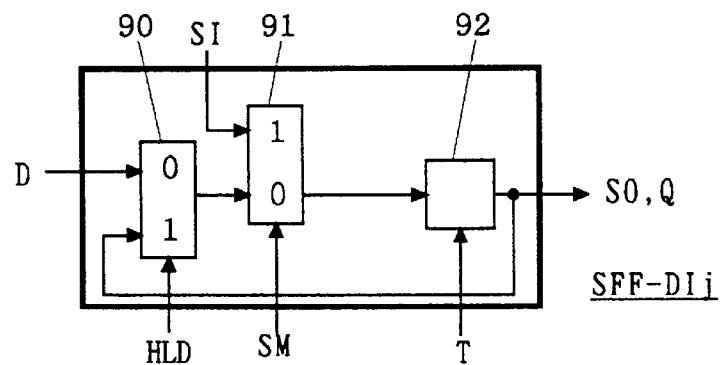

FIGS. 7A through 7C are circuit diagrams showing examples of the scan flip-flop SFF-DIj for use in the arrangement of FIG. 3. All of the circuits shown in FIGS. 7A through 7C receive a clock signal T and a hold signal as well as the shift mode signal SM. The hold signal is applied to a terminal HLD.

The clock signal T is essential for operation of the scan flip-flops, but further inputting the hold signal as well as the clock signal T is advantageous in that the data can be held independently of the clock signal T during the test of the CAM. This advantage is necessary to prevent the application of the data held in the scan flip-flops SFF-DI0, SFF-DI1, SFF-DI2 as the input signals DI0, DI1, DI2 to the CAM 100 from being complicated with the update of data held therein.

The scan flip-flop SFF-DIj shown in FIG. 7A comprises a selector 91, a flip-flop 92, and an OR circuit 93. The selector 91 has a 0-input and a 1-input connected respectively to a D terminal and a scan input terminal SI and is controlled by the shift mode signal SM. The OR circuit 93 produces the OR of the hold signal and the clock signal T. The flip-flop 92 holds and transmits the output from the selector 91 in synchronism with the output from the OR circuit 93. The OR circuit 93 may be shared between a plurality of scan flip-flops. Setting the hold signal to "1" fixes the output from the OR circuit 93 to "1", placing the flip-flop 92 in a data holding state.

The scan flip-flop SFF-DIj shown in FIG. 7B comprises selectors 90, 91 and the flip-flop 92. The selector 90 has a 0-input connected to the scan input terminal SI and a 1-input connected to the output of the flip-flop 92, and the operation of the selector 90 is controlled by the hold signal. The selector 91 has a 0-input connected to the D terminal and a 1-input connected to the output of the selector 90, and the operation of the selector 91 is controlled by the shift mode signal SM. The flip-flop 92 is controlled by the clock signal T to hold and transmit the output from the selector 91. Setting the hold signal and shift mode signal SM to "1" allows the selector 90 to receive the data held in the flip-flop 92 in synchronism with the clock signal T. As a result, the data is held.

When the hold signal is "0", the scan input terminal SI is connected to the 1-input of the selector 91, providing a circuit equivalent to the circuit of FIG. 2. Thus, if suitable control, such as interrupt of the clock signal T when the data must be held, is performed, the circuit shown in FIG. 2 may be applied to the circuit shown in FIG. 3.

The scan flip-flop SFF-DIj shown in FIG. 7C is similar in construction to that of FIG. 7B except that the 0-input of the selector 90, the 0-input of the selector 91, and the 1-input of the selector 91 are connected to the D terminal, the output of the selector 90, and the scan input terminal SI, respectively. The arrangement of FIG. 7C is similar also in function to that of FIG. 7B.

C. Writing to CAM 100

First to third techniques to be described below determine if a match occurs between the predetermined contents to be stored in the CAM 100 and the test data by using the test pattern while updating the predetermined contents to determine whether or not the CAM 100 is acceptable.

It is impossible to foresee whether the contents stored in the content addressable memory cell Cij (or Mij) is "0" or "1" when a failure is detected. It is also impossible to foresee whether there is a match or mismatch when a failure is detected. For troubleshooting, it is necessary to determine whether or not a failure occurs when the contents stored in the content addressable memory cell Cij changes from "0" to "1" or vice versa or when the search data changes. Therefore, the predetermined contents to be stored in the CAM 100 must be updated for testing.

The test pattern changes indicated by the symbol $\dot{X}$ correspond to inverting the value of the input signal DIj while updating the value j. For example, when the initial values of the held data are (0, 0, 0), a set of values of the input signals DI0, DI1, DI2 (test pattern) are (0, 0, 0). Inverting the value of the input signal DI0 provides the test pattern (1, 0, 0). Then, inverting the value of the input signal DI1 provides the test pattern (1, 1, 0). Further, inverting the value of the input signal DI2 provides the test pattern (1, 1, 1). Inverting the value of the input signal DI0 again provides the test pattern (0, 1, 1), and then inverting the value of the input signal DI1 provides the test pattern (0, 0, 1). Such concepts are commonly used in all algorithms represented in the first to third techniques.

(c-1) First Technique

Second Preferred Embodiment

Figure 8:
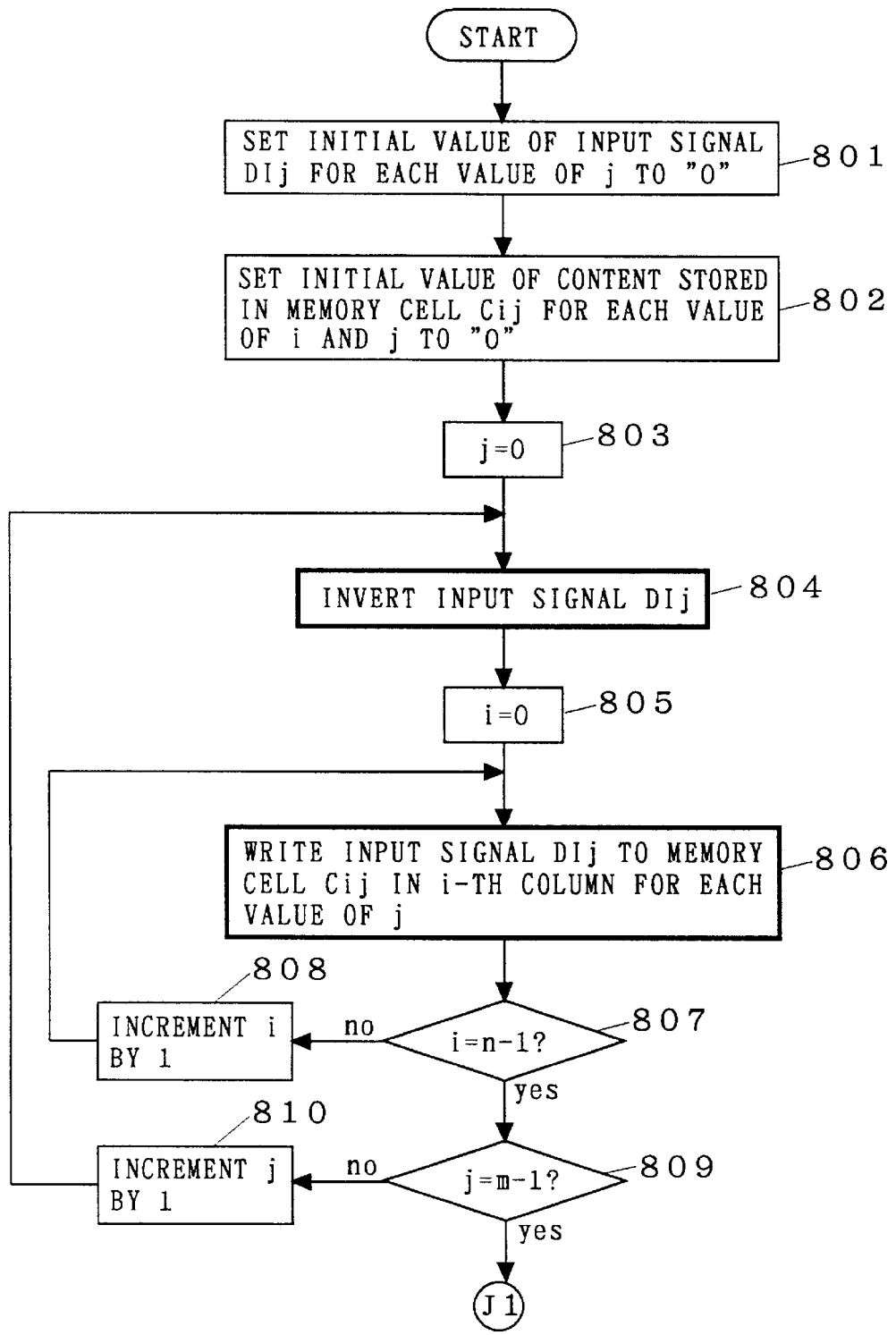
FIGS. 8 and 9 together are a flow chart of a second preferred embodiment according to the present invention.
Figure 9:
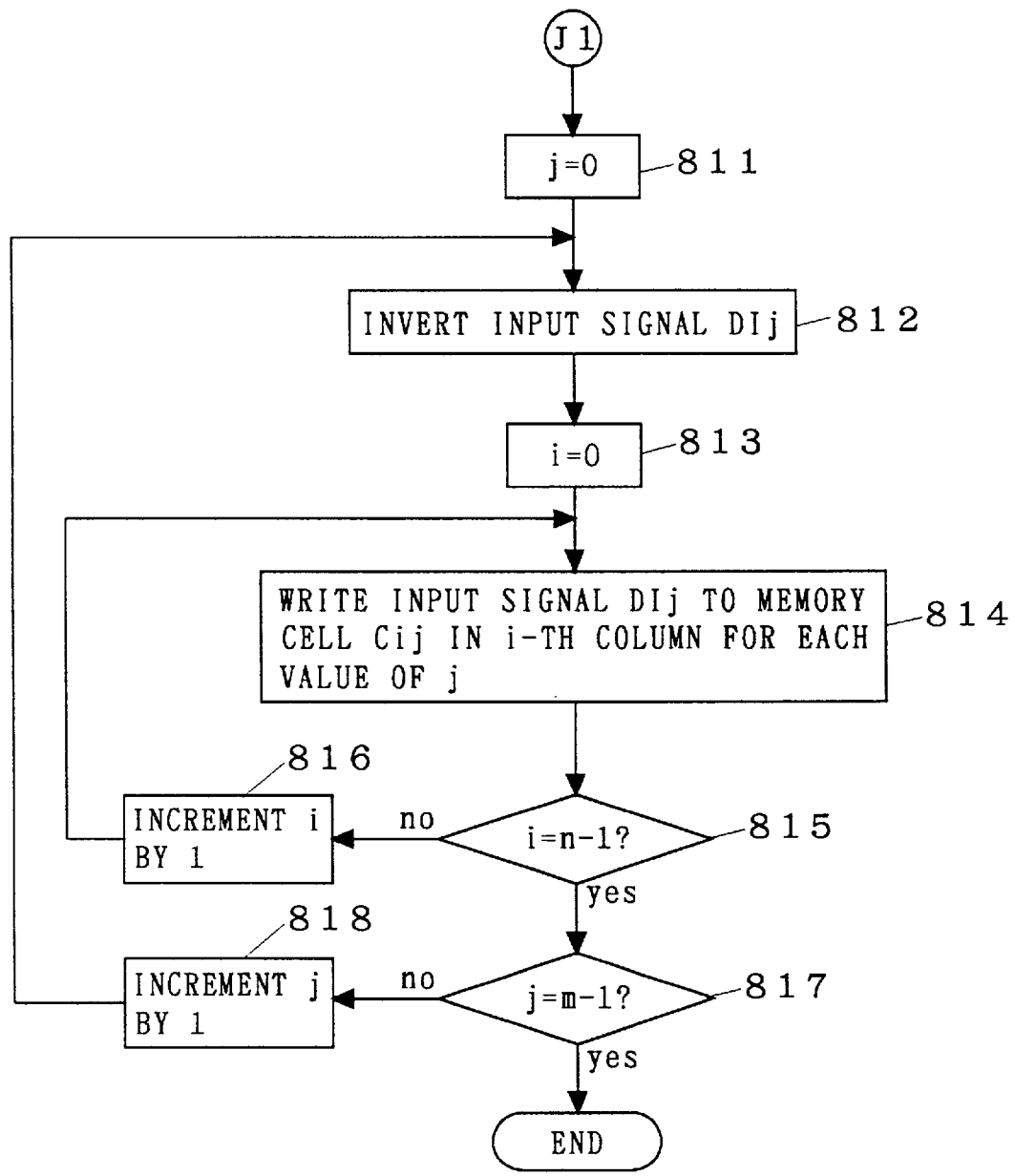

FIGS. 8 and 9 are a flow chart of the first technique according to the present invention, and provide a continuous flow using a connector J1.

FIGS. 10 through 39 conceptually illustrate, in chronological order, the contents stored in the scan flip-flop SFF-DIj (input signal DIj) and in the content addressable memory cell Cij (i=0, 1, 2, 3; j=0, 1, 2) of the CAM 100 which are subjected to the first technique. The sequential states "STATE-A-p" (p=0 to 29) are shown in FIGS. 10 through 39. In these figures, "0" and "1" depicted in a block indicative of the scan flip-flop SFF-DIj represent the input signal DIj, and "0" and "1" depicted in the lower part of a block indicative of the content addressable memory cell Cij represent the content stored in the content addressable memory cell Cij depicted in the upper part thereof.

Figure 10:
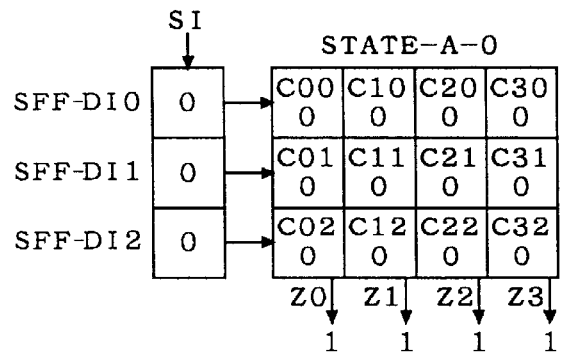

First, the initial value of the input signal DIj for each value of j is set to "0" in the step 801. The initial value of the content stored in the content addressable memory cell Cij for each value of i and j is set to "0" in the step 802. This is achieved by writing the input signal DIj set to "0" to the content addressable memory cell Cij in the i-th column. FIG. 10 shows a state of data after the execution of the steps 801 and 802.

In the step 803, the value j is set to "0". That is, initialization is carried out for processing the scan flip-flop SFF-DIj.

Figure 11:
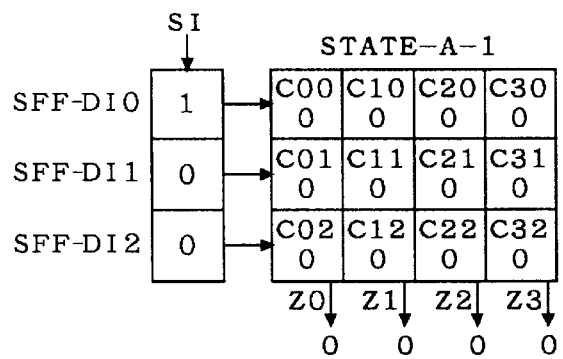

In the step 804, the input signal DIj is inverted. Since j=0 immediately after the execution of the step 803, the processing in the step 804 is the inversion of the input signal DI0. As described above, this processing corresponds to the feedback using the inverter INV1 shown in FIG. 3 and is equivalent to shift-in of the value "1". FIG. 11 shows a state of data after the execution of the step 804.

In the steps indicated by thick blocks such as steps 804, 806, 812 and 814, the column coincidence signal Zi determined by the execution of the step is also tested.

Referring to FIG. 11, the input signals DI1, DI2 are written to the content addressable memory cells C01–C31 and C02–C32 in the zeroth to third columns in the step 802, and the execution of the subsequent step does not change the values of the input signals DI1, DI2 and the contents stored in the content addressable memory cells C01–C31 and C02–C32. Thus, a "match" is determined with respect to the relationship between the content addressable memory cells C01–C31 and C02–C32 and the input signals DI1, DI2 functioning as search data (because the input signal DIj is applied to the bit line as data for writing and also to the search line as illustrated in FIG. 4). The transmission line Zi is not grounded in these memory cells, and failure detection has no meaning.

However, since the value of the input signal DI0 is changed from "0" to "1" in the step 804 in relation to the content addressable memory cells C00–C30 in the first row, a "mismatch" should be determined with respect to the relationship between the content addressable memory cells C00–C30 written with "0" in the step 802 and the input signal DI0 functioning as search data. If not so, the content addressable memory cells C00–C30 would be determined as defective.

Additionally, since the column coincidence signal Zi is obtained for each column and the transmission line Zi is not grounded in the content addressable memory cells C01–C31 and C02–C32, a failure may be detected in each of the content addressable memory cells C00–C30. The value of the column coincidence signal Zi shown in FIGS. 10 through 39 is an expected value to be provided when no failure occurs in all of the memory cells.

In the step 805, the value i is set to "0". This is the initialization for the processing in the step 806.

Figure 12:
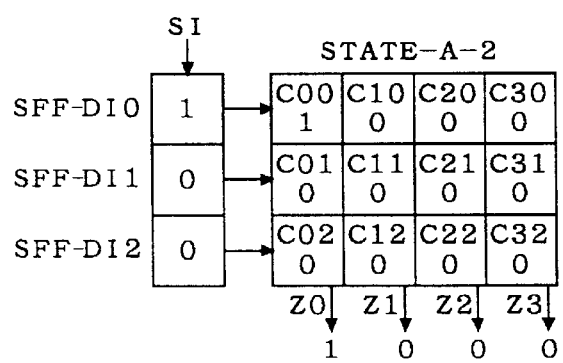

In the step 806, the input signal DIj is written to the content addressable memory cell Cij in the i-th column for each value of j. Immediately after the step 805, the content addressable memory cells C00–C02 in the zeroth column are written. FIG. 12 shows a state of data after the step 806 executed on the state of FIG. 11. The set of values of the input signals DI0, DI1, DI2 are (1, 0, 0), and accordingly the values "1", "0", "0" are written to the content addressable memory cells C00, C01, C02, respectively.

The values of the input signals DI0, DI1, DI2 serve as search data, and the column coincidence signal Zi is checked. In the state of FIG. 12, only the content of the memory cell C00 is changed by the write operation in the step 806 and may be checked for failure.

The content addressable memory cell C00 has already been checked for failure in the state shown in FIG. 11. However, this check is as to whether or not a mismatch is determined between the content of the content addressable memory cell C00 updated to "0" and the input signal DI0 as search data updated to "1". The check in the state shown in FIG. 12 is as to whether or not a match is determined between the content of the content addressable memory cell C00 updated to "1" and the input signal DI0 as search data updated to "1".

In view of the fact that the content stored in the content addressable memory cell Cij and the search data can be in a plurality of states, it is necessary to update the content stored in the content addressable memory cell Cij as stated at the beginning of this section. The update is automatically performed in the step 806.

A determination is made as to whether or not there is a column to which the set of input signals DI0, DI1, DI2 have not yet been written in the step 807. The value n denotes the number of columns which is 4 herein. In the step 808, the column number i is incremented by one for preparation to the write operation in the right-hand adjacent column. Then the flow returns to the step 806.

Figure 13:
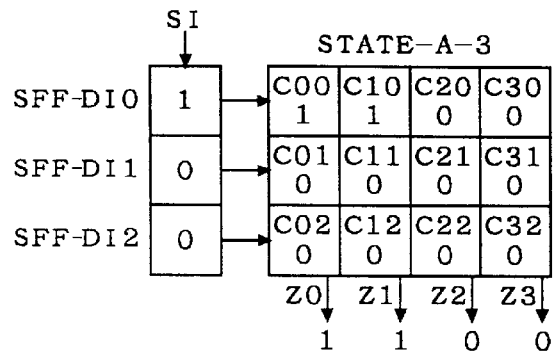

FIG. 13 shows a state of data after the step 806 executed on the state of FIG. 12. That is, the values "1", "0", "0" are written respectively to the content addressable memory cells C10, C11, C12 in the first column to provide the column coincidence signal Zi. In this state, whether or not the content addressable memory cell C10 is defective may be checked.

Figure 14:
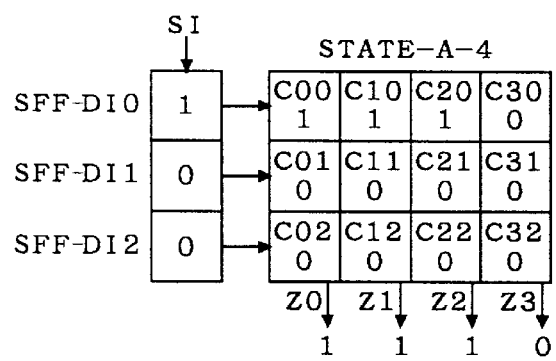

FIG. 14 shows a state of data after the step 806 executed on the state of FIG. 13. That is, the values "1", "0, "0" are written respectively to the content addressable memory cells C20, C21, C22 in the second column to provide the column coincidence signal Zi. In this state, whether or not the content addressable memory cell C20 is defective may be checked.

Figure 15:
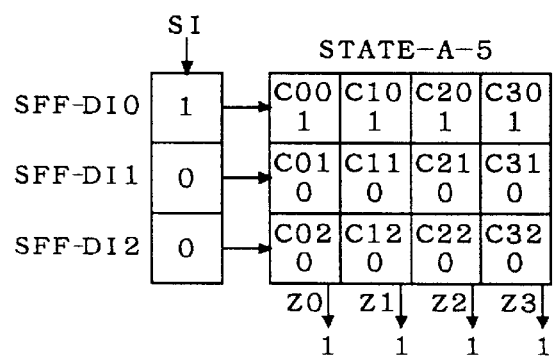

FIG. 15 shows a state of data after the step 806 executed on the state of FIG. 14. That is, the values "1", "0", "0" are written respectively to the content addressable memory cells C30, C31, C32 in the third column to provide the column coincidence signal Zi. In this state, whether or not the content addressable memory cell C30 is defective may be checked.

In this manner, whether or not the content addressable memory cells C00 to C30 in the zeroth row are defective may be checked in the following cases:

(1) Case 1: the content stored in each memory cell is "0" and the search data is "1"

(2) Case 2: the content stored in each memory cell is "1" and the search data is "1"

When the column number i equals (n−1) (herein 4−1=3) in the step 807, the flow proceeds to the step 809 wherein whether or not the row number j equals (m−1) is determined. The value m denotes the number of rows which is 3 herein. The row number j is incremented by one in the step 810 for preparation to the generation of a new test pattern. The flow then returns to the step 804.

Figure 16:
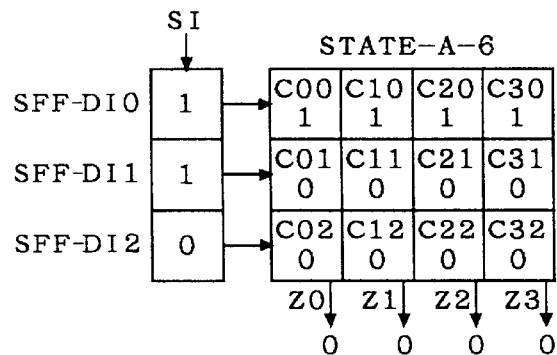
Figure 17:
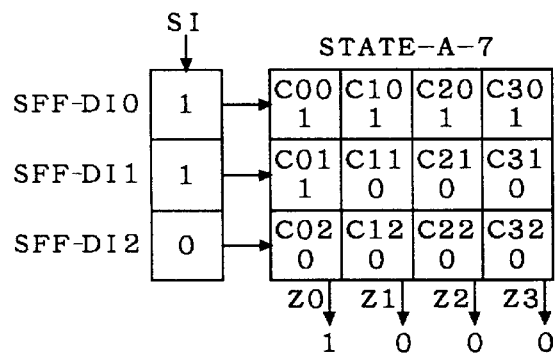
Figure 18:
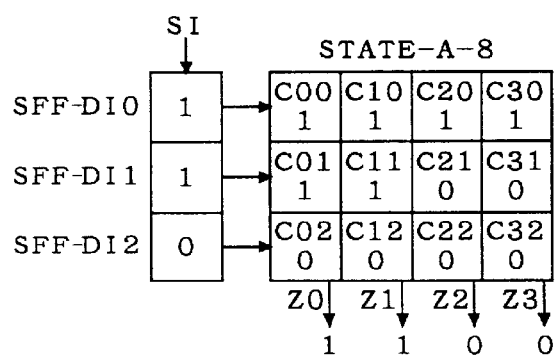
Figure 19:
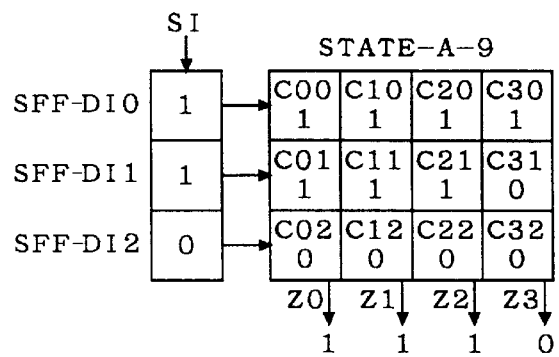
Figure 20:
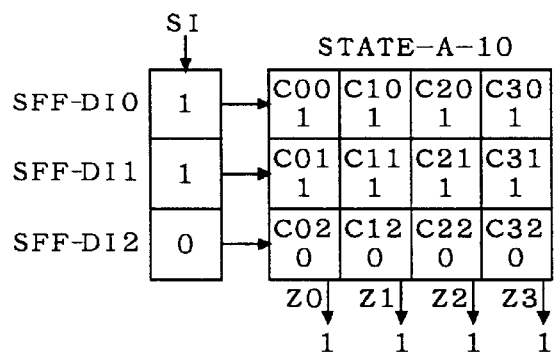

FIG. 16 shows a state of data after the step 804 executed on the state of FIG. 15. Since the row number j is updated from "0" to "1", the input signal DI1 is inverted in the step 804. This processing is equivalent to the inversion of the value "0" of the input signal DI3, shift-in of the inverted value as the input signal DI0, and setting of the previous value "1" of the input signal DI0 to the input signal DI1.

In the state shown in FIG. 16, the content addressable memory cells C00–C30 in the zeroth row have "1" already stored therein, and the input signal DI0 remains at "1" unchanged by the execution of the step 804. Thus, the detection of failures in the content addressable memory cells C00–C30 in the zeroth row has no meaning in this state.

The content addressable memory cells C02–C32 in the second row and the input signal DI2 have not yet been changed. In this state, the detection of failures in the content addressable memory cells C02–C32 in the second row has no meaning.

In this state, a failure in Case 1 can be detected in the content addressable memory cells C01–C31 in the first row, as can in the content addressable memory cells C00–C30 in the zeroth row in the state of FIG. 11. The step 806 is repeated in a similar manner to update the state of data as shown in FIGS. 17 through 20 (write to the zeroth to third columns and read the column coincidence signal Zi). A failure in Case 2 may be detected in the content addressable memory cells C01–C31 in the first row.

Figure 21:
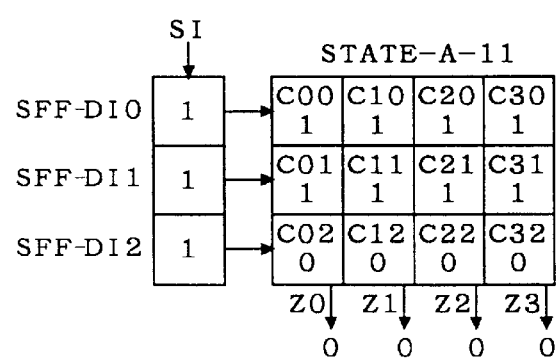
Figure 22:
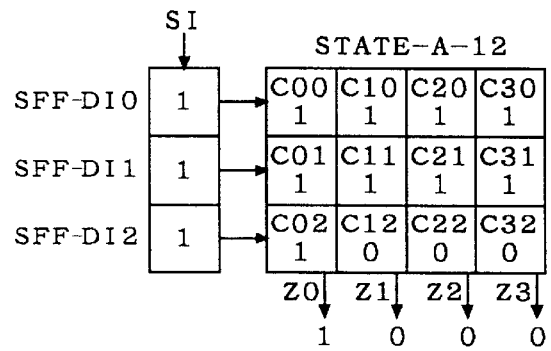
Figure 23:
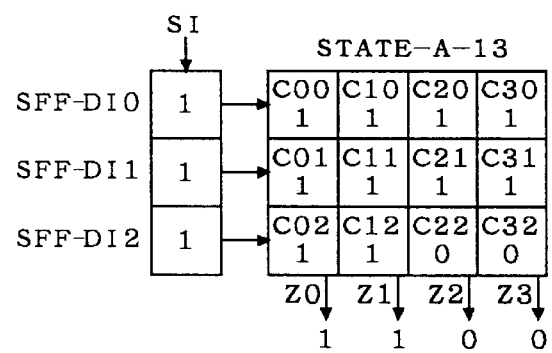
Figure 24:
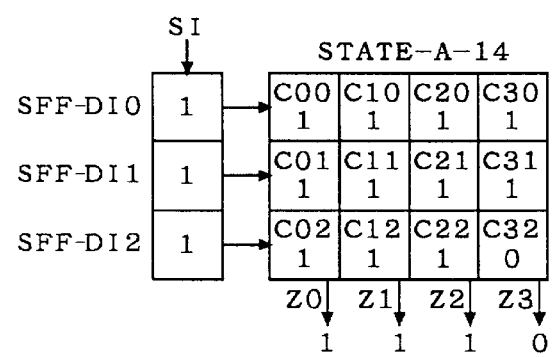

Likewise, a failure in Case 1 may be detected in the content addressable memory cells C02–C32 in the second row in the state of FIG. 21, and a failure in Case 2 may be detected in the content addressable memory cells C02–C32 in the second row in the states shown in FIGS. 22 through 25.

Figure 25:
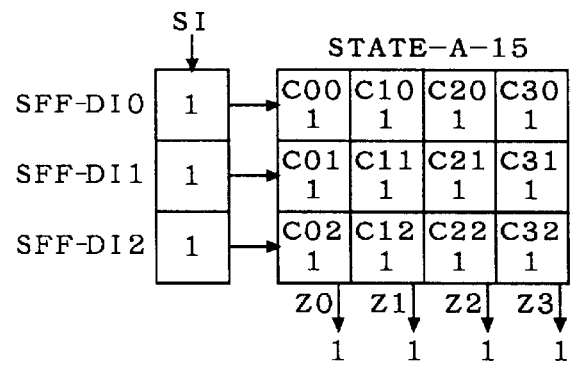
Figure 26:
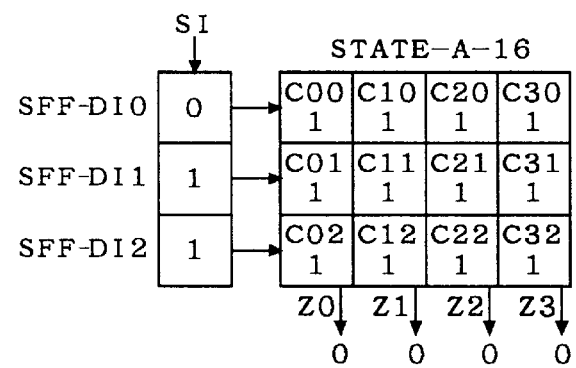
Figure 27:
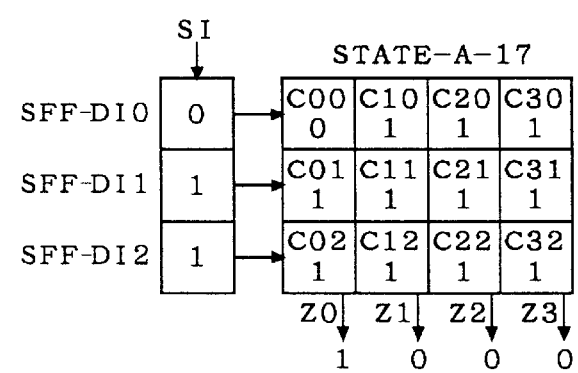
Figure 28:
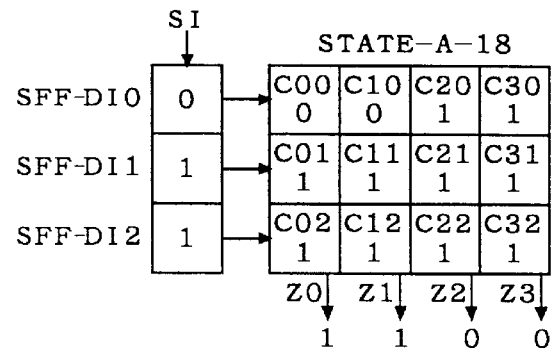
Figure 29:
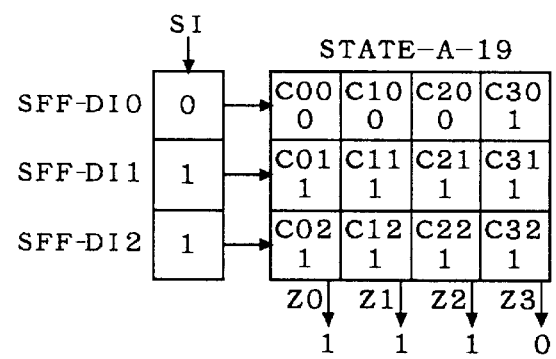
Figure 30:
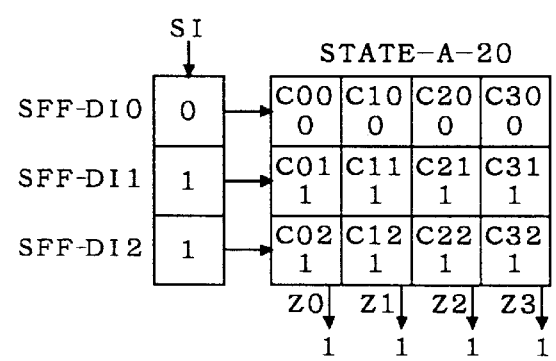
Figure 31:
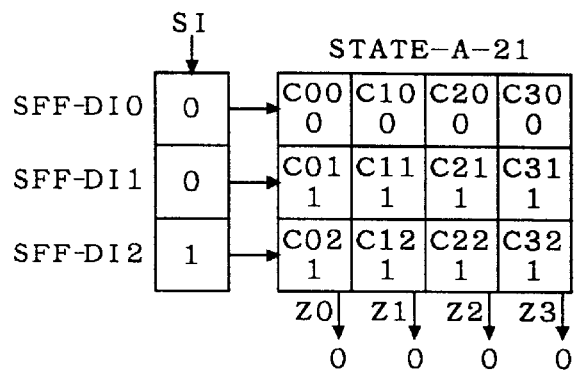
Figure 32:
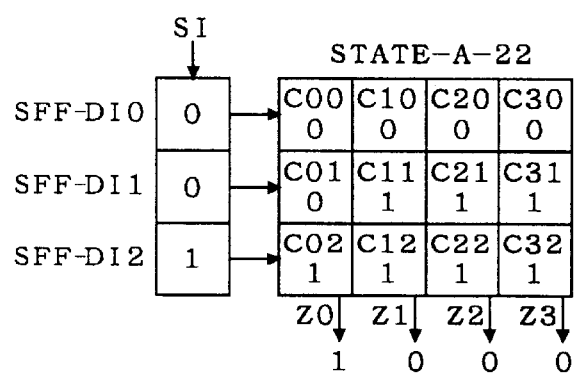
Figure 33:
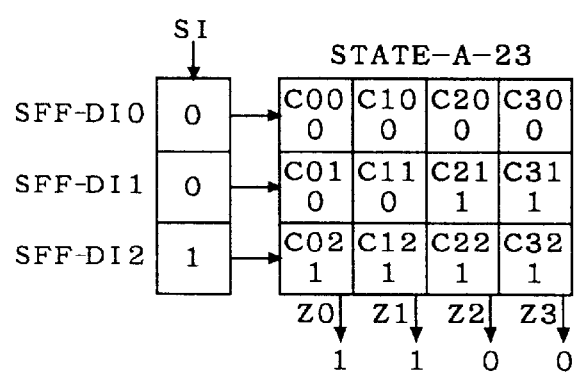
Figure 34:
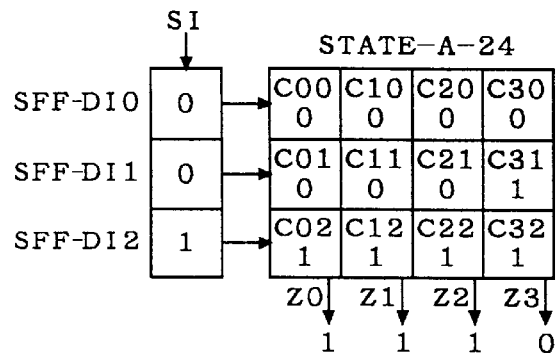
Figure 35:
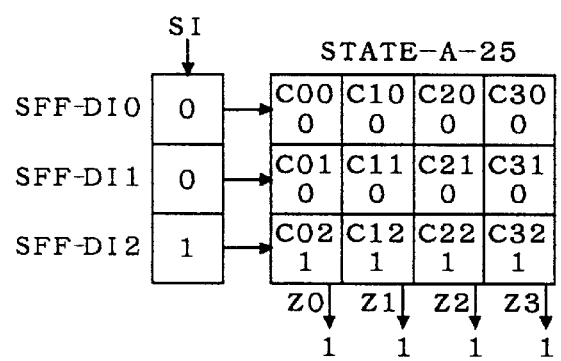
Figure 36:
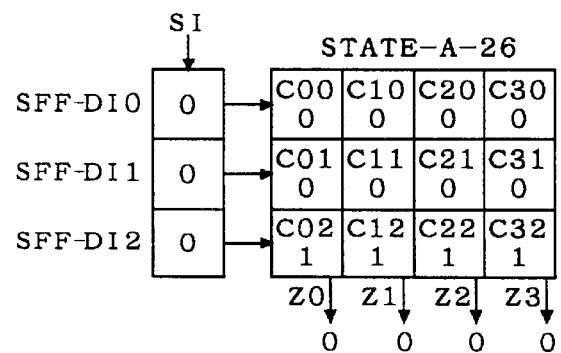

After the state shown in FIG. 25, results of determination in the steps 807 and 809 are "Yes", and the flow proceeds to the connector J1. In other words, failure detection in Cases 1 and 2 in all of the content addressable memory cells Cij has been completed when the flow reaches the connector J1.

The process in the steps 811–818 of FIG. 9 is seemingly identical with that in the steps 803–810 of FIG. 8. In practice, Cases 1 and 2 are reversed. This is because the initial state of the steps 803–810 is that shown in FIG. 10 whereas the initial state of the steps 811–818 is that shown in FIG. 25. The value "0" in FIG. 10 is changed to the value "1" in FIG. 25.

In the steps 803–818, the value of the input signal DIj and the contents stored in the content addressable memory cell Cij are subjected to logic inversion (or shift-in; in the steps 804 and 812) and write operation (including read operation of the column coincidence signal Zi; in the steps 806 and 814), respectively. Thus, the states provided by execution of the steps 811–818 are similar to those shown in FIGS. 10 through 24 except that "0" and "1" are interchanged. This interchange provides the states shown in FIGS. 25 through 39 in corresponding relation to the states shown in FIGS. 10 through 24.

Therefore, "0" and "1" in Cases 1 and 2 are also interchanged when failures are detected in the steps 811–818, that is:

(3) Case 3: the content stored in each memory cell is "1" and the search data is "0"

(4) Case 4: the content stored in each memory cell is "0" and the search data is "0"

FIG. 39 shows a state of data when i=2 and j=3 after the execution of the step 814. Then, the value i is set to 3 in the steps 815 and 816 and the content addressable memory cells C30, C31, C32 in the third column are written to return to the state shown in FIG. 10. After the steps 815 and 817, the entire processing is terminated.

In this fashion, failures may be detected in all memory cells in all of the cases based on variations in contents stored in the memory cells and search data. Writing to the CAM requires less test patterns. The first technique requires the six patterns indicated by the symbol ⊗ but does not require patterns including equal values on opposite ends and other values different from the opposite end values such as (1, 0, 1) and (0, 1, 0). Therefore, failures in all of Cases 1 through 4 may be detected if the input signal DIj is updated by using the shift-in technique.

(c-1-1) Circuit for Implementing First Technique

The circuit shown in FIGS. 1 and 2 showing the precursory concepts of the present invention may be subjected to the first technique shown in FIGS. 8 and 9 by the shift-in of the scan input signal SIDI forming a suitable test pattern. However, the value of the input signal DIj must be held when the content of the input signal DIj is written to the CAM 100, and it is desired to use scan flip-flops having a hold function shown in FIG. 7. If not so, the clock signal T must be suitably controlled for the hold operation.

Described below is a circuit for automatically producing a suitable test pattern to implement the first technique.

Third Preferred Embodiment

Figure 40:
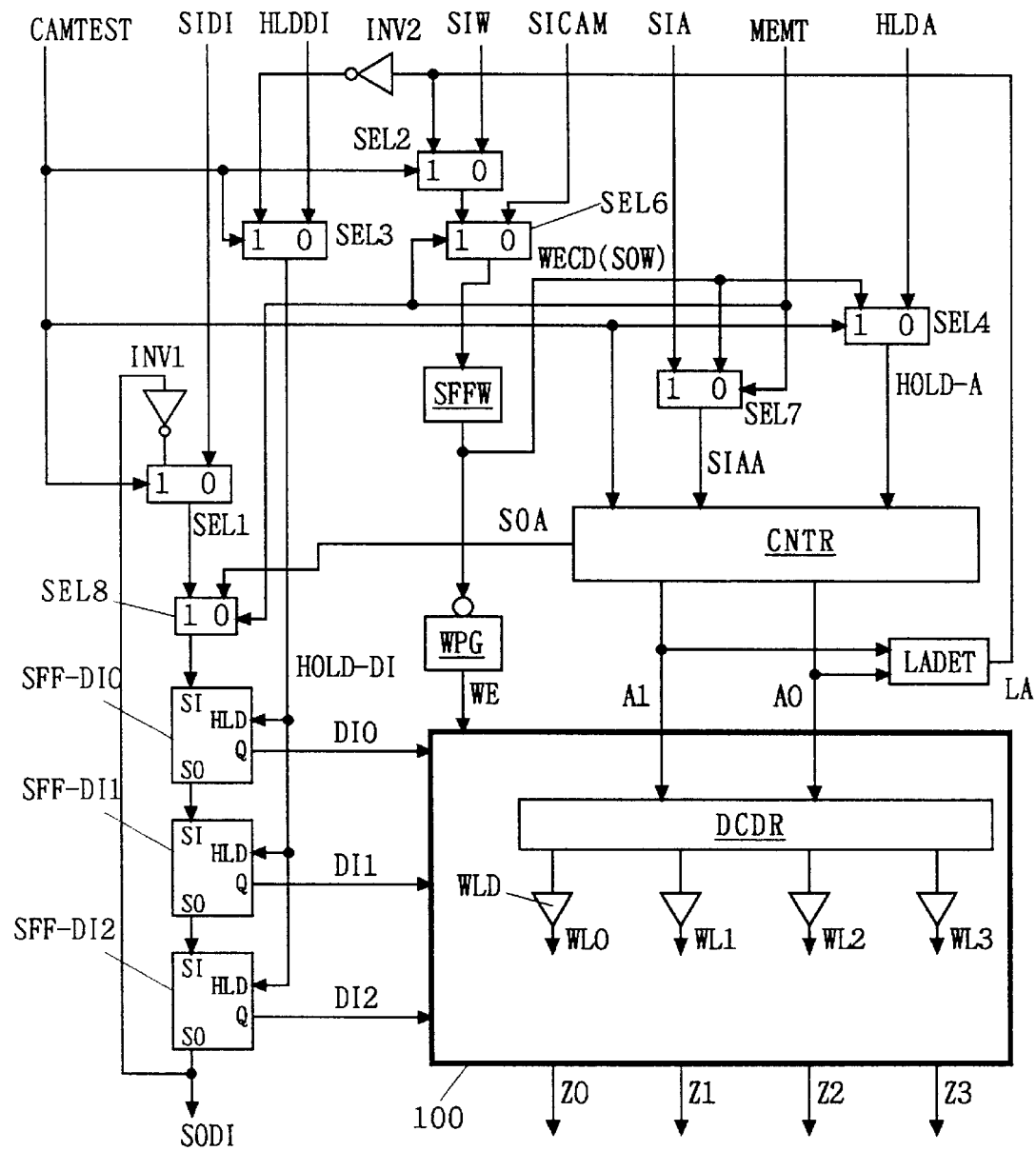
FIG. 40 is a circuit diagram of a third preferred embodiment according to the present invention.

FIG. 40 is a circuit diagram of a CAM test circuit for implementing the first technique. The CAM 100 to be tested is illustrated in FIG. 40 such that the number of bits (the number of rows) m of the input signal is 3 and the number of columns n is 4. Portions used for other purposes than the CAM test, such as the inputs of the input signals DDI0, DDI1, DDI2 and shift mode signal SM to be applied in the normal operation are not shown in FIG. 40. The clock signal T for operating timing is also not shown in FIG. 40. The test of the CAM 100 is described below, and the shift mode signal SM is constantly "1" in the description.

The CAM 100 receives the address signals A0, A1, a write enable signal WE, and the input signals DI0, DI1, DI2.

The address signals A0 and A1 are generated by an address counter CNTR which performs counting during at least the CAM test. An address hold signal HOLD-A causes the address counter CNTR to hold its value during counting independently of transition of the clock signal T not shown. A selector SEL4 selectively employs an address hold raw signal HLDA or a write raw signal WECD as the address hold signal HOLD-A.

The address counter CNTR illustrated herein can update its value in response to a scan address input SIAA. A selector SEL7 selectively employs a scan address input raw signal SIA or the write raw signal WECD as the scan address input SIAA.

A last address detecting circuit LADET receives the address signals A0 and A1 and sets a last address detection signal LA to "1" when the address signals A0 and A1 indicate the algorithmic last address. For example, A0=A1=1 is specified as the last address.

The write enable signal WE is generated by a write pulse generator WPG and makes a transition in synchronism with the clock signal T when the write raw signal WECD outputted from a scan flip-flop SFFW is "L".

A selector SEL6 selectively applies the output from a selector SEL2 or a unified scan input SICAM to the scan flip-flop SFFW. The circuit of FIG. 2 is used as the scan flip-flop SFFW, for example. The output from the selector SEL6 is applied to the scan input terminal SI.

The scan output SO of the scan flip-flop SFF-DI0 is connected to the scan input SI of the scan flip-flop SFF-DI1, and the scan output SO of the scan flip-flop SFF-DI1 is connected to the scan input SI of the scan flip-flop SFF-DI2. The scan output SO of the scan flip-flop SFF-DI2 is connected to the input of the inverter INV1, and the scan input SI of the scan flip-flop SFF-DI0 is connected to the output of the inverter INV1 through selectors SEL1 and SEL8.

An input hold signal HOLD-DI is applied to the terminal HLD of each scan flip-flop SFF-DIj. When the input hold signal HOLD-DI is "1", the scan flip-flop SFF-DIj holds the content stored therein independently of the transition of the clock signal T.

A selector SEL3 selectively employs an input hold raw signal HLDDI or the inverted signal of the last address detection signal LA as the input hold signal HOLD-DI. The inverter INV2 inverts the last address detection signal LA.

The test signal CAMTEST controls the selectors SEL1 to SEL4, and a scan path control signal MEMT controls the selectors SEL6 to SEL8.

The test signal CAMTEST is "1" when the CAM 100 is tested. In this case, the output from the inverter INV1 is applied to the 1-input of the selector SEL8, and the last address detection signal LA is applied to the 1-input of the selector SEL6. Further, the output from the inverter INV2 is used as the input hold signal HOLD-DI, and the write raw signal WECD is used as the address hold signal HOLD-A.

When the scan path control signal MEMT is "1", the output from the selector SEL2 is applied to the scan flip-flop SFFW, the scan address input raw signal SIA is used as the scan address input SIAA, and the output from the selector SEL1 is applied to the scan input SI of the scan flip-flop SFF-DI0.

For the purpose of illustration, the description will proceed assuming that the scan path control signal MEMT is "1". The operation when the scan path control signal MEMT is "0" is discussed later.

Tables 1 and 2 are a logic table of the signals for illustrating the circuit operation of FIG. 40 for each period of the clock signal T. In the tables, "x" indicates that the value need not be specified (don't care). The data output DOj and column coincidence signal Zi of FIG. 4 are also illustrated in Tables 1 and 2.

TABLE 1

| period | CAM-TEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 0 | x | x | x | x | x | x | x | x | x | x | x | x | x | x | x | x | x | x | x | x | x |
|   |   |   |   |   |   |   |   | shift in 0 to DI |   |   |   |   |   |   |   |   |   |   |   |   |   |
| 1 | 0 | 0 | x | 1 | 0 | 0 | x | x | x | x | 0 | x | x | 1 | x | x | x | x | x | x | x |
| 2 | 0 | 0 | x | 1 | 0 | 0 | x | x | x | x | 0 | 0 | x | 1 | x | x | x | x | x | x | x |
| 3 | 0 | 0 | x | 1 | 0 | 0 | x | x | x | x | 0 | 0 | 0 | 1 | x | x | x | x | x | x | x |
|   |   |   |   |   |   |   |   | write 0 for all address |   |   |   |   |   |   |   |   |   |   |   |   |   |
| 4 | 0 | x | 0 | 1 | 1 | 1 | 0 | 0 | 0 | x | 0 | 0 | 0 | 1 | x | x | x | x | x | x | x |
| 5 | 0 | x | 0 | 0 | 1 | 1 | 0 | 0 | 0 | 0 | 0 | 0 | 0 | 0 | 1 | x | x | x | 0 | 0 | 0 |
| 6 | 0 | x | 1 | 0 | 1 | 1 | 0 | 0 | 1 | 0 | 0 | 0 | 0 | 0 | 1 | x | 1 | x | 0 | 0 | 0 |
| 7 | 0 | x | 1 | 0 | 1 | 1 | 0 | 0 | 1 | 1 | 0 | 0 | 0 | 0 | 1 | x | 1 | 1 | 0 | 0 | 0 |
| 8 | 0 | x | 0 | 0 | 1 | 1 | 0 | 0 | 0 | 1 | 0 | 0 | 0 | 0 | 1 | 1 | 1 | 1 | 0 | 0 | 0 |
|   |   |   |   |   |   |   |   | shift in last address |   |   |   |   |   |   |   |   |   |   |   |   |   |
| 9 | 0 | x | 1 | 1 | 1 | 1 | 0 | 0 | 1 | 0 | 0 | 0 | 0 | 1 | 1 | 1 | 1 | 1 | 0 | 0 | 0 |
| 10 | 0 | x | 1 | 1 | 1 | 1 | 0 | 0 | 1 | 1 | 0 | 0 | 0 | 1 | 1 | 1 | 1 | 1 | 0 | 0 | 0 |
|   |   |   |   |   |   |   |   | set SFFW(WECD)=0 |   |   |   |   |   |   |   |   |   |   |   |   |   |
| 11 | 0 | x | x | 0 | 1 | 1 | 1 | 1 | 1 | 1 | 0 | 0 | 0 | 0 | 1 | 1 | 1 | 1 | 0 | 0 | 0 |
|   |   |   |   |   |   |   |   | run CAM BIST |   |   |   |   |   |   |   |   |   |   |   |   |   |
| 12 | 1 | x | x | x | x | 1 | x | 1 | 0 | 0 | 1 | 0 | 0 | 1 | 0 | 0 | 0 | 0 | 0 | 0 | 0 |
| 13 | 1 | x | x | x | x | 1 | x | 0 | 0 | 0 | 1 | 0 | 0 | 0 | 1 | 0 | 0 | 0 | 1 | 0 | 0 |
| 14 | 1 | x | x | x | x | 1 | x | 0 | 0 | 1 | 1 | 0 | 0 | 0 | 1 | 1 | 0 | 0 | 1 | 0 | 0 |
| 15 | 1 | x | x | x | x | 1 | x | 0 | 1 | 0 | 1 | 0 | 0 | 0 | 1 | 1 | 1 | 0 | 1 | 0 | 0 |
| 16 | 1 | x | x | x | x | 0 | x | 0 | 1 | 1 | 1 | 0 | 0 | 0 | 1 | 1 | 1 | 1 | 1 | 0 | 0 |
| 17 | 1 | x | x | x | x | 1 | x | 1 | 0 | 0 | 1 | 1 | 0 | 1 | 0 | 0 | 0 | 1 | 1 | 0 | 0 |
| 18 | 1 | x | x | x | x | 1 | x | 0 | 0 | 0 | 1 | 1 | 0 | 0 | 1 | 0 | 0 | 0 | 1 | 1 | 0 |
| 19 | 1 | x | x | x | x | 1 | x | 0 | 0 | 1 | 1 | 1 | 0 | 0 | 1 | 1 | 0 | 0 | 1 | 1 | 0 |
| 20 | 1 | x | x | x | x | 1 | x | 0 | 1 | 0 | 1 | 1 | 0 | 0 | 1 | 1 | 1 | 0 | 1 | 1 | 0 |
| 21 | 1 | x | x | x | x | 0 | x | 0 | 1 | 1 | 1 | 1 | 0 | 0 | 1 | 1 | 1 | 1 | 1 | 1 | 0 |
| 22 | 1 | x | x | x | x | 1 | x | 1 | 0 | 0 | 1 | 1 | 1 | 1 | 0 | 0 | 0 | 0 | 1 | 1 | 0 |
| 23 | 1 | x | x | x | x | 1 | x | 0 | 0 | 0 | 1 | 1 | 1 | 0 | 1 | 0 | 0 | 0 | 1 | 1 | 1 |
| 24 | 1 | x | x | x | x | 1 | x | 0 | 0 | 1 | 1 | 1 | 1 | 0 | 1 | 1 | 0 | 0 | 1 | 1 | 1 |
| 25 | 1 | x | x | x | x | 1 | x | 0 | 1 | 0 | 1 | 1 | 1 | 0 | 1 | 1 | 1 | 0 | 1 | 1 | 1 |
| 26 | 1 | x | x | x | x | 0 | x | 0 | 1 | 1 | 1 | 1 | 1 | 0 | 1 | 1 | 1 | 1 | 1 | 1 | 1 |
| 27 | 1 | x | x | x | x | 1 | x | 1 | 0 | 0 | 0 | 1 | 1 | 1 | 0 | 0 | 0 | 0 | 1 | 1 | 1 |
| 28 | 1 | x | x | x | x | 1 | x | 0 | 0 | 0 | 0 | 1 | 1 | 0 | 1 | 0 | 0 | 0 | 0 | 1 | 1 |
| 29 | 1 | x | x | x | x | 1 | x | 0 | 0 | 1 | 0 | 1 | 1 | 0 | 1 | 1 | 0 | 0 | 0 | 1 | 1 |

TABLE 2

| period | CAM-TEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 30 | 1 | x | x | x | x | 1 | x | 0 | 1 | 0 | 0 | 1 | 1 | 0 | 1 | 1 | 1 | 0 | 0 | 1 | 1 |
| 31 | 1 | x | x | x | x | 0 | x | 0 | 1 | 1 | 0 | 1 | 1 | 0 | 1 | 1 | 1 | 1 | 0 | 1 | 1 |
| 32 | 1 | x | x | x | x | 1 | x | 1 | 0 | 0 | 0 | 0 | 1 | 1 | 0 | 0 | 0 | 0 | 0 | 0 | 1 |
| 33 | 1 | x | x | x | x | 1 | x | 0 | 0 | 0 | 0 | 0 | 1 | 0 | 1 | 0 | 0 | 0 | 0 | 0 | 1 |
| 34 | 1 | x | x | x | x | 1 | x | 0 | 0 | 1 | 0 | 0 | 1 | 0 | 1 | 1 | 0 | 0 | 0 | 0 | 1 |
| 35 | 1 | x | x | x | x | 1 | x | 0 | 1 | 0 | 0 | 0 | 1 | 0 | 1 | 1 | 1 | 0 | 0 | 0 | 1 |
| 36 | 1 | x | x | x | x | 0 | x | 0 | 1 | 1 | 0 | 0 | 1 | 0 | 1 | 1 | 1 | 1 | 0 | 0 | 1 |
| 37 | 1 | x | x | x | x | 1 | x | 1 | 0 | 0 | 0 | 0 | 0 | 1 | 0 | 0 | 0 | 0 | 0 | 0 | 1 |
| 38 | 1 | x | x | x | x | 1 | x | 0 | 0 | 0 | 0 | 0 | 0 | 0 | 1 | 0 | 0 | 0 | 0 | 0 | 0 |
| 39 | 1 | x | x | x | x | 1 | x | 0 | 0 | 1 | 0 | 0 | 0 | 0 | 1 | 1 | 0 | 0 | 0 | 0 | 0 |
| 40 | 1 | x | x | x | x | 1 | x | 0 | 1 | 0 | 0 | 0 | 0 | 0 | 1 | 1 | 1 | 0 | 0 | 0 | 0 |

TABLE 2-continued

| period | CAM-TEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 41 | 1 | x | x | x | x | 0 | x | 0 | 1 | 1 | 0 | 0 | 0 | 0 | 1 | 1 | 1 | 1 | 0 | 0 | 0 |
| 42 | 1 | x | x | x | x | 1 | x | 1 | 0 | 0 | 1 | 0 | 0 | 1 | 0 | 0 | 0 | 0 | 0 | 0 | 0 |

Figure 41:
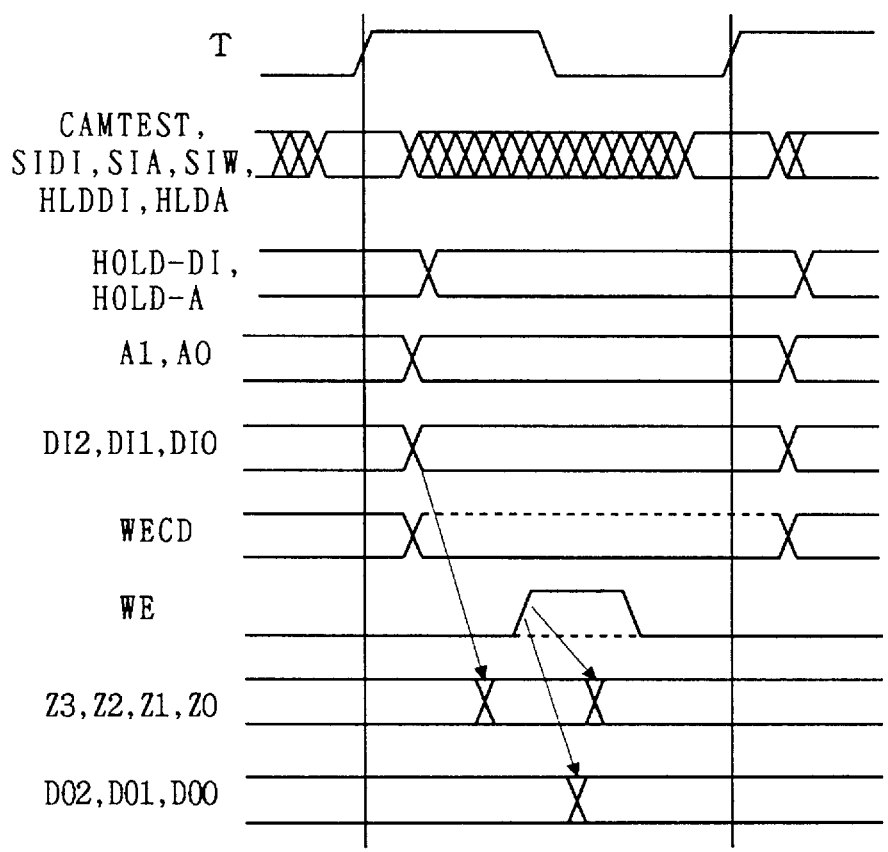
FIG. 41 is a timing chart showing the third preferred embodiment according to the present invention.

FIG. 41 is a timing chart showing the relationship between the transition timing of the clock signal T, the transition timing of a group of signals to be externally set (test signal CAMTEST, scan input signal SIDI, scan address input signal SIA, scan write signal SIW, input hold raw signal HLDDI, and address hold raw signal HLDA), and the timing of a group of signals to be transmitted internally of FIG. 40 (input hold signal HOLD-DI, address hold signal HOLD-A, address signals A1, A0, input signal DIj, write raw signal WECD, write enable signal WE, column coincidence signal Zi, and data outputs DOj).

The signals have no values during a zeroth period. The steps 801 to 803 are executed during first to eleventh periods over which the test signal CAMTEST is "0".

The step 801 is executed during first to third periods over which the scan input signal SIDI is "0". The selectors SEL1 and SEL8 apply the scan input signal SIDI to the scan input SI of the scan flip-flop SFF-DI0.

To update the content held in the scan flip-flop SFF-DIj, it is necessary to force the input hold signal HOLD-DI to "0", and thus the input hold raw signal HLDDI is set to "0". As above described, since the shift mode signal SM not shown (FIG. 7) is "1", the scan input signal SIDI is transmitted to the scan inputs SI of the scan flip-flops SFF-DI1 and SFF-DI2 in sequential order each time the clock signal T enters a new period. The input signal DI0 becomes "0" during the first period, and the input signal DI1 becomes "0" during the second period. All of the input signals DIj become "0" during the third period.

The CAM 100 (content addressable memory cell Cij) is not written during the first to third periods. Thus, to set the write enable signal WE to "0" (or to set the write raw signal WECD to "1"), the scan write signal SIW applied to the 0-input of the selector SEL2 is set to "1". The selector SEL4 selects the address hold raw signal HLDA as the address hold signal HOLD-A. However, the address signal need not necessarily be fixed because no write operation is performed, and the value of the address hold raw signal HLDA is not particularly set. Initial values of all of the content addressable memory cells Cij are set during fifth to eighth periods to be described below. Thus, the value of the scan write signal SIW need not necessarily be specified.

When the scan path control signal MEMT is "0", the unified scan input SICAM may carry the value for setting the initial state through the selector SEL6, scan flip-flop SFFW, selector SEL7, address counter CNTR, and selector SEL1.

The step 802 is executed during fourth to eighth periods. The input signal DIj is written to the content addressable memory cell Cij in each column in response to the address signals A1 and A0 which in turn must be sequentially updated. For the update, the scan address input SIAA is used herein to update the value held in the address counter CNTR. The selector SEL7 outputs the scan address input raw signal SIA as the scan address input SIAA, and thus the scan address input raw signal SIA is updated. During the fourth to eighth periods, the address hold raw signal HLDA and the address hold signal HOLD-A are "0" to inhibit the hold function of the address counter CNTR in order to permit the scan address input signal SIA to update the address signals A1 and A0.

During the fourth to eighth periods, the input hold raw signal HLDDI is set to "1" to set the input hold signal HOLD-DI to "1", fixing the value of the input signal DIj. Therefore, the value of the scan input signal SIDI is not specified.

The scan address input raw signal SIA is set to "0m" during the fourth period. Since the applied scan address input SIAA is transmitted and held as the address signals A1 and A0 in sequential order, the value of the address signal A1 is determined at "0" but the address signal A0 is indefinite. During the fourth period wherein writing to the CAM 100 has not yet been required, the scan write signal SIW is "1". However, as above stated, the initial values of all of the content addressable memory cells Cij are set during the fifth to eighth periods, and thus the value of the scan write signal SIW need not necessarily be specified.

During the fifth period, the scan address input raw signal SIA is set to "0" again. This determines both of the address signals A1 and A0 at "0" which in turn are decoded by a decoder DCDR to select one word line WLj. For the purpose of simplicity, description will be given assuming that word lines WL0, WL1, WL2, WL3 are selected in corresponding relation to the address signal pair A1 and A0 which are (0, 0), (0, 1), (1, 0), (1, 1), respectively. However, other corresponding relations may be set depending upon decoding techniques of the decoder DCDR as will be described later.

During the fifth to eighth periods, the word lines WL0, WL2, WL3, WL1 are sequentially selected, and the scan write signal SIW is set to "0" to set the write raw signal WECD to "0". Then the write enable signal WE becomes "1" to start the write operation. The state obtained in this manner corresponds to "STATE-A-0" shown in FIG. 10.

Preparations for the step 804 are made during ninth to eleventh periods. After the processing of the memory cells in the column at the last address in the step 806, the flow proceeds via the step 807 to the step 809. The input signal DIj must be updated during a particular period of the clock signal T, whether the processing in the step 804 may be executed after the step 810 or the processing in the step 812 may be executed after the step 811.

The circuit of FIG. 40 is designed to update the input signal DIj after the processing in the step 806 is executed on the memory cells in the column at the last address as will be described in detail later. In other words, the input signal DIj is not updated unless the memory cells in the column at the last address are written. Thus, to execute the step 804 for the first time, a dummy write operation must be performed on the memory cells in the column at the last address.

The column number is set to the last address during the ninth and tenth periods, and the write operation is performed in the eleventh period. During the ninth to eleventh periods, the input hold raw signal HLDDI is set to "1" to fix the value of the input signal DIj. Thus, the value of the scan input signal SIDI is not specified.

The last address is set to the address signals A1 and A0 for the above described purpose during the ninth and tenth periods. The address hold signal HOLD-A is "0" and the scan address input signal SIA permits the update of the values of the address signals A1 and A0 during the ninth and tenth periods. During the ninth and tenth periods, the scan address input signal SIA is set to "1" to change the values of the address signals A1 and A0 which have been "0" and "1" during the eighth period, respectively, to "1".

Since the content addressable memory cell Cij of the CAM 100 has already been initialized, the scan write signal SIW is set to "1" to set the write raw signal WECD to "1" and to set the write enable signal WE to "0", thereby inhibiting write operation executed on the content addressable memory cell Cij. However, all of the input signals DIj are "0" during the ninth and tenth periods, as during the fifth to eighth periods. If write operation is performed, the content stored in the content addressable memory cell Cij is not changed. Thus, the write operation need not necessarily be inhibited.

During the eleventh period, the address hold raw signal HLDA is set to "1", and the address signals A1 and A0 which have been set to "1" are held. Therefore, the value of the scan address input signal SIA is not specified. The scan write signal SIW is set to "0", and the scan flip-flop SFFW stores the value "0" therein.

The CAM test is executed during twelfth to forty-second periods over which the test signal CAMTEST is "1". It is hence unnecessary to specify the values of the scan input signal SIDI, scan write signal SIW, input hold raw signal HLDDI, and address hold raw signal HLDA applied to the 0-inputs of the selectors SEL1 to SEL4 controlled by the test signal CAMTEST. Further, the address counter CNTR exhibits its counting function in response to the test signal CAMTEST set to "1", and thus the value of the scan address input signal SIA is not specified.

Since the value "0" has been applied to the 1-input of the selector SEL4 during the eleventh period, the address hold signal HOLD-A becomes "0" when the clock signal T makes a transition which starts the twelfth period, permitting the counting of the address counter CNTR. The values of the address signals A1 and A0 are updated from (1, 1) to (0, 0). However, writing to the content addressable memory cells C00, C01, C02 is inhibited during the twelfth period to prevent the write operation from being complicated with the update of the input signal DIj. The last address detection signal LA sets the write raw signal WECD to "1" through the selectors SEL2 and SEL6, setting the write enable signal WE to "0".

The inverter INV1 inverts the value of the input signal DI2 which has been "0" during the eleventh period to apply the value "1" to the scan input SI of the scan flip-flop SFF-DI0 through the selectors SEL1 and SEL8. Since the last address detection signal LA inverted to "0" has been applied to the 1-input of the selector SEL3 during the eleventh period, the input hold signal HOLD-DI becomes "0" when the test signal CAMTEST becomes "1", and the content stored in the scan flip-flop SFF-DIj is permitted to change. As shown in FIG. 41, the value of the test signal CAMTEST is determined prior to the transition of the clock signal T. Thus, the content stored in the scan flip-flop SFF-DIj is updated when the clock signal T makes a transition which starts the twelfth period, that is, before the address signals A1 and A0 are updated from (1, 1) to (0, 0) (this update is performed after the operation of the address counter CNTR in response to the clock signal T). Then, the test pattern is updated from (0, 0, 0) to (1, 0, 0) to achieve the state shown in FIG. 11.

After the address signals A1 and A0 are updated from (1, 1) to (0, 0) in response to the transition of the clock signal T which starts the twelfth period, the last address detection signal LA becomes "0" and the input hold signal HOLD-DI becomes "1", inhibiting changes in content stored in the scan flip-flop SFF-DIj.

Subsequently, during the thirteenth to fifteenth periods, the address signals A1 and A0 are not (1, 1). Then, the last address detection signal LA is "0" and the address hold signal HOLD-A is "0" to permit the address counter CNTR to count. The changes in content stored in the scan flip-flop SFF-DIj continue being inhibited. The address counter CNTR sequentially updates the address signals A1 and A0 to achieve the states shown in FIGS. 12 through 14.

During the sixteenth period, the address signals A1 and A0 are (1, 1), and the test pattern (1, 0, 0) is written to the content addressable memory cells C30, C31, C32 in the third column as shown in FIG. 15. The last address detection signal LA becomes "1" to apply the value "1" to the scan input SI of the scan flip-flop SFFW.

However, the address hold signal HOLD-A is "0" since the write raw signal WECD outputted from the scan flip-flop SFFW when the clock signal T makes a transition which starts the seventeenth period is "0" which has been stored in the scan flip-flop SFFW during the fifteenth period. The address counter CNTR performs counting when the clock signal T makes the transition which starts the seventeenth period, and the address signals A1 and A0 become (0, 0). The value "1" which has been applied to the scan flip-flop during the sixteenth period is applied to the address counter CNTR as the address hold signal HOLD-A through the selector SEL4.

The values of the address signals A1 and A0 are updated to (0, 0) to set the last address detection signal LA to "0" after the address counter CNTR counts in response to the transition of the clock signal T which starts the seventeenth period. The value "0" is applied to the 1-input of the selector SEL3 prior to the transition of the clock signal T which starts the seventeenth period. Then the input hold signal HOLD-DI is "0" to permit the update of the content stored in the scan flip-flop SFF-DIj. The test pattern is updated in response to the transition of the clock signal T which starts the seventeenth period (FIG. 16).

When the clock signal T makes a transition which starts the eighteenth period, the address hold signal HOLD-A is "1", causing no update of the address signals A1 and A0. The test pattern is written to the content addressable memory cell Cij in the zeroth to third columns during the eighteenth to twenty-first periods, respectively (FIGS. 17 through 20).

Similarly, the test pattern is updated during twenty-second, twenty-seventh, thirty-second, and thirty-seventh periods (FIGS. 21, 26, 31, and 36). The test pattern is written to the content addressable memory cell Cij in the zeroth to third columns during twenty-third to twenty sixth periods, twenty-eighth to thirty-first periods, thirty-third to thirty-sixth periods, and thirty-eighth to forty-first periods, respectively (FIGS. 22–25, FIGS. 27–30, FIGS. 32–35, and FIGS. 37–39 and 10).

The flow proceeds from the step 809 to the connector J1 during the twenty-sixth period. The steps 811 to 817 are executed during the twenty-seventh to forty-first periods. The test continued after the forty-first period merely results in the repetition of the state of the twelfth period.

Figure 42:
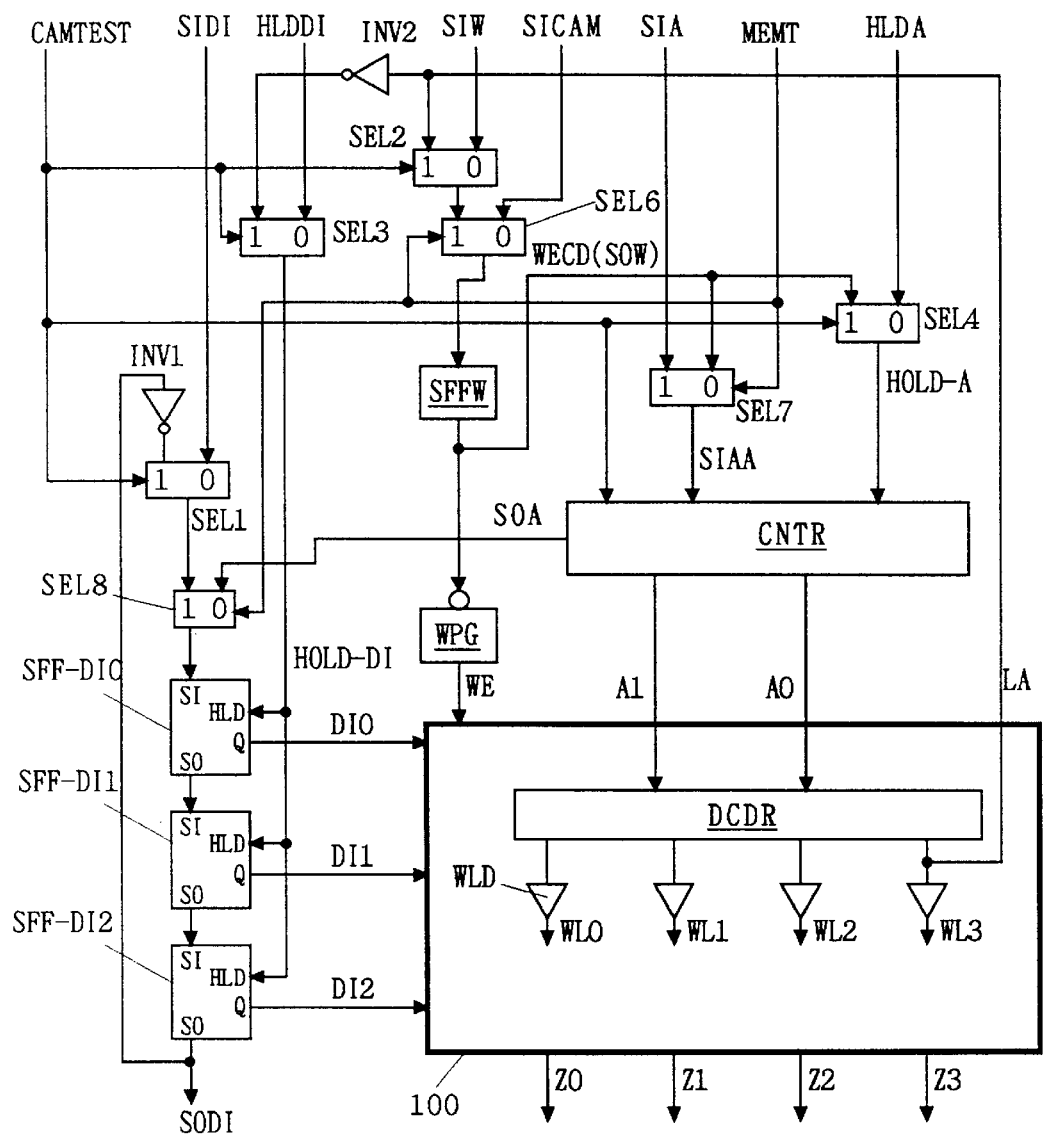
FIGS. 42 through 48 are circuit diagrams of the third preferred embodiment according to the present invention.

FIG. 42 is a circuit diagram of another form of the CAM test circuit for implementing the first technique. In this arrangement, the last address detection signal LA is not provided from the last address detecting circuit LADET but from the value to be applied to the word line WL3 in the column corresponding to the last address, or the third column herein. It is apparent that the circuit of FIG. 42 is similar in operation to the circuit of FIG. 40.

The address counter CNTR may employ a binary counter, a feedback shift register type counter, or a Gray code counter.

Figure 43:
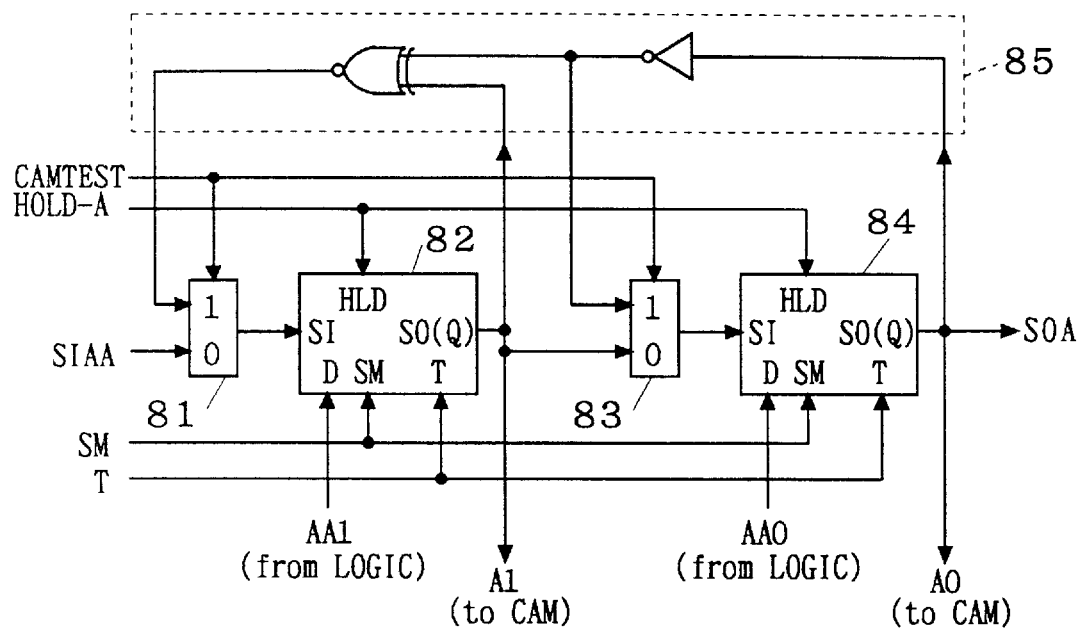

FIG. 43 is a circuit diagram of a binary counter used as the address counter CNTR. Selectors 81 and 83 are controlled by the test signal CAMTEST. When the test signal CAMTEST is "0", the scan address input SIAA is transmitted to scan flip-flops 82, 84 through the selectors 81, 83 in synchronism with the clock signal T. The scan flip-flops 82, 84 may employ the circuit shown in FIG. 7B. When the shift mode signal SM is "0", the scan flip-flops 82, 84 operate as the conventional flip-flops, and input signals AA0 and AA1, for example, may be used as the address signals A0 and A1, respectively.

Figure 44:
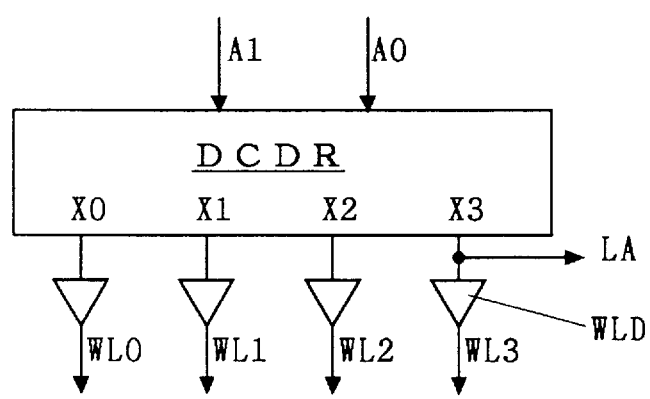

When the test signal CAMTEST is "1", a path is opened from the scan flip-flops 82, 84 to an increment circuit 85 to increment the address in synchronism with the clock signal T. Outputs X0, X1, X2, X3 from the decoder DCDR are sequentially obtained as an address Xi (i=2·A1+A0). Thus, the outputs Xi from the decoder DCDR may be connected to the word line WLi. FIG. 44 illustrates the connection between the decoder DCDR and the word line WLi in such a case.

The last address detection signal LA is provided from the signal to be applied to the word line WL3 in the same manner as in FIG. 42 and is provided from the output X3 when the binary counter shown in FIG. 43 is used as the address counter CNTR. In this arrangement, the last address detection signal LA is not the signal itself applied to the word line WL3 but is provided from the output X3 on one side of the word line driver WLD which is closer to the decoder DCDR for the purpose of insuring the correct last address detection signal LA independently of failures in the word line WL3.

Figure 45:
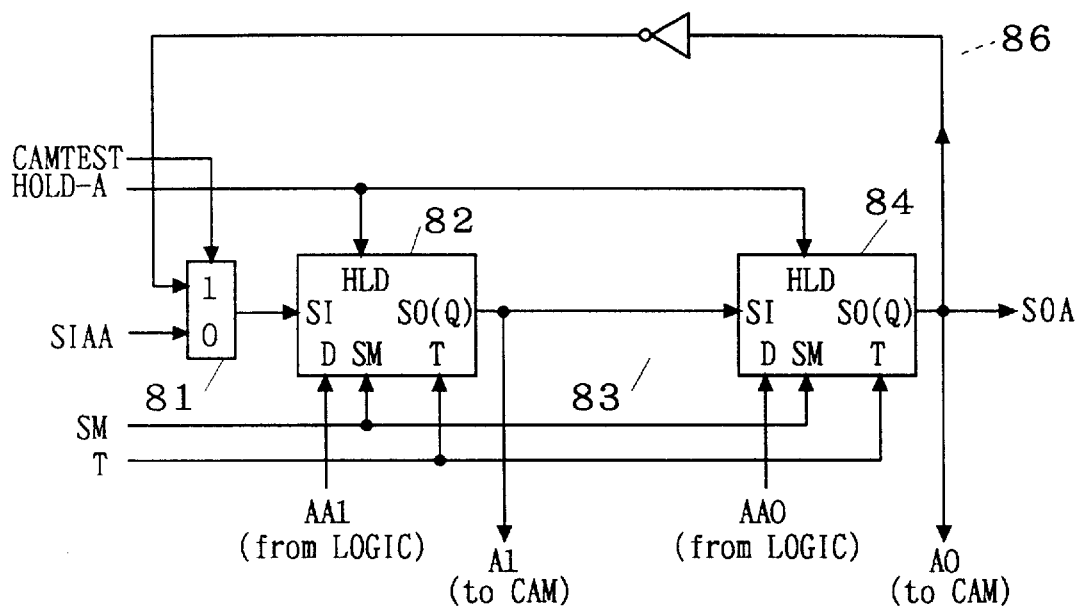

FIG. 45 is a circuit diagram of a 2-bit feed back shift register type counter used as the address counter CNTR. The circuit of FIG. 45 comprises the selector 81, the scan flip-flops 82 and 84, and an increment circuit 86.

When the test signal CAMTEST is "1", a path is opened from the scan flip-flops 82 and 84 to the increment circuit 86 to generate an address in synchronism with the clock signal T. The outputs X0, X2, X3, X1 from the decoder DCDR are alternatively activated in sequential order as the address Xi (i=2·A1+A0). In the first technique, access to the memory cells may start from any column. Thus, the connection between the decoder DCDR and the word line WLi shown in FIG. 44 may be made. However, the connection of FIG. 44 does not meet the requirement if the order of access is from zeroth column to the third column. Sequential activation of adjacent word lines WLi is preferred to form an expected value generator circuit to be described below.

Figure 46:
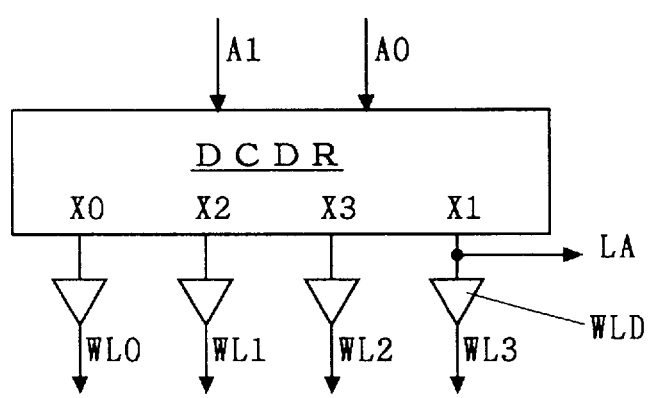

FIG. 46 illustrates the connection between the decoder DCDR and the word line WLi to meet the above requirement. The connection should be made so that the word lines WL0, WL1, WL2, WL3 are driven respectively by the outputs X0, X2, X3, X1 from the decoder DCDR which are alternatively activated in sequential order. In this case, the last address is "1" which corresponds to the third column.

The first technique shown in FIGS. 8 and 9 is applicable not only to the CAM including the memory cells arranged in four columns shown in FIG. 40 but also to a CAM including memory cells arranged in 16 columns, for example, wherein 4-bit address signals A3 A2, A1, A0 are applied to the decoder DCDR.

Figure 47:
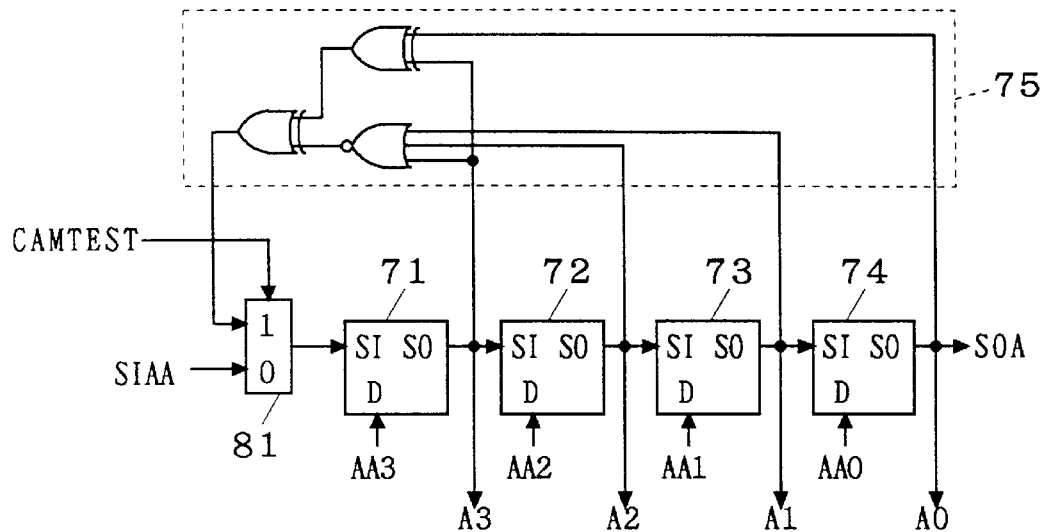

FIG. 47 is a circuit diagram of a feedback shift register type counter for generating the 4-bit address signals A3, A2, A1, A0. The selector 81, scan flip-flops 71, 72, 73, 74, and an increment circuit 75 are connected as shown in FIG. 47. The scan flip-flops 71, 72, 73, 74 may be of the construction shown in FIG. 7B. The selector 81 is controlled by the test signal CAMTEST, and the scan flip-flops 71, 72, 73, 74 and the increment circuit 75 form a loop when the test signal CAMTEST is "1", Outputs X0, X8, X12, X14, X15, X7, X11, X5, X10, X13, X6, X3, X9, X4, X2, X1 (Xk: k=8·A3+4·A2+2·A1+A0) from the decoder DCDR are alternatively activated in sequential order in response to the address signals A3, A2, A1, A0 from the feedback shift register type counter.

Figure 48:
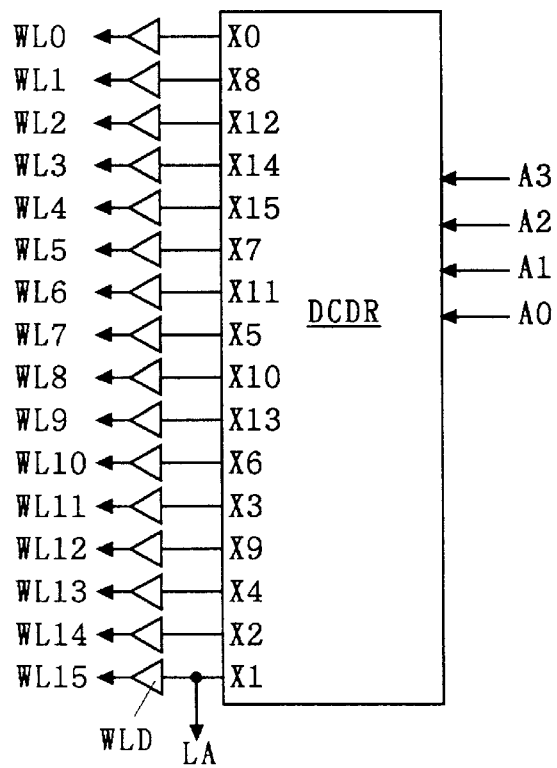

The connection is made between the decoder DCDR and the word line WLi as shown in FIG. 48 to sequentially activate the adjacent word lines WLi also in this case. The connection should be made so that the word lines WL0, WL1, WL2, . . . WL15 are driven by the outputs X0, X8, X12, X14, X15, X7, X11, X5, X10, X13, X6, X3, X9, X4, X2, X1 from the decoder DCDR which are alternatively activated in sequential order. In this case, the last address is "1" which corresponds to the fifteenth column.

(c-1-2) Generation of Expected Value
Fourth Preferred Embodiment

To determine failures from the column coincidence signal Zi provided by the first technique, it is necessary to obtain the value of the column coincidence signal Zi to be provided when the CAM is under normal conditions, that is, an expected value. A technique for providing such an expected value in synchronism with the generation of the column coincidence signal Zi will be discussed in the fourth preferred embodiment. It is assumed that the number of columns n is 4 herein as in the third preferred embodiment.

Table 3 is a logic table showing expected values E0, E1, E2, E3 in the respective states in chronological order. These contents are shown in FIGS. 10 through 39 in the form of the column coincidence signals Z0, Z1, Z2, Z3. The arrow in the table indicates that the states form a loop.

TABLE 3

|  | E0 | E1 | E2 | E3 |
|---|---|---|---|---|
| STATE-A-0 | 1 | 1 | 1 | 1 |
| STATE-A-1 | 0 | 0 | 0 | 0 |
| STATE-A-2 | 1 | 0 | 0 | 0 |
| STATE-A-3 | 1 | 1 | 0 | 0 |
| STATE-A-4 | 1 | 1 | 1 | 0 |
| STATE-A-5 | 1 | 1 | 1 | 1 |
| STATE-A-6 | 0 | 0 | 0 | 0 |
| STATE-A-7 | 1 | 0 | 0 | 0 |
| STATE-A-8 | 1 | 1 | 0 | 0 |
| STATE-A-9 | 1 | 1 | 1 | 0 |
| STATE-A-10 | 1 | 1 | 1 | 1 |
| STATE-A-11 | 0 | 0 | 0 | 0 |
| STATE-A-12 | 1 | 0 | 0 | 0 |
| STATE-A-13 | 1 | 1 | 0 | 0 |
| STATE-A-14 | 1 | 1 | 1 | 0 |
| STATE-A-15 | 1 | 1 | 1 | 1 |
| STATE-A-16 | 0 | 0 | 0 | 0 |
| STATE-A-17 | 1 | 0 | 0 | 0 |
| STATE-A-18 | 1 | 1 | 0 | 0 |
| STATE-A-19 | 1 | 1 | 1 | 0 |
| STATE-A-20 | 1 | 1 | 1 | 1 |
| STATE-A-21 | 0 | 0 | 0 | 0 |
| STATE-A-22 | 1 | 0 | 0 | 0 |
| STATE-A-23 | 1 | 1 | 0 | 0 |
| STATE-A-24 | 1 | 1 | 1 | 0 |
| STATE-A-25 | 1 | 1 | 1 | 1 |
| STATE-A-26 | 0 | 0 | 0 | 0 |
| STATE-A-27 | 1 | 0 | 0 | 0 |
| STATE-A-28 | 1 | 1 | 0 | 0 |
| STATE-A-29 | 1 | 1 | 1 | 0 |

Figure 49:
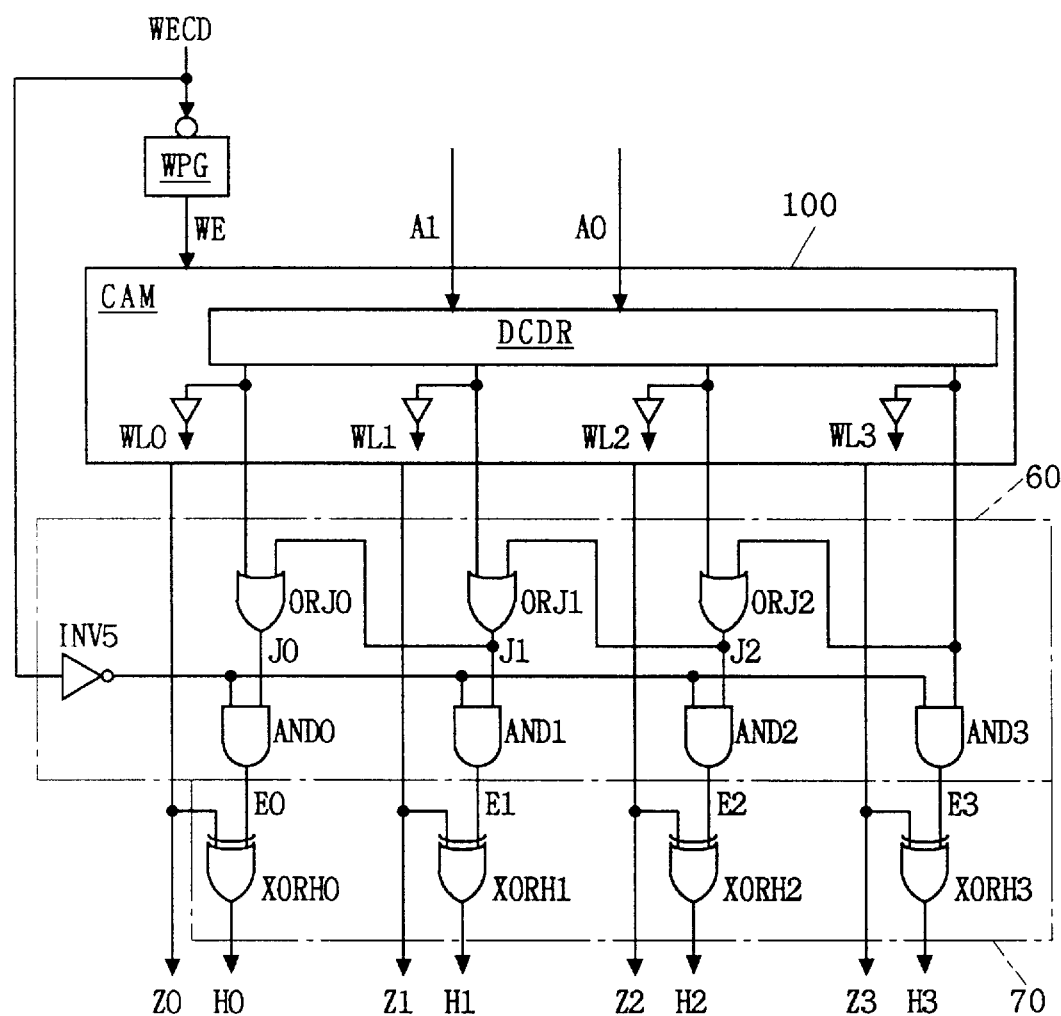
FIGS. 49 and 50 are circuit diagrams of a fourth preferred embodiment according to the present invention.

FIG. 49 illustrates an expected value generator circuit 60 for generating the expected values E0, E1, E2, E3. Also shown in FIG. 49 are the write pulse generator WPG shown in FIG. 40, the write raw signal WECD to be applied to the write pulse generator WPG, and a comparator circuit 70 for comparing the expected values E0, E1, E2, E3 with the column coincidence signals Z0, Z1, Z2, Z3.

The expected value generator circuit 60 comprises an inverter INV5, OR circuits ORJ0, ORJ1, ORJ2, and AND circuits AND0, AND1, AND2, AND3. First inputs of the OR circuits ORJ0, ORJ1, ORJ2 receive the outputs from the decoder DCDR for driving the word lines WL0, WL1, WL2, respectively. For example, if the circuit shown in FIG. 43 is used as the address counter CNTR, the outputs X0, X1, X2 are applied to the first inputs of the OR circuits ORJ0, ORJ1, ORJ2, respectively.

However, the word lines WL0, WL1, WL2, WL3 are preferably alternatively activated in this sequential order in terms of the construction of the expected value generator circuit 60. Thus, if the circuit of FIG. 45 is used as the address counter CNTR, the outputs X0, X2, X3 are applied to the first inputs of the OR circuits ORJ0, ORJ1, ORJ2, respectively. Although the description will be given assuming that the circuit of FIG. 43 is used as the address counter CNTR for simplicity, the connection of the word line WLi should be suitably established when the circuit of FIG. 45 is used as the address counter CNTR.

Second inputs of the OR circuits ORJ0, ORJ1, ORJ2 receive the output J1 from the OR circuit ORJ1, the output J2 from the OR circuit ORJ2, and the output X3 (generally the output for driving the word line WL3; but X1 when the circuit of FIG. 45 is used as the address counter CNTR), respectively.

The output from the inverter INV5 is applied to a first input of each of the AND circuits AND0, AND1, AND2, AND3. The write raw signal WECD is applied to the input of the inverter INV5. Second inputs of the AND circuits AND0, AND1, AND2, AND3 receive the output J0 from the OR circuit ORJ0, the output J1 from the OR circuit ORJ1, the output J2 from the OR circuit ORJ2, and the output X3, respectively. The AND circuits AND0, AND1, AND2, AND3 output the expected values E0, E1, E2, E3, respectively.

During write cycles, the write raw signal WECD is "0" and the expected values E0, E1, E2, E3 are J0, J1, J2, X3, respectively. Thus, Ep (i≧p)=1 and Eq (i<q)=0 when the word line WLi is active.

During non-write cycles, the write raw signal WECD is "1" and all of the expected values E0, E1, E2, E3 are "0" independently of the activation of any word line WLi.

In this manner, the expected values E0, E1, E2, E3 shown in Table 3 may be automatically generated.

The comparator circuit 70 comprises exclusive-OR circuits XORH0, XORH1, XORH2, XORH3. The exclusive-OR circuit XORHi compares the column coincidence signal Zi with the expected value Ei to output a determination signal Hi which is "1"/"0" corresponding to mismatch/match.

The comparator circuit 70 may include a comparator means comprised of the NMOS transistors N3, N4, N5, N6 and the resistor Ri as shown in FIGS. 4 and 5 without using the exclusive-OR circuits.

Figure 50:
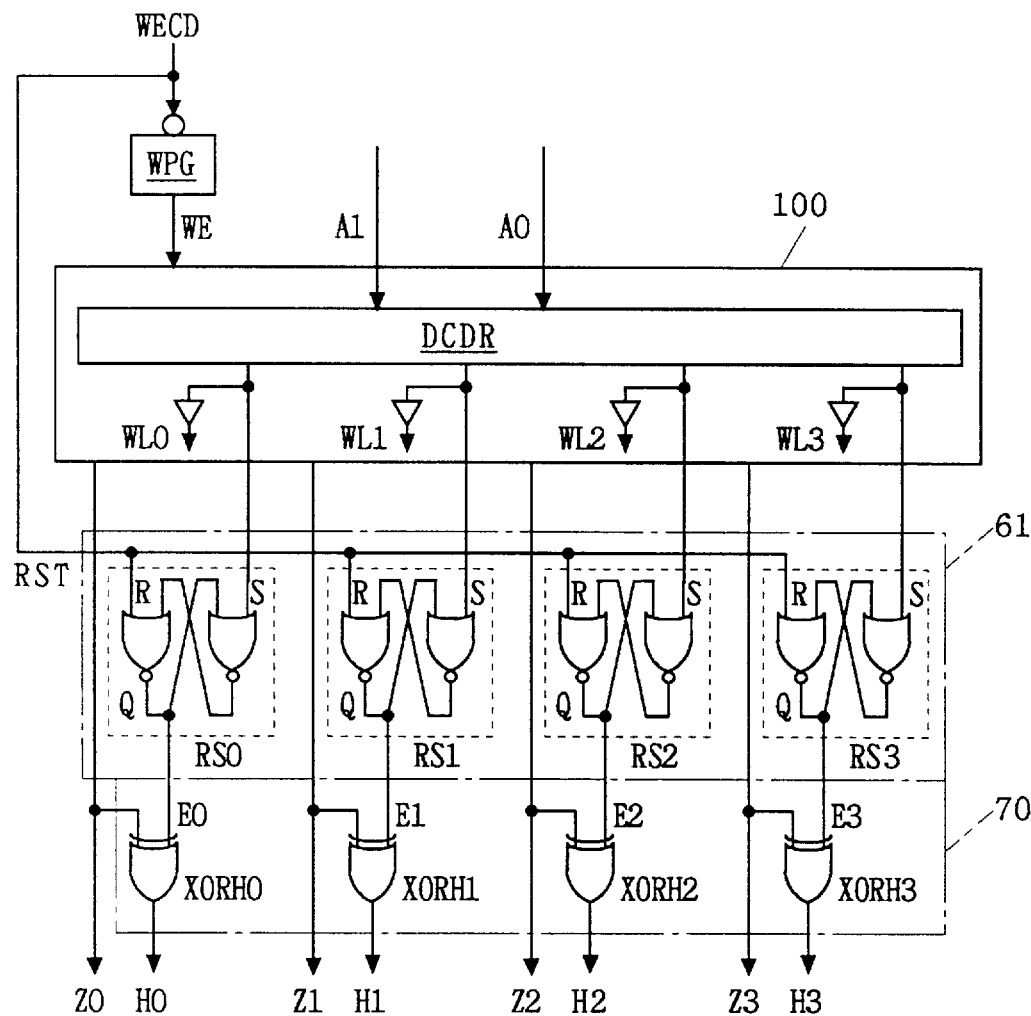

FIG. 50 illustrates another expected value generator circuit 61 for generating the expected values E0, E1, E2, E3. The expected value generator circuit 61 comprises an RS flip-flop RSi having a set terminal S receiving the output Xi (the connection between the output Xi and word line WLi is changed as shown in FIG. 46 if the circuit of FIG. 45 is used as the address counter CNTR as described above), and a reset terminal R receiving the write raw signal WECD as a reset signal RST. The expected value Ei is provided as a Q output from the RS flip-flop RSi.

During the write cycles, the write raw signal WECD is "0", and all of the RS flip-flops are not reset. Then, the expected value Ei outputted from the RS flip-flop RSi matches the decoder output Xi. This state is held until the non-write cycles are reached to set the write raw signal WECD to "1". Setting the write raw signal WECD to "1" causes all of the RS flip-flops RSi to be reset.

For example, when the word lines WL0, WL1, WL2, WL3 are selected in this sequential order, a set of expected values E0, E1, E2, E3 change as follows: (1, 0, 0, 0)→(1, 1, 0, 0)→(1, 1, 1, 0)→(1, 1, 1, 1). The expected value Ei indicated in Table 3 is automatically generated.

(c-2) Second Technique
Fifth Preferred Embodiment

The first technique is advantageous in that all memory cells can be checked for failures in Cases 1 to 4. Other variations of the CAM test technique are applicable.

Figure 51:
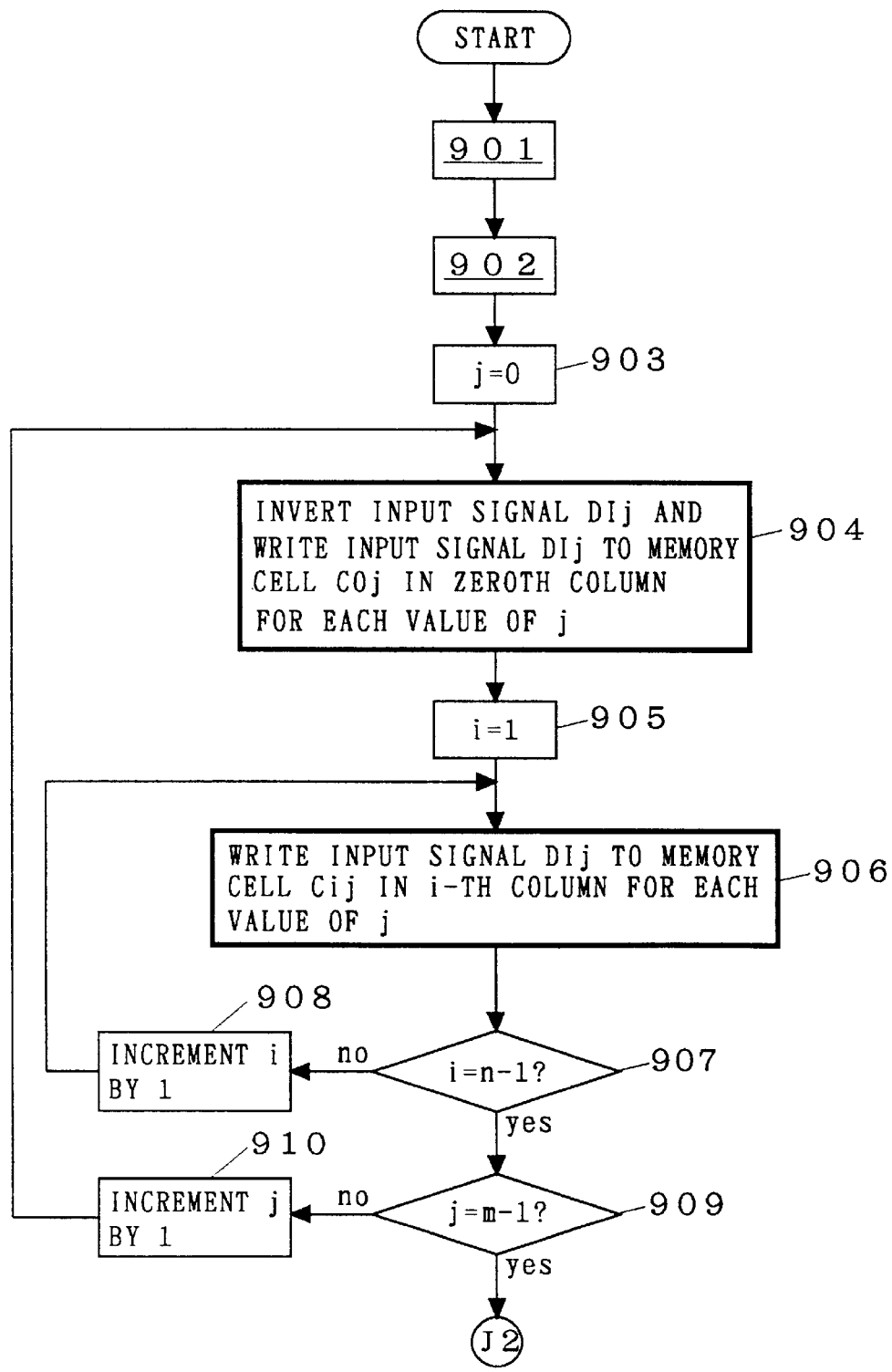
FIGS. 51 and 52 together are a flow chart of a fifth preferred embodiment according to the present invention.
Figure 52:
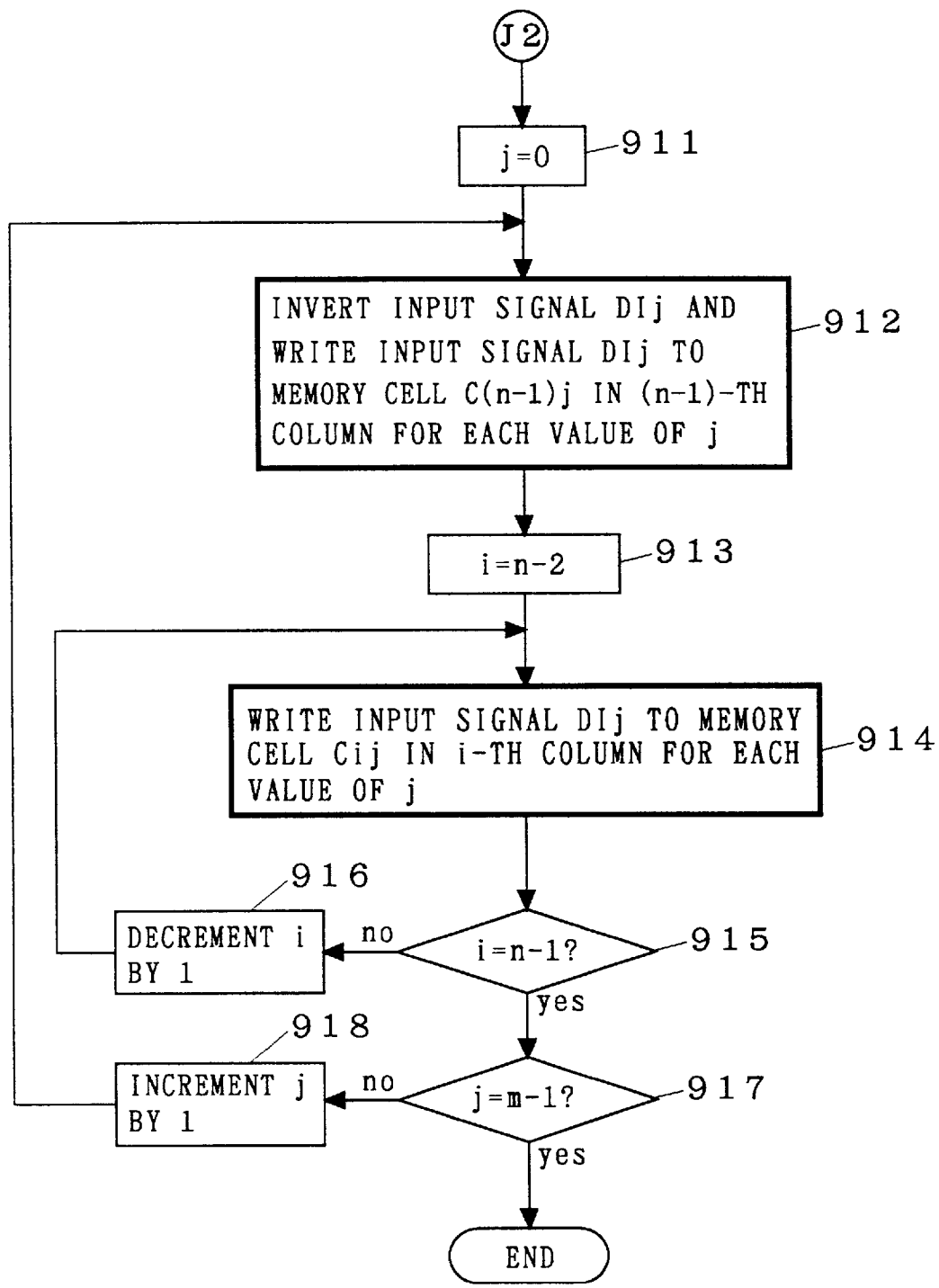

FIGS. 51 and 52 are a flow chart of the second technique according to the present invention, and provide a continuous flow using a connector J2.

FIGS. 53 through 76 conceptually illustrate, in chronological order, the contents stored in the scan flip-flop SFF-DIj (input signal DIj) and in the content addressable memory cell Cij (i=0, 1, 2, 3; j=0, 1, 2) of the CAM 100 which are subjected to the second technique. The sequential states "STATE-B-p" (p=0 to 29) are shown in FIGS. 53 through 76. In these figures, values are depicted in the same manner as in FIGS. 10 through 39.

Figure 53:
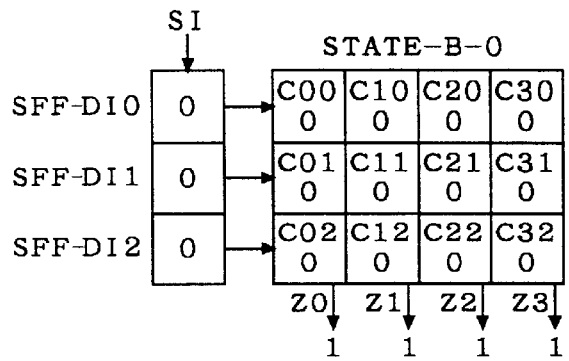

The processing in the steps 901, 902, 903 is identical with that in the steps 801, 802, 803 in the first technique, respectively. Specifically, the initial value of all of the input signals DIj is set to "0", and the initial value of the content stored in the content addressable memory cell Cij for each value of i and j is set to "0". FIG. 53 shows a state of data after the execution of the steps 901 and 902. In the step 903, the value j is set to "0" which is initialization for processing the scan flip-flop SFF-DIj.

The input signal DIj is inverted in the step 904. As above described, this inversion corresponds to the feedback by the inverter INV1 shown in FIG. 3. Thus, the execution of the step 904 on the data of FIG. 53 is equivalent to shift-in of the value "1".

Figure 54:
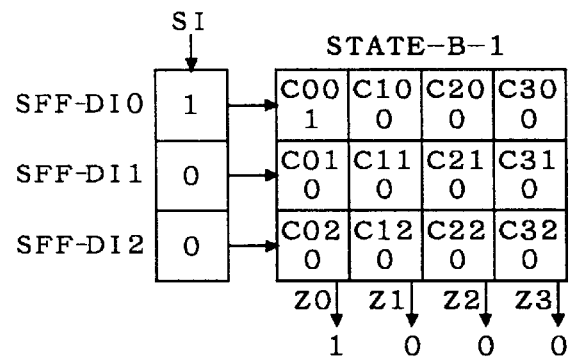

Unlike the first technique, the second technique also writes the input signal DIj to the content addressable memory cell C0j in the zeroth column in the step 904. In the steps 904, 906, 912, 914 indicated by thick blocks in FIGS. 51 and 52, as in FIGS. 8 and 9, the column coincidence signal Zi determined by the execution of the step is also tested. FIG. 54 shows a state of data after the execution of the step 904.

Figure 55:
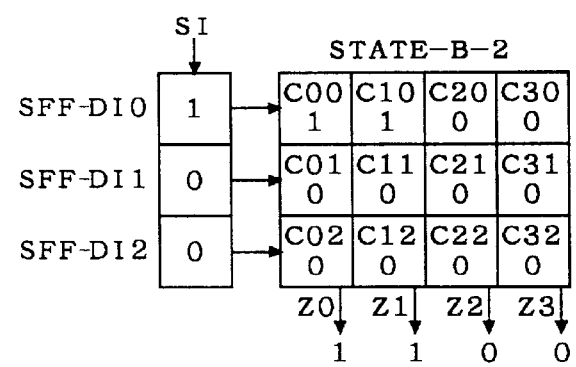
Figure 56:
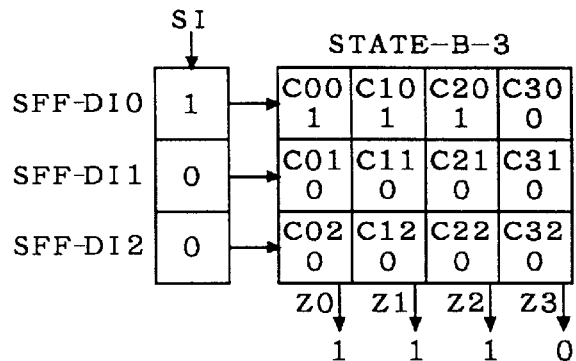
Figure 57:
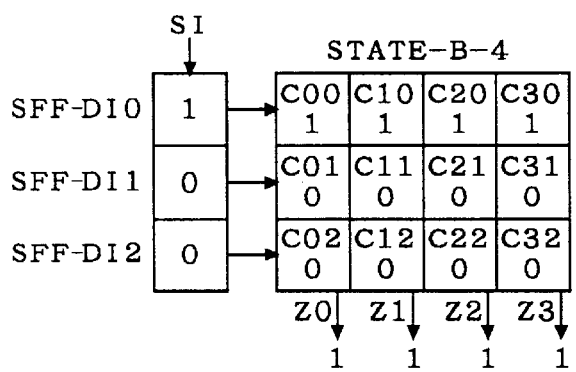

Then, the value i is set to "1" (or the value of the column number i is incremented by 1) in the step 905, and the flow proceeds to the step 906. The processing in the steps 906 to 908 is identical with that in the steps 806 to 808 of the first technique. Specifically, a fixed test pattern DIj is sequentially written to the memory cells in the first to third columns to provide the column coincidence signal Zi. FIGS. 55 through 57 show states of data similar to those of FIGS. 13 through 15.

If a determination is made in the step 907 that the fixed test pattern DIj has been written to the memory cells in the last column, the flow proceeds to the step 909.

In the step 909, a determination is made as to whether DI(m−1) (DI2 herein) in the last row has been a subject to be updated. If the result of determination is "No", the column number i is incremented by 1 in the step 910, and the flow returns to the step 904.

Figure 58:
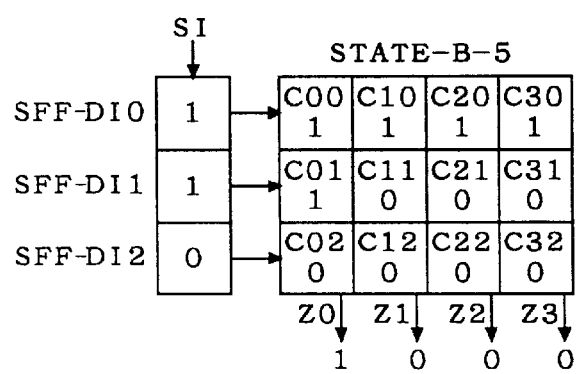
Figure 59:
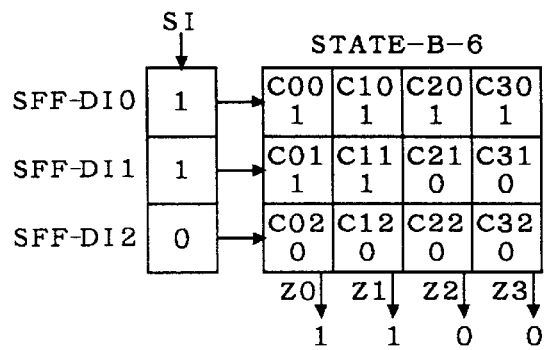
Figure 60:
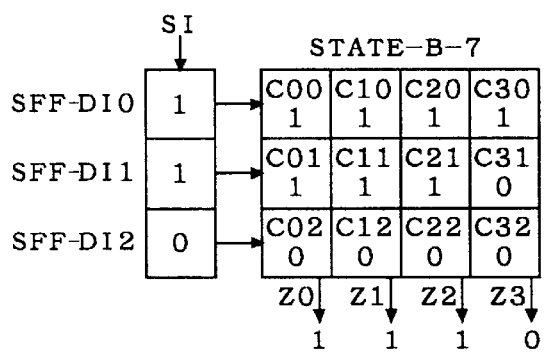
Figure 61:
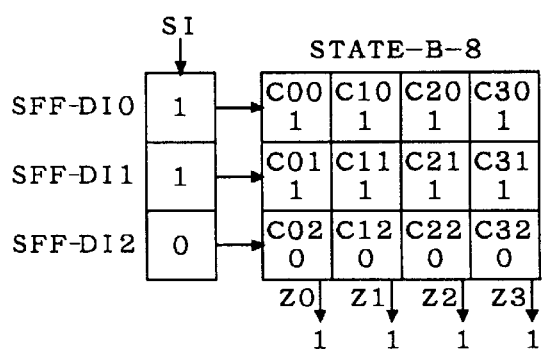
Figure 65:
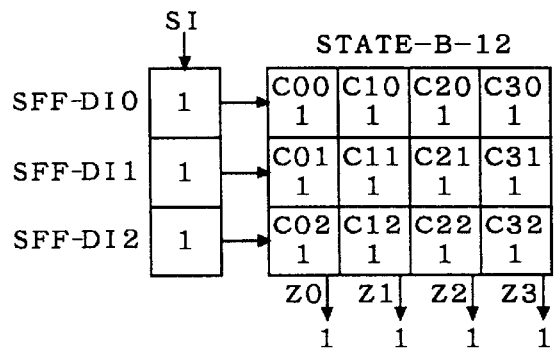
Figure 66:
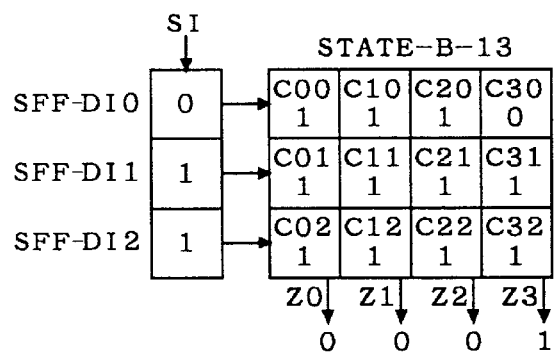
Figure 67:
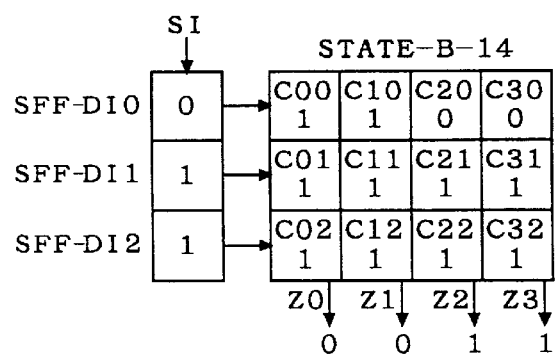
Figure 68:
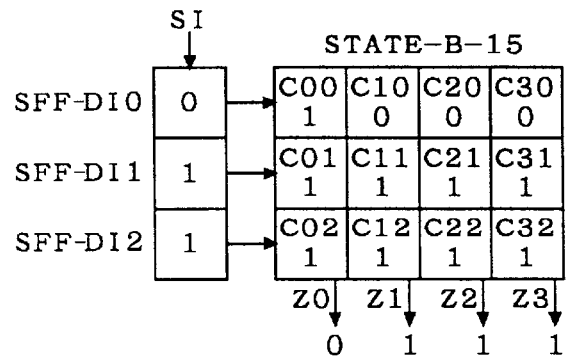
Figure 69:
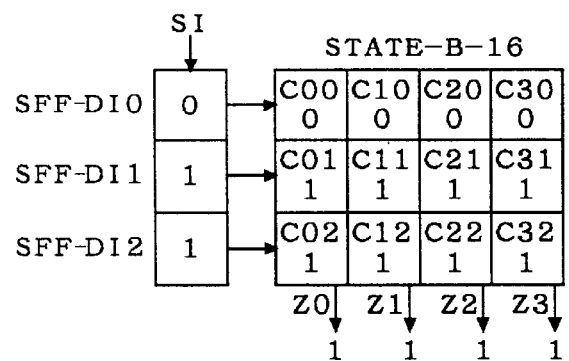
Figure 70:
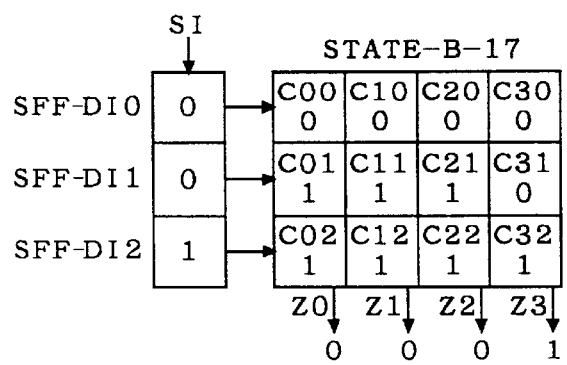
Figure 71:
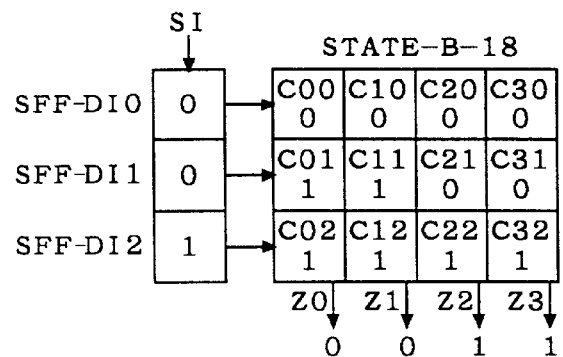
Figure 72:
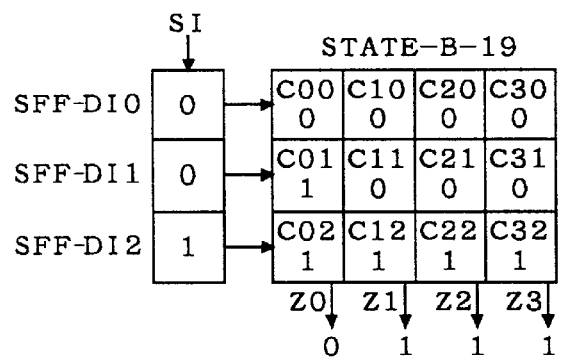
Figure 73:
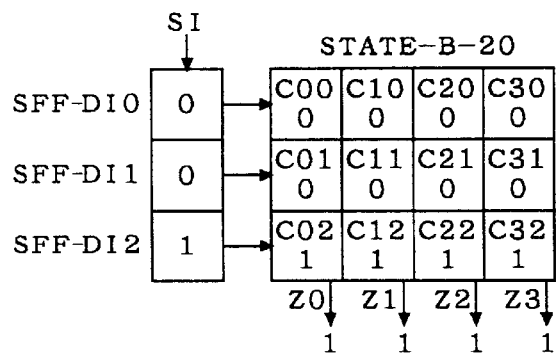
Figure 74:
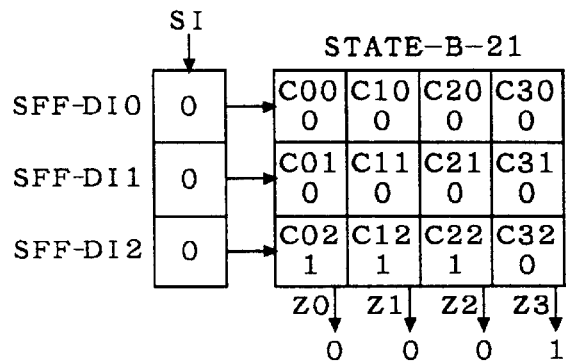
Figure 75:
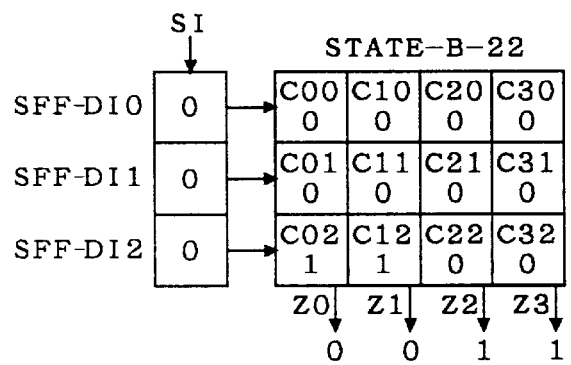
Figure 76:
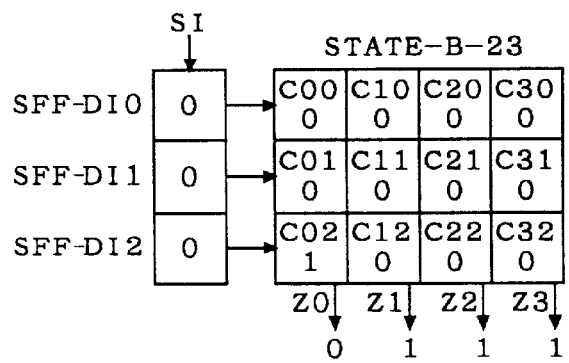

The execution of the step 904 provides states of data shown in FIGS. 58 and 62. The execution of the step 906 provides states of data shown in FIGS. 59 through 61 and FIGS. 63 through 65. The states shown in FIGS. 59 through 61 and FIGS. 63 through 65 are identical with those shown in FIGS. 18 through 20 and FIGS. 23 through 25, respectively.

When the step 904 is executed, update of the input signal DIj and writing to the content addressable memory cell C0j are performed during the same clock cycle, and the column coincidence signal Z0 is necessarily "1". Therefore, the memory cells in the zeroth column are checked in Cases 2 and 4 but are not checked in Cases 1 and 3. The memory cells in the first to third columns are checked in Cases 1 and 2.

In the steps 911 to 918, a fixed test pattern DIj is sequentially written to the memory cells in the third to zeroth columns. First, in the step 911, the value j is set to "0" which is initialization for processing the scan flip-flop SFF-DIj. The test pattern (the set of DIj) at this time is (1, 1, 1).

Then, in the step 912, the test pattern is updated, and the updated test pattern is written to the memory cells in the last column (i=n−1; 3 herein). The execution of the step 912 provides states of data shown in FIGS. 66, 70, 74.

In the step 913, the value i is set to (n−2) (the value of the column number i is decremented by 1), and the flow proceeds to the step 914. The processing in the step 914 is identical with that in the step 906. Specifically, a fixed test pattern DIj is sequentially written to the memory cells in the selected column to provide the column coincidence signal Zi. The order of selection of the columns in the steps 915, 916 is reverse to that in the steps 906 to 908. The execution of the step 914 provides states of data shown in FIGS. 67 through 69, FIGS. 71 through 73, FIGS. 75 and 76, and FIG. 53.

In the steps 911 to 918, update of the input signal DIj and writing to the content addressable memory cell C3j are performed during the same clock cycle, and the column coincidence signal Z3 is necessarily "1". Therefore, the memory cells in the third column are checked in Cases 2 and 4 but are not checked in Cases 1 and 3. However, the memory cells in the zeroth to second columns are checked in Cases 3 and 4. In the steps 903 to 910, the memory cells in the third column are checked in Cases 1 and 2.

In this manner, the second technique updates the test pattern and writes the memory cells, requiring less clock cycles than the first technique for failure check. However, the memory cells in the zeroth column are not checked in Case 1 and the memory cells in the third column are not checked in Case 4.

For check in such cases, it is necessary to set the initial value in the steps 901 and 902 to "1" or to change the order of the columns of the memory cells written while the test pattern is updated, and to repeat the processing shown in FIGS. 51 and 52.

(c-2-1) Circuit for Implementing Second Technique

The circuit shown in FIGS. 1 and 2 showing the precursory concepts of the present invention may be subjected to the second technique shown in FIGS. 51 and 52 by the shift-in of the scan input signal SIDI forming a suitable test pattern. However, the value of the input signal DIj must be held when written to the CAM 100, and it is hence preferred to use the scan flip-flops with a hold function shown in FIG. 7. If not so, the clock signal T must be suitably controlled for the hold operation.

A circuit for automatically producing a suitable test pattern to implement the second technique is described below.

Sixth Preferred Embodiment

Figure 77:
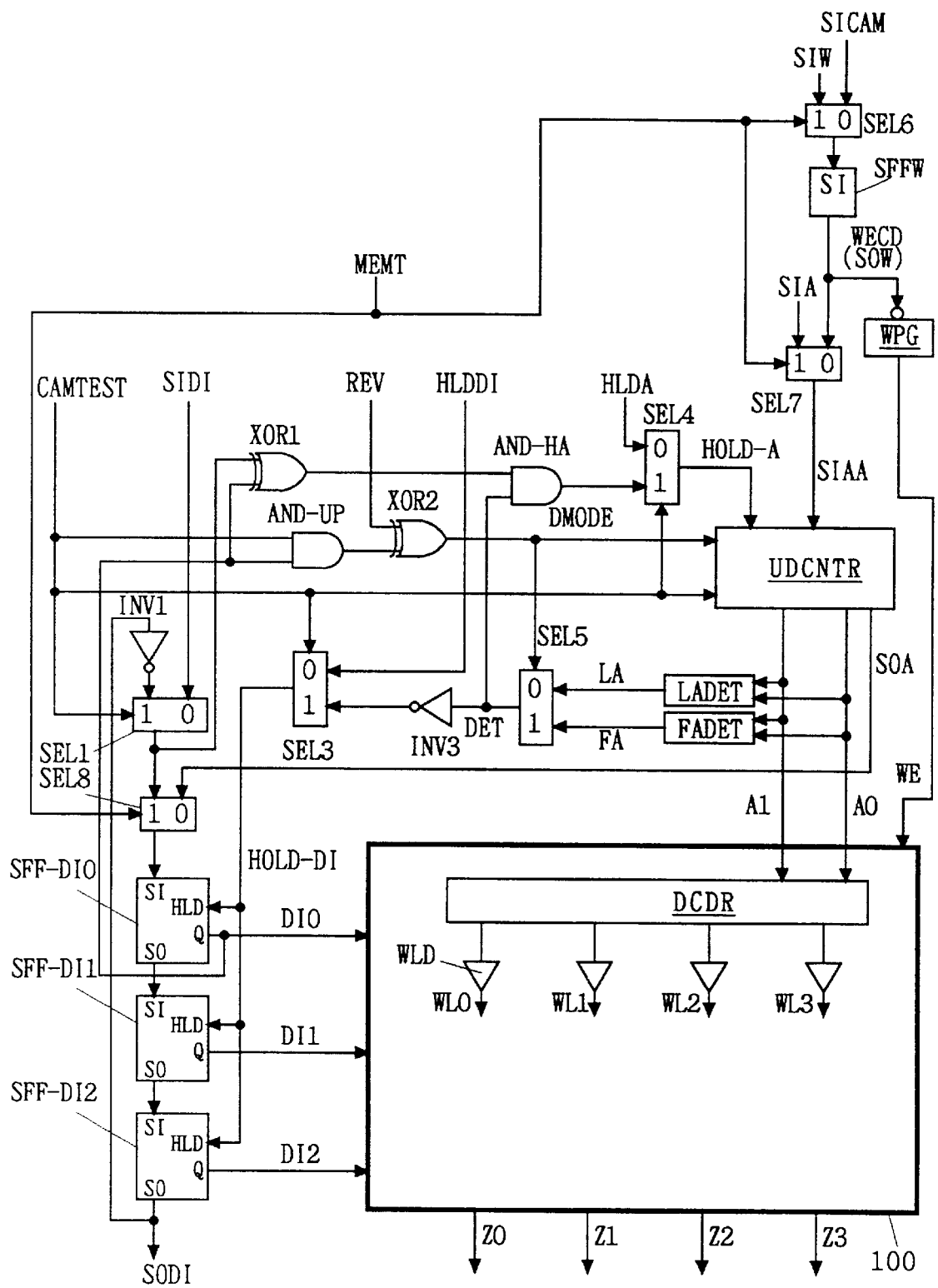
FIGS. 77 through 84 are circuit diagrams of a sixth preferred embodiment according to the present invention.

FIG. 77 is a circuit diagram of a CAM test circuit for implementing the second technique. The CAM 100 to be tested is illustrated in FIG. 77 such that the number of bits (the number of rows) m of the input signal is 3 and the number of columns n is 4. Similar to the circuit of FIG. 40, this circuit is shown with portions which are not directly related to the test of the CAM 100 dispensed with.

The address signals A0 and A1 are generated by an address counter UDCNTR which counts up and down at least during the CAM test. The address counter UDCNTR receives a down signal DMODE and counts up/down in response to the down signal DMODE that is "0/1". The address hold signal HOLD-A causes the address counter UDCNTR to hold its value during counting independently of transition of the clock signal T not shown. The selector SEL4 selects the address hold raw signal HLDA or the output from an AND circuit AND-HA for use as the address hold signal HOLD-A.

The address counter UDCNTR illustrated may update its value in response to the scan address input SIAA. The scan address input raw signal SIA or the write raw signal WECD is selected by the selector SEL7 and used as the scan address input SIAA.

The last address detecting circuit LADET and a first address detecting circuit FADET receive the address signals A0, A1. The last address detection signal LA is "1" when the algorithmic last address is detected, and a first address detection signal FA is "1" when the algorithmic first address is detected. For example, the last address is specified as A0=A1=1, and the first address as A0=A1=0.

The write enable signal WE is generated by the write pulse generator WPG and makes a transition in synchronism with the clock signal T when the write raw signal WECD outputted from the scan flip-flop SFFW is "L".

The scan write signal SIW or the unified scan input SICAM is applied to the scan flip-flop SFFW through the selector SEL6.

The scan output SO of the scan flip-flop SFF-DI0 is connected to the and scan input SI of the scan flip-flop SFF-DI1, and the scan output SO of the scan flip-flop SFF-DI1 is connected to the scan input SI of the scan flip-flop SFF-DI2, as in the circuit of FIG. 40. The scan output SO of the scan flip-flop SFF-DI2 is connected to the input of the inverter INV1, and the scan input SI of the scan flip-flop SFF-DI0 is connected to the output of the inverter INV1 through the selectors SEL1 and SEL8.

The input hold signal HOLD-DI is applied to the terminal HLD of each scan flip-flop SFF-DIj. The scan flip-flop SFF-DIj holds its content independently of transition of the clock signal T when the input hold signal HOLD-DI is "1".

The input hold raw signal HLDDI or the inverted version of a specific address detection signal DET is selected by the selector SEL3 and used as the input hold signal HOLD-DI. An inverter INV3 inverts the specific address detection signal DET.

The specific address detection signal DET is outputted from a selector SEL5 having a 0-input receiving the last address detection signal LA and a 1-input receiving the first address detection signal FA.

The selectors SEL1, SEL3, SEL4 are controlled by the test signal CAMTEST, and the selector SEL5 is controlled by the down signal DMODE. The selectors SEL6 to SEL8 are controlled by the scan path control signal MEMT.

Exclusive-OR circuits XOR1, XOR2 and an AND circuit AND-UP produce the down signal DMODE in response to the test signal CAMTEST, the input signal DI0, the output from the selector SEL1, and a reverse signal REV.

The exclusive-OR circuit XOR1 receives the input signal DI0 and the output from the selector SEL1 to apply the exclusive OR of the input signal DI0 and the output from the selector SEL1 to a first input of the AND circuit AND-HA.

The AND circuit AND-HA has a second input receiving the specific address detection signal DET and applies the AND of the output from the exclusive-OR circuit XOR1 and the specific address detection signal DET to the 1-input of the selector SEL4.

The AND circuit AND-UP receives the test signal CAMTEST and the input signal DI0 and applies the AND of the test signal CAMTEST and the input signal DI0 to a first input of the exclusive-OR circuit XOR2.

The exclusive-OR circuit XOR2 has a second input receiving the reverse signal REV. The output from the exclusive-OR circuit XOR2 serving as the down signal DMODE is applied to the selector SEL5 and the address counter UDCNTR.

The reverse signal REV determines whether incrementing or decrementing process of the column number is to be performed first in the second technique. It is assumed that the reverse signal REV is "1" in the following description. When the reverse signal REV is "0", the decrementing process of the column number precedes the incrementing process of the column number.

Table 4 is a logic table of the signals for illustrating the circuit operation of FIG. 77 for each period of the clock signal T. The data output DOj and column coincidence signal Zi shown in FIG. 4 are also illustrated in Table 4.

TABLE 4

| period | CAMTEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 0 | x | x | x | x | x | x | x | x | x | x | x | x | x | x | x | x | x | x | x | x | x |
|   |   |   |   |   |   |   |   | shift in 0 to DI |   |   |   |   |   |   |   |   |   |   |   |   |   |
| 1 | 0 | 0 | x | 1 | 0 | 0 | x | x | x | x | 0 | x | x | 1 | x | x | x | x | x | x | x |
| 2 | 0 | 0 | x | 1 | 0 | 0 | x | x | x | x | 0 | 0 | x | 1 | x | x | x | x | x | x | x |
| 3 | 0 | 0 | x | 1 | 0 | 0 | x | x | x | x | 0 | 0 | 0 | 1 | x | x | x | x | x | x | x |
|   |   |   |   |   |   |   |   | write 0 for all address |   |   |   |   |   |   |   |   |   |   |   |   |   |
| 4 | 0 | x | 0 | 1 | 1 | 1 | 0 | 0 | 0 | x | 0 | 0 | 0 | 1 | x | x | x | x | x | x | x |
| 5 | 0 | x | 0 | 0 | 1 | 1 | 0 | 0 | 0 | 0 | 0 | 0 | 0 | 0 | 1 | x | x | x | 0 | 0 | 0 |
| 6 | 0 | x | 1 | 0 | 1 | 1 | 0 | 0 | 1 | 0 | 0 | 0 | 0 | 0 | 1 | x | 1 | x | 0 | 0 | 0 |
| 7 | 0 | x | 1 | 0 | 1 | 1 | 0 | 0 | 1 | 1 | 0 | 0 | 0 | 0 | 1 | x | 1 | 1 | 0 | 0 | 0 |
| 8 | 0 | x | 0 | 0 | 1 | 1 | 0 | 0 | 0 | 1 | 0 | 0 | 0 | 0 | 1 | 1 | 1 | 1 | 0 | 0 | 0 |
|   |   |   |   |   |   |   |   | shift in address=1 |   |   |   |   |   |   |   |   |   |   |   |   |   |
| 9 | 0 | x | 1 | 1 | 1 | 1 | 0 | 0 | 1 | 0 | 0 | 0 | 0 | 1 | 1 | 1 | 1 | 1 | 0 | 0 | 0 |
| 10 | 0 | x | 0 | 1 | 1 | 1 | 0 | 0 | 0 | 1 | 0 | 0 | 0 | 1 | 1 | 1 | 1 | 1 | 0 | 0 | 0 |
|   |   |   |   |   |   |   |   | run CAM BIST |   |   |   |   |   |   |   |   |   |   |   |   |   |
| 11 | 1 | x | x | 0 | x | 0 | x | 1 | 0 | 0 | 0 | 0 | 0 | 0 | 1 | 1 | 1 | 1 | 0 | 0 | 0 |
| 12 | 1 | x | x | 0 | x | 1 | x | 0 | 0 | 0 | 1 | 0 | 0 | 0 | 1 | 0 | 0 | 0 | 1 | 0 | 0 |
| 13 | 1 | x | x | 0 | x | 1 | x | 0 | 0 | 1 | 1 | 0 | 0 | 0 | 1 | 1 | 0 | 0 | 1 | 0 | 0 |
| 14 | 1 | x | x | 0 | x | 1 | x | 0 | 1 | 0 | 1 | 0 | 0 | 0 | 1 | 1 | 1 | 0 | 1 | 0 | 0 |
| 15 | 1 | x | x | 0 | x | 0 | x | 0 | 1 | 1 | 1 | 0 | 0 | 0 | 1 | 1 | 1 | 1 | 1 | 0 | 0 |
| 16 | 1 | x | x | 0 | x | 1 | x | 0 | 0 | 0 | 1 | 1 | 0 | 0 | 1 | 0 | 0 | 0 | 1 | 1 | 0 |
| 17 | 1 | x | x | 0 | x | 1 | x | 0 | 0 | 1 | 1 | 1 | 0 | 0 | 1 | 1 | 0 | 0 | 1 | 1 | 0 |
| 18 | 1 | x | x | 0 | x | 1 | x | 0 | 1 | 0 | 1 | 1 | 0 | 0 | 1 | 1 | 1 | 0 | 1 | 1 | 0 |
| 19 | 1 | x | x | 0 | x | 0 | x | 0 | 1 | 1 | 1 | 1 | 0 | 0 | 1 | 1 | 1 | 1 | 1 | 1 | 0 |
| 20 | 1 | x | x | 0 | x | 1 | x | 0 | 0 | 0 | 1 | 1 | 1 | 0 | 1 | 0 | 0 | 0 | 1 | 1 | 1 |
| 21 | 1 | x | x | 0 | x | 1 | x | 0 | 0 | 1 | 1 | 1 | 1 | 0 | 1 | 1 | 0 | 0 | 1 | 1 | 1 |
| 22 | 1 | x | x | 0 | x | 1 | x | 0 | 1 | 0 | 1 | 1 | 1 | 0 | 1 | 1 | 1 | 0 | 1 | 1 | 1 |
| 23 | 1 | x | x | 0 | x | 0 | x | 1 | 1 | 1 | 1 | 1 | 1 | 0 | 1 | 1 | 1 | 1 | 1 | 1 | 1 |
| 24 | 1 | x | x | 0 | x | 1 | x | 0 | 1 | 1 | 0 | 1 | 1 | 0 | 0 | 0 | 0 | 1 | 0 | 1 | 1 |
| 25 | 1 | x | x | 0 | x | 1 | x | 0 | 1 | 0 | 0 | 1 | 1 | 0 | 0 | 0 | 1 | 1 | 0 | 1 | 1 |
| 26 | 1 | x | x | 0 | x | 1 | x | 0 | 0 | 1 | 0 | 1 | 1 | 0 | 0 | 1 | 1 | 1 | 0 | 1 | 1 |
| 27 | 1 | x | x | 0 | x | 0 | x | 0 | 0 | 0 | 1 | 1 | 0 | 0 | 1 | 1 | 1 | 1 | 0 | 1 | 1 |
| 28 | 1 | x | x | 0 | x | 1 | x | 0 | 1 | 1 | 0 | 0 | 1 | 0 | 0 | 0 | 0 | 1 | 0 | 0 | 1 |
| 29 | 1 | x | x | 0 | x | 1 | x | 0 | 1 | 0 | 0 | 0 | 1 | 0 | 0 | 0 | 1 | 1 | 0 | 0 | 1 |
| 30 | 1 | x | x | 0 | x | 1 | x | 0 | 0 | 1 | 0 | 0 | 1 | 0 | 0 | 1 | 1 | 1 | 0 | 0 | 1 |
| 31 | 1 | x | x | 0 | x | 0 | x | 0 | 0 | 0 | 0 | 0 | 1 | 0 | 1 | 1 | 1 | 1 | 0 | 0 | 1 |
| 32 | 1 | x | x | 0 | x | 1 | x | 0 | 1 | 1 | 0 | 0 | 0 | 0 | 0 | 0 | 0 | 1 | 0 | 0 | 0 |
| 33 | 1 | x | x | 0 | x | 1 | x | 0 | 1 | 0 | 0 | 0 | 0 | 0 | 0 | 0 | 1 | 1 | 0 | 0 | 0 |
| 34 | 1 | x | x | 0 | x | 1 | x | 0 | 0 | 1 | 0 | 0 | 0 | 0 | 0 | 1 | 1 | 1 | 0 | 0 | 0 |
| 35 | 1 | x | x | 0 | x | 0 | x | 1 | 0 | 0 | 0 | 0 | 0 | 0 | 1 | 1 | 1 | 1 | 0 | 0 | 0 |

The circuit of FIG. 77 also operates on the basis of the timing chart of FIG. 41.

The operation in the steps 901 and 902 is similar to that in the steps 801 and 802. When the test signal CAMTEST is "0", the address counter UDCNTR outputs the address signals A1 and A0 determined by the scan address input SIAA if the scan path control signal MEMT is "1", the scan write signal SIW transmitted through the selector SEL6 and scan flip-flop SFFW is used as the write raw signal WECD, and the scan input signal SIDI transmitted through the selector SEL1 is used as the shift-input to the scan flip-flop SFF-DI0. The logics of the signals during the zeroth to eighth periods are identical with those of Table 1. FIG. 53 shows a state of data after the execution of the steps 901 and 902.

The circuit of FIG. 77, similar to the circuit of FIG. 40, includes one scan path formed when the scan path control signal MEMT is "0" to transmit required logics by the unified scan input SICAM.

Preparations for the step 903 are made during the ninth and tenth periods. The test signal CAMTEST remains "0", and the scan write signal SIW is set to "1". The write enable signal WE is "0" to inhibit writing to the CAM 100. The input hold raw signal HLDDI selected by the selector SEL3 as the input signal HOLD-DI is applied to the scan flip-flop SFF-DIj. The value of the input hold signal HOLD-DI is "1" which does not permit the test pattern to be updated. In such a state, the scan signal SIA is "1" during the ninth period and is "0" during the tenth period to select the word line WL1 in the first column.

An address greater by one than the value to be used as the first address (j=0 in the step 903) is previously specified for the reasons to be described below.

The flow in the steps 903 to 910 sequentially increments the column number i, and the flow in the steps 911 to 918 sequentially decrements the column number i. To implement these flows by using the circuit operation, the circuit is designed to alternately implement the flow for incrementing the column number i and the flow for decrementing the column number i. In other words, the circuit operation for decrementing the column number i is performed immediately before the flow for incrementing the column number i (at the time of setting the initial states). In view of such circumstances, the address signals A1 and A0 are set to "0" and "1" during the ninth and tenth periods, respectively.

The CAM 100 is tested during the eleventh to thirty-fifth periods. The test signal CAMTEST is "1" when the CAM 100 is tested. In the second technique, the scan write signal SIW is constantly "0" since the CAM 100 is written during all clock cycles.

Since the reverse signal REV is "1", the down signal DMODE outputted from the exclusive-OR circuit XOR2 has the inverted logic of the output from the AND circuit AND-UP. The output from the AND circuit AND-UP transmits the value of the input signal DI0 when the test signal CAMTEST is "1". Thus, the down signal DMODE has the inverted logic of the input signal DI0 throughout the eleventh to thirty-fifth periods. That is, the address counter UDCNTR functions as an up-counter for incrementing the column number i when the input signal DI0 is "1", and functions as a down-counter for decrementing the column number i when the input signal DI0 is "0".

The specific address detection signal DET selected by the selector SEL5 determines whether or not the first address detection signal FA has been detected when the column number i is incremented and whether or not the last address detection signal LA has been detected when the column number i is decremented. The specific address detection signal DET set to "1" means that a specific test pattern has been written to the memory cells in all columns.

If a specific test pattern has been written to all memory cells, the test pattern is updated (the eleventh, fifteenth, nineteenth, twenty-third, twenty-seventh, thirty-first and thirty-fifth periods). To determine whether the update of the scan flip-flop SFF-DIj is permitted/inhibited, the input hold signal HOLD-DI having the inverted logic of the specific address detection signal DET by the inverter INV3 is applied to the scan flip-flop SFF-DIj.

The output from the exclusive-OR circuit XOR1 is "1" when the value of the input signal DI0 at a given time mismatches the value to which the input signal DI0 is updated next, in other words, when the test pattern at a given time is (1, ×, 1) or (0, ×, 0). The output from the AND circuit AND-HA is the AND of the specific address detection signal DET and the output from the exclusive-OR circuit XOR1 and is selected by the selector SEL4 as the address hold signal HOLD-A. Thus, the update of the address signals A1 and A0 of the address counter UDCNTR is inhibited only in two cases to be described below.

One case is that the test pattern is (1, 1, 1) and the last address LA is detected when "1" is shifted into the scan flip-flop SFF-DIj (the twenty-third period).

The other case is that the test pattern is (0, 0, 0) and the first address FA is detected when "0" is shifted into the scan flip-flop SFF-DIj (the thirty-fifth period).

Inhibiting the update of the address signals A1 and A0 permits writing to the memory cells in the (n−1)-th column in the step 912 to follow the determination that i=n−1 in the step 907.

The twelfth to fifteenth periods correspond to the step 904 and FIGS. 54 through 57. The sixteenth to twenty-third periods correspond to the step 906 and FIGS. 58 through 65. The twenty-fourth to twenty-seventh periods correspond to the step 912 and FIGS. 66 through 69. The twenty-eighth to thirty-fifth periods correspond to the step 914 and FIGS. 70 through 76 and 53. The eleventh period is identical with the thirty-fifth period.

Figure 78:
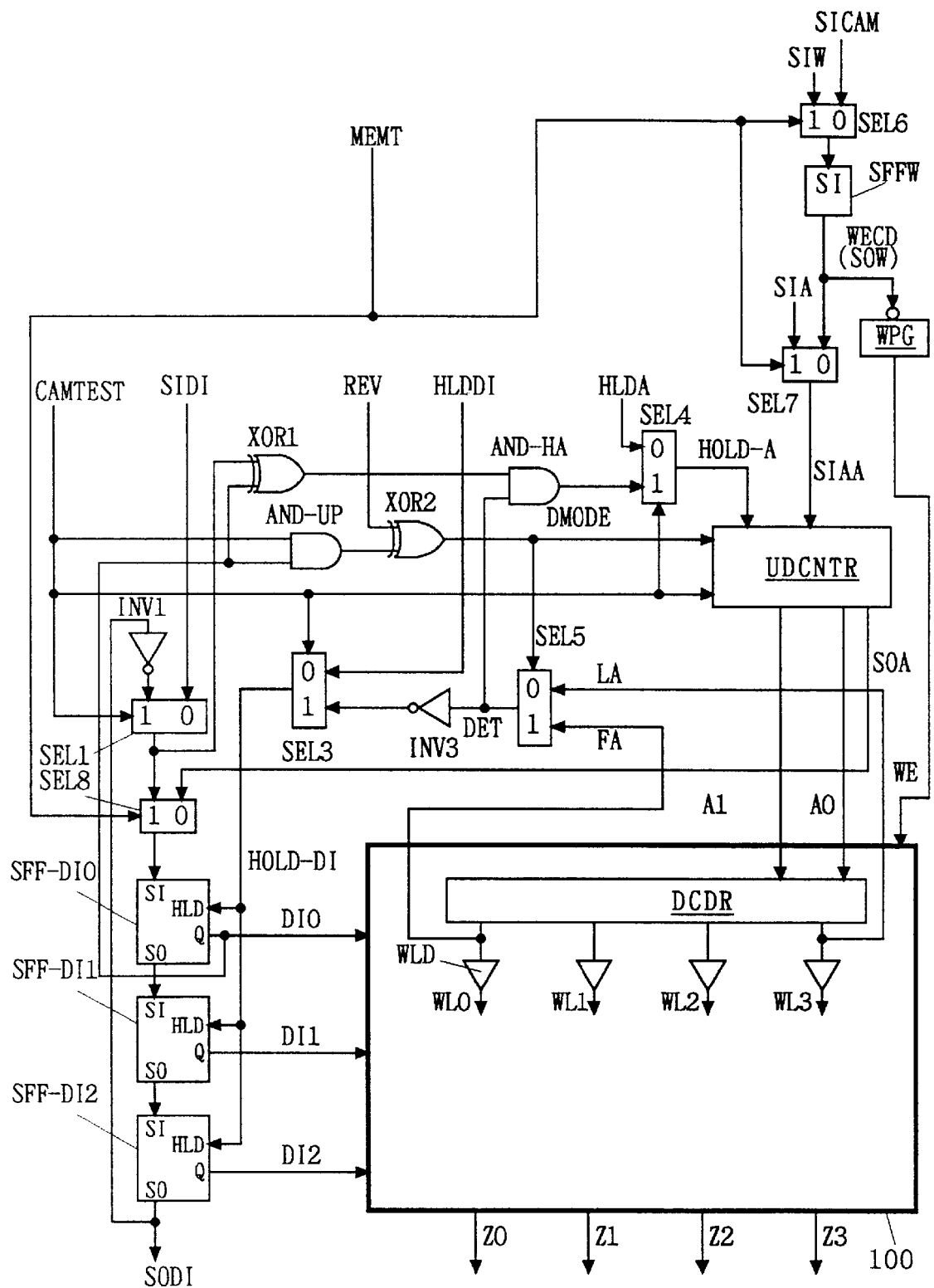

FIG. 78 is a circuit diagram of another form of the CAM test circuit for implementing the second technique. The last address detection signal LA is not provided from the last address detecting circuit LADET but from the value to be applied to the word line WL3 in the column corresponding to the last address, or the third column herein. The first address detection signal FA is not provided from the first address detecting circuit FADET but from the value to be applied to the word line WL0 in the column corresponding to the first address, or the zeroth column herein. It is apparent that such an arrangement achieves the similar operation to the circuit of FIG. 77.

Like the first technique, the second technique may employ a binary up-down counter, a feedback shift register type up-down counter or a Gray code counter as the address counter UDCNTR.

Figure 79:
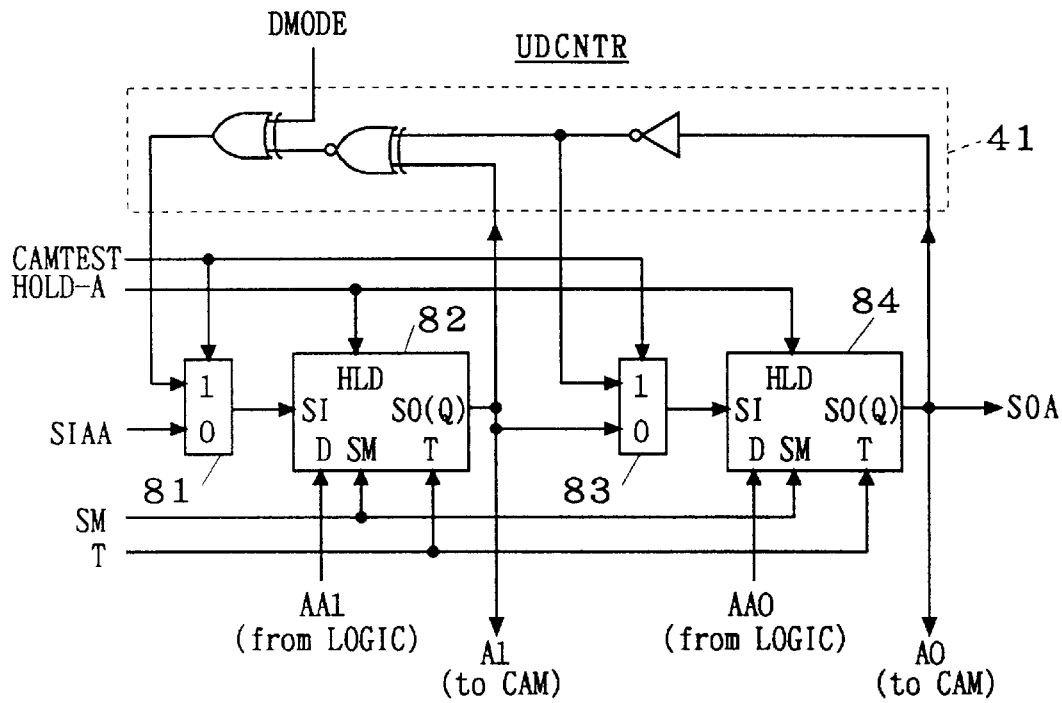

FIG. 79 is a circuit diagram of a binary up-down counter used as the address counter UDCNTR. The circuit of FIG. 79 is similar in construction to the binary counter of FIG. 43 except that an increment and decrement circuit 41 is substituted for the increment circuit 85 of FIG. 43. The increment and decrement circuit 41 includes an exclusive-OR circuit in addition to the elements of the increment circuit 85. The down signal DMODE is applied to a first input of the exclusive-OR circuit.

A path is opened from the scan flip-flops 82, 84 to the increment and decrement circuit 41 when the test signal CAMTEST is "1". When the down signal DMODE is "0", the increment and decrement circuit 41 is similar in operation to the increment circuit 85, and increments the address in synchronism with the clock signal T. The outputs X0, X1, X2, X3 from the decoder DCDR are sequentially obtained as an address Xi (i=2·A1+A0).

When the down signal DMODE is "1", the exclusive-OR circuit of the increment and decrement circuit 41 acts as an inverter. The address is decremented in synchronism with the clock signal T to provide sequential outputs X3, X2, XI, X0 from the decoder DCDR.

Figure 80:
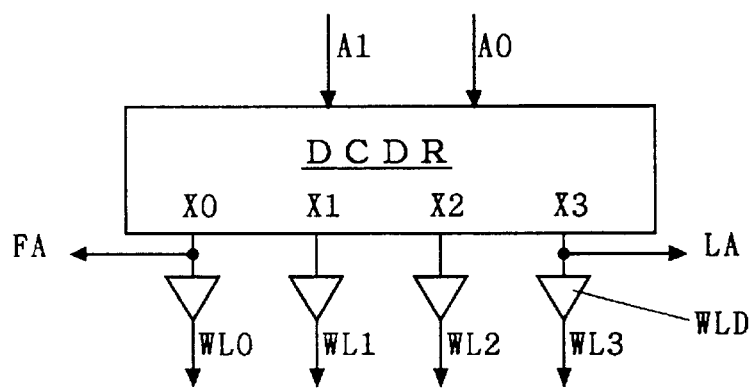

Then, the output Xi from the decoder DCDR should be connected to the word line WLi. FIG. 80 shows the connection between the decoder DCDR and the word line WLi in this case.

The last address detection signal LA is provided from the signal to be applied to the word line WL3 in the same manner as in FIG. 78. The first address detection signal FA is provided from the signal to be applied to the word line WL0. As in FIG. 44, the last address detection signal LA is not the signal itself applied to the word line WL3 but is provided from the output X3 on one side of the word line driver WLD which is closer to the decoder DCDR. Likewise, the first address detection signal FA is not the signal itself applied to the word line WL0 but is provided from the output X0 on one side of the word line driver WLD which is closer to the decoder DCDR. These signals LA and FA are given in this manner to insure the normal signals LA and FA if a failure occurs on the word lines WL0 and WL3.

Figure 81:
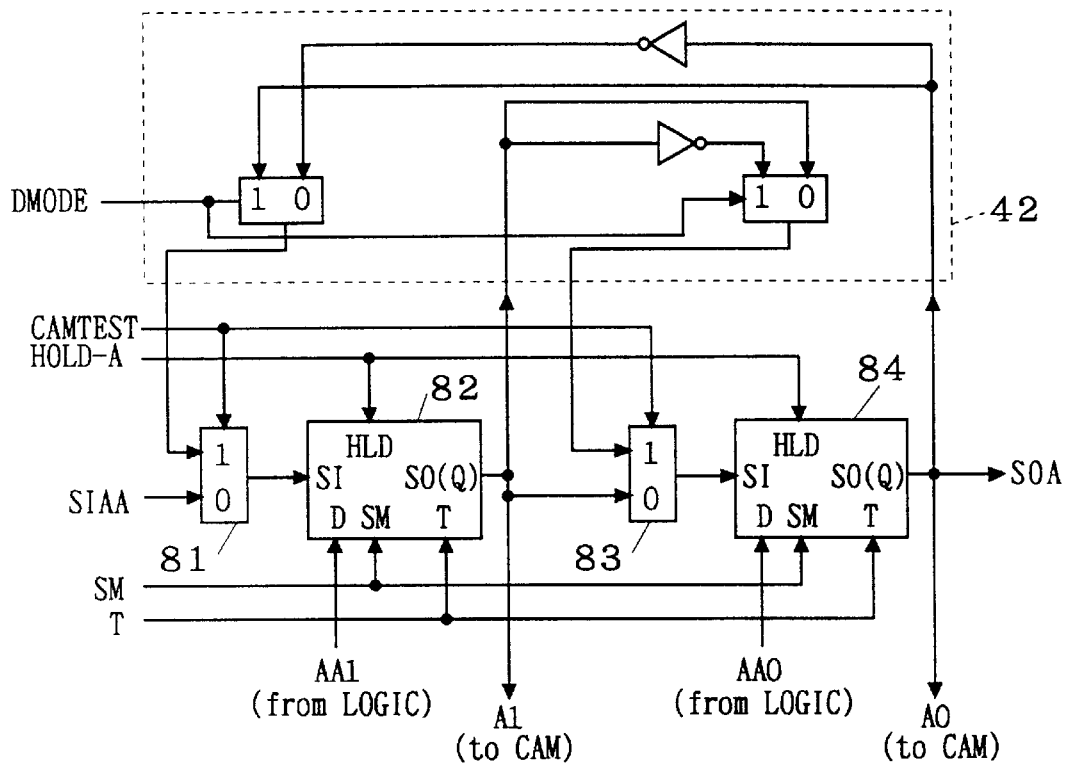

FIG. 81 is a circuit diagram of a 2-bit feedback shift register type counter used as the address counter UDCNTR. The circuit of FIG. 81 is similar in construction to the circuit of FIG. 79 except that an increment and decrement circuit 42 is substituted for the increment and decrement circuit 41 of FIG. 79. The increment and decrement circuit 42 includes two selectors controlled by the down signal DMODE and two inverters.

When the down signal DMODE is "0", the scan output SO of the scan flip-flop 82 is connected to the scan input SI of the scan flip-flop 84 independently of the value of the test signal CAMTEST. Then, the increment and decrement circuit 42 is similar in operation to the increment circuit 86. Specifically, when the test signal CAMTEST is "1", the outputs X0, X2, X3, X1 from the decoder DCDR are alternatively activated in sequential order in synchronism with the clock signal T.

On the other hand, when the down signal DMODE is "1", the outputs X0, X2, X3, X1 from the decoder DCDR are alternatively activated in sequential order in synchronism with the clock signal T if the test signal CAMTEST is "1".

Figure 82:
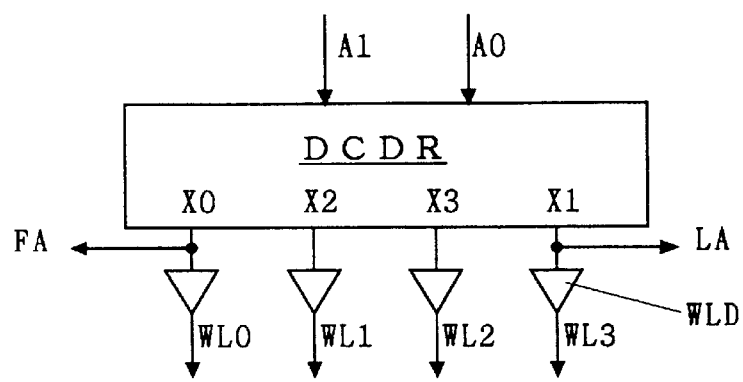

Access to the memory cells may start from any column in the second technique as in the first technique. However, if the order of access is from the zeroth to third columns, the outputs X0, X2, X3, X1 from the decoder DCDR should be connected to drive the word lines WL0, WL1, WL2, WL3, respectively, as shown in FIG. 82. In this case, the last address is "1" which corresponds to the third column. The address to be incremented next to the first address is "2". Therefore, when the feedback shift register type counter of FIG. 81 is used as the address counter UDCNTR, the address signals A1 and A0 must be "1" and "0", respectively, during the ninth and tenth periods of Table 4.

Similar to the first technique, the second technique is also applicable to a CAM including memory cells arranged in 16 columns wherein 4-bit address signals A3 A2, A1, A0 are applied to the decoder DCDR.

Figure 83:
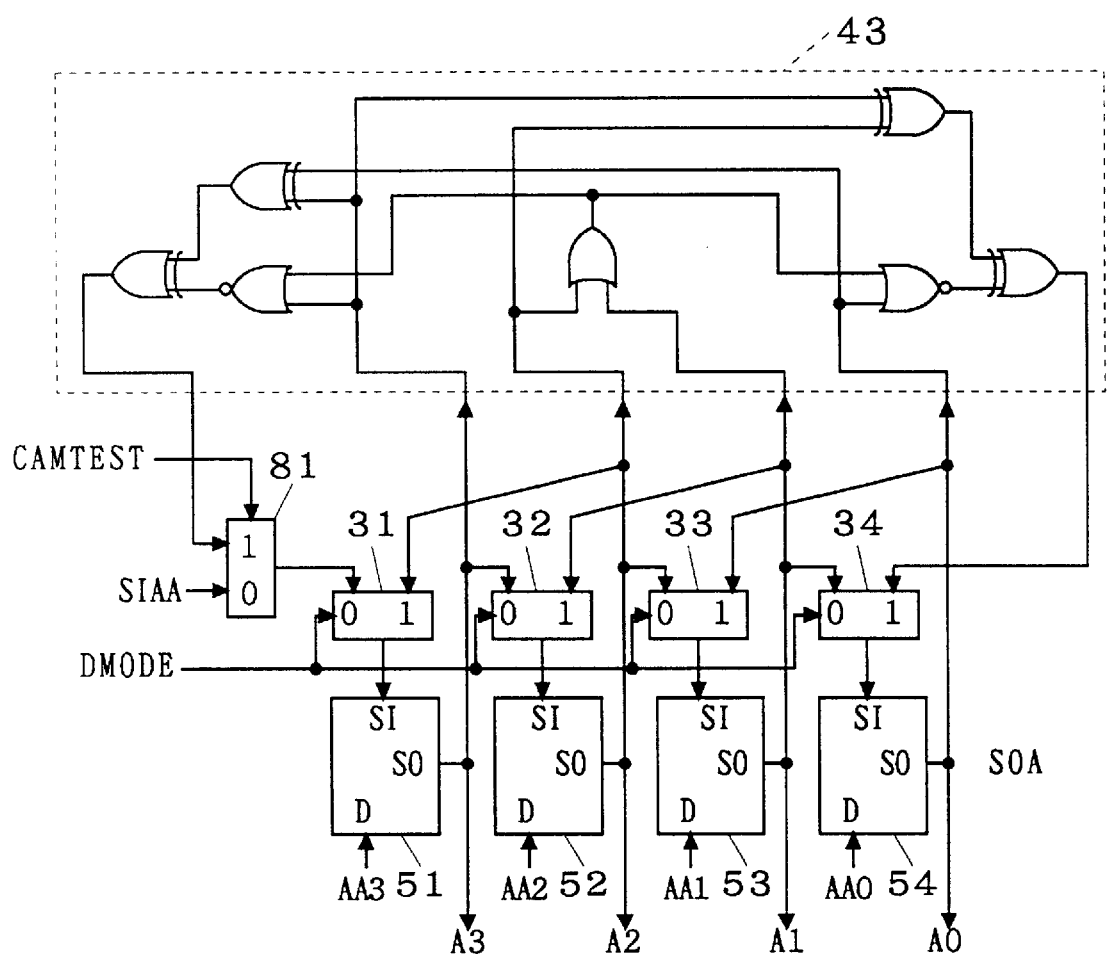

FIG. 83 is a circuit diagram of a feedback shift register type counter for generating the 4-bit address signals A3, A2, A1, A0. Selectors 81, 31, 32, 33, 34, scan flip-flops 51, 52, 53, 54, and an increment and decrement circuit 43 are connected as shown in FIG. 83. The scan flip-flops 51, 52, 53, 54 may be of the construction shown in FIG. 7B. The selector 81 is controlled by the test signal CAMTEST, and the scan flip-flops 51, 52, 53, 54 and the increment and decrement circuit 43 are connected to each other through the selectors 31, 32, 33, 34 when the test signal CAMTEST is "1". The selectors 31, 32, 33, 34 are controlled by the down signal DMODE.

When the down signal DMODE is "0", the scan outputs SO of the scan flip-flops 51, 52, 53 are connected to the scan inputs SI of the scan flip-flops 52, 53, 54, respectively. Then the increment and decrement circuit 43 exhibits equivalent functions to the increment circuit 75, and the outputs X0, X8, X12, X14, X15, X7, X11, X5, X10, X13, X6, X3, X9, X4, X2, X1 (Xk: k=8·A3+4·A2+2·A1+A0) from the decoder DCDR are alternatively activated in sequential order in response to the address signals A3, A2, A1, A0.

When the down signal DMODE is "1", the scan outputs SO of the scan flip-flops 54, 53, 52 are connected to the scan input SI of the scan flip-flops 53, 52, 51, respectively. The outputs X1, X2, X4, X9, X3, X6, X13, X10, X5, X11, X7, X15, X14, X12, X8, X0 from the decoder DCDR are alternatively activated in sequential order in response to the address signals A3, A2, A1, A0 generated.

Figure 84:
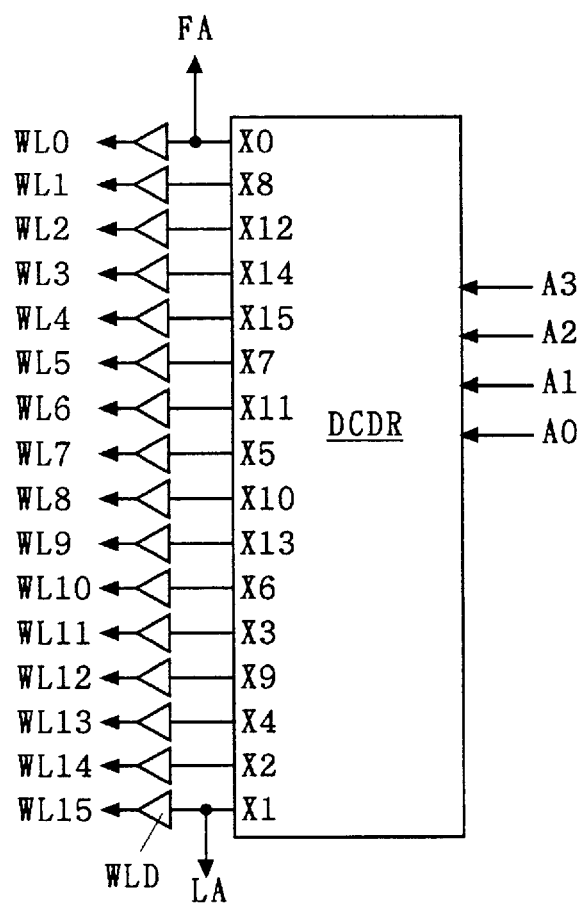

The connection is made between the decoder DCDR and the word line WLi as shown in FIG. 84 to sequentially activate the adjacent word lines WLi in this case. The connection should be made so that the outputs X0, X8, X12, X14, X15, X7, X11, X5, X10, X13, X6, X3, X9, X4, X2, X1 from the decoder DCDR drive the word lines WL0, WL1, WL2, . . . WL15, respectively. The last address is "1" which corresponds to the fifteenth column. The address to be incremented next to the first address is "8". Thus, when the feedback shift register type counter shown in FIG. 81 is used as the address counter UDCNTR, the eighth address must be algorithmically set immediately before the test signal CAMTEST is set to "1".

(c-2-2) Generation of Expected Value
Seventh Preferred Embodiment

Described below is a technique for providing expected values in the second technique in synchronism with the production of the column coincidence signal Zi. It is assumed that the number of columns n is 4 in the seventh preferred embodiment as in the third preferred embodiment.

Table 5 is a logic table showing the expected values E0, E1, E2, E3 in the respective states in chronological order. These contents are shown in FIGS. 53 through 76 in the form of the column coincidence signals Z0, Z1, Z2, Z3. The arrow in the table indicates that the states form a loop.

TABLE 5

|  | E0 | E1 | E2 | E3 |
|---|---|---|---|---|
| STATE-B-0 | 1 | 1 | 1 | 1 |
| STATE-B-1 | 1 | 0 | 0 | 0 |
| STATE-B-2 | 1 | 1 | 0 | 0 |
| STATE-B-3 | 1 | 1 | 1 | 0 |
| STATE-B-4 | 1 | 1 | 1 | 1 |
| STATE-B-5 | 1 | 0 | 0 | 0 |
| STATE-B-6 | 1 | 1 | 0 | 0 |
| STATE-B-7 | 1 | 1 | 1 | 0 |
| STATE-B-8 | 1 | 1 | 1 | 1 |
| STATE-B-9 | 1 | 0 | 0 | 0 |
| STATE-B-10 | 1 | 1 | 0 | 0 |
| STATE-B-11 | 1 | 1 | 1 | 0 |
| STATE-B-12 | 1 | 1 | 1 | 1 |
| STATE-B-13 | 0 | 0 | 0 | 1 |
| STATE-B-14 | 0 | 0 | 1 | 1 |
| STATE-B-15 | 0 | 1 | 1 | 1 |
| STATE-B-16 | 1 | 1 | 1 | 1 |
| STATE-B-17 | 0 | 0 | 0 | 1 |
| STATE-B-18 | 0 | 0 | 1 | 1 |
| STATE-B-19 | 0 | 1 | 1 | 1 |
| STATE-B-20 | 1 | 1 | 1 | 1 |
| STATE-B-21 | 0 | 0 | 0 | 1 |
| STATE-B-22 | 0 | 0 | 1 | 1 |
| STATE-B-23 | 0 | 1 | 1 | 1 |

Figure 85:
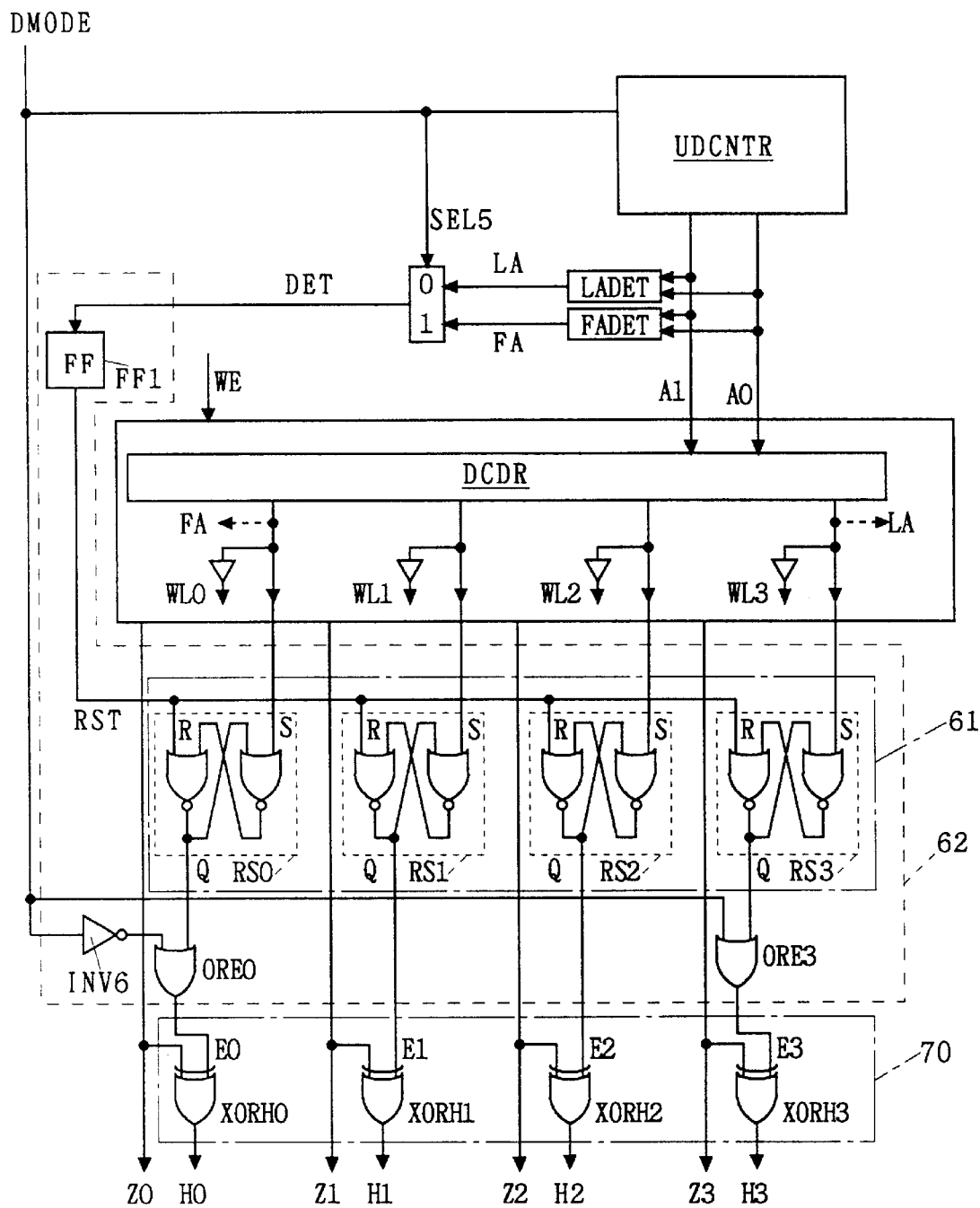
FIGS. 85 and 86 are circuit diagrams of a seventh preferred embodiment according to the present invention.

FIG. 85 illustrates an expected value generator circuit 62 for generating the expected values E0, E1, E2, E3. Also shown in FIG. 85 are the portions for providing the specific address detection signal DET shown in FIG. 77, the write enable signal WE, and the comparator circuit 70 for comparing the expected values E0, E1, E2, E3 with the column coincidence signals Z0, Z1, Z2, Z3. Decoder outputs corresponding to the word lines WL3 and WL0 may be used in place of the outputs from the last address detecting circuit LADET and first address detecting circuit FADET.

The expected value generator circuit 62 comprises a flip-flop FF1, the expected value generator circuit 61, OR circuits ORE0, ORE3, and an inverter INV6. The expected value generator circuit 61 is identical with that of FIG. 50.

The output Xi is applied to the set terminal of the RS flip-flop RSi (as above described, when the decoder DCDR shown in FIG. 80 is used, the connection between the output Xi and the word line WLi should be changed as shown in FIG. 81). The flip-flop FF1 causes the specific address detection signal DET to lag behind by one clock cycle to provide the reset signal RST which in turn is applied to the reset terminal of all RS flip-flops RSi.

The OR circuit ORE0 has a first input receiving the inverted version of the down signal DMODE and a second input receiving the Q output from the RS flip-flop RS0. The OR circuit ORE3 has a first input receiving the down signal DMODE and a second input receiving the Q output from the RS flip-flop RS3. The expected values E0, E1, E2, E3 are provided as the output from the OR circuit ORE0, the Q output from the RS flip-flop RS1, the Q output from the RS flip-flop RS2, and the output from the OR circuit ORE3, respectively.

In terms of construction of the expected value generator circuit 62, the word lines WL0, WL1, WL2, WL3 are preferably alternatively activated in this sequential order. Thus, when the circuit of FIG. 81 is used as the address counter UDCNTR, the outputs X0, X1, X2, X3 are applied to the set terminal of the RS flip-flops RS0, RS1, RS2, RS3, respectively. Although the circuit of FIG. 79 is used as the address counter UDCNTR in the description for simplicity, the circuit of FIG. 81 may be used as the address counter UDCNTR with suitable connection of the word line WLi.

The OR circuit ORE0 and the inverter INV6 are provided to force the expected value E0 to "1" when the address counter UDCNTR counts up (DMODE=0). The OR circuit ORE3 is provided to force the expected value E3 to "1" when the address counter UDCNTR counts down (DMODE=1).

The address next to the first address is specified immediately before the test signal CAMTEST becomes "1" (tenth period). Since the address signals A1 and A0 are "0" and "1" respectively, the specific address detection signal DET is "0" which is applied to the flip-flop FF1. Then, the reset signal RST is not provided immediately after the test signal CAMTEST becomes "1" (eleventh period). For this reason, the expected value in STATE-B-0 of Table 5 is not provided during the eleventh period. The provision of the expected value in STATE-B-0 will be described below.

The expected value may be provided in and after STATE-B-1 in a manner to be described below. The input signal DI0 is "0" during the eleventh period, and the down signal DMODE is "1" when the reverse signal REV is "1". The selector SEL5 outputs the first address detection signal FA as the specific address detection signal DET. Then, the first address is specified to set the specific address detection signal DET to "1" which is stored in the flip-flop FF1.

The reset signal RST becomes "1" during the clock cycle next to the setting of the specific address detection signal DET to "1". Then all of the RS flip-flops RSi are reset to output the value "0". That is, the expected value in STATE-B-1 may be provided during the twelfth period.

During the twelfth period, the input signal DI0 is "1" and the down signal DMODE is "0". The expected value E0 is held at "0" by the function of the inverter INV6 until the input signal DI0 is changed to "0" again.

During the clock cycle over which the reset signal RST is "0", the output Ei from the RS flip-flop RSi corresponding to the selected word line WLi becomes and held at "1" until the reset signal RST becomes "1" again for reset.

For example, when the order of access to the word lines is WL0→WL1→WL2→WL3, a set of expected values (E0, E1, E2, E3) change as follows: (1, 0, 0, 0)→(1, 1, 0, 0)→(1, 1, 1, 0)→(1, 1, 1, 1). Conversely, when the order of access to the word lines is WL3→WL2→WL1→WL0, the set of expected values (E0, E1, E2, E3) change as follows: (0, 0, 0, 1)→(0, 0, 1, 1)→(0, 1, 1, 1)→(1, 1, 1, 1). In this fashion, the expected value Ei of Table 5 corresponding to STATE-B-1 to STATE-B-23 is automatically generated. The state represented by STATE-B-0 follows the state represented by STATE-B-23. As a result, all of the expected values Ei shown in Table 5 are automatically generated.

Figure 86:
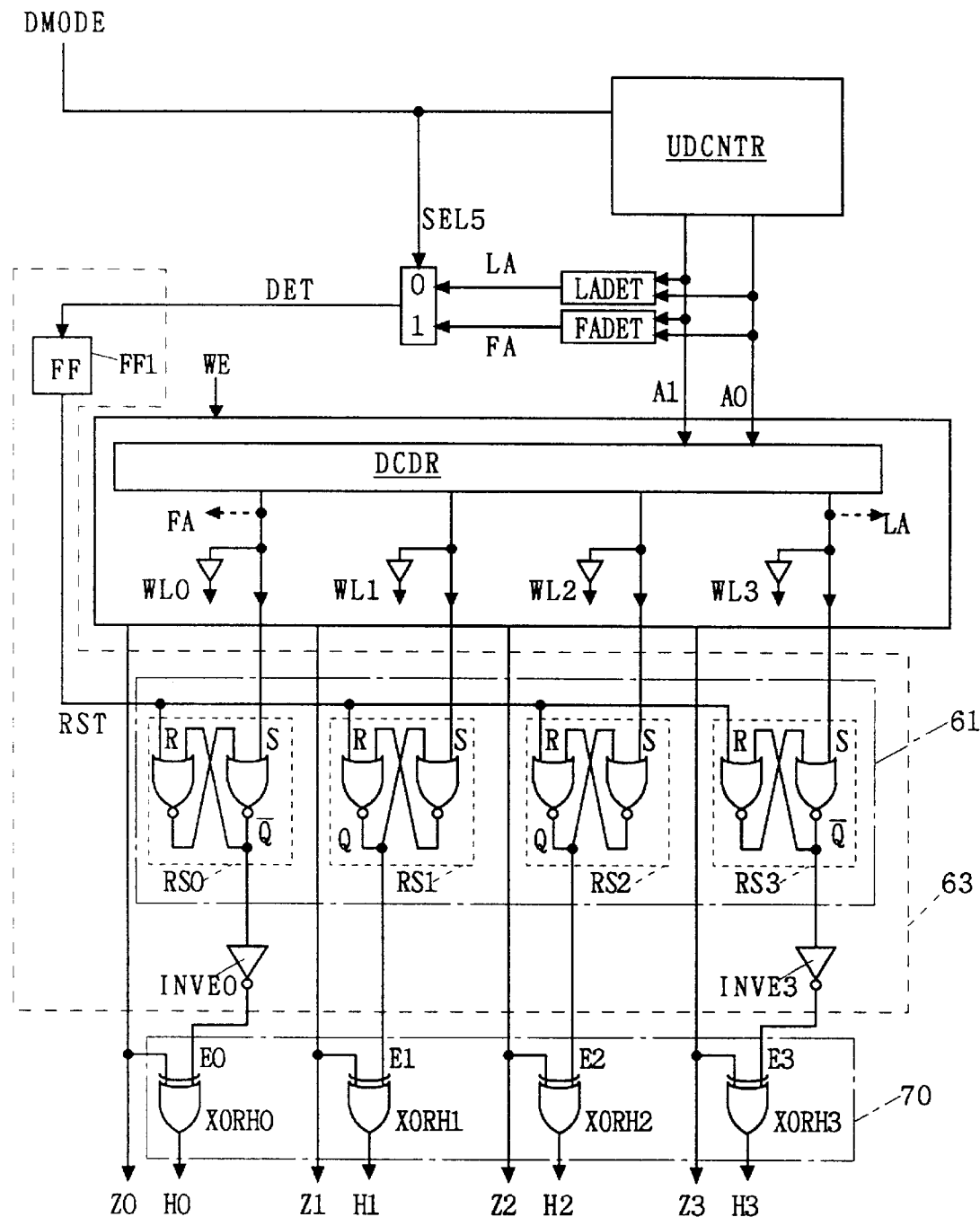

FIG. 86 illustrates another expected value generator circuit 63 for generating the expected values E0, E1, E2, E3. Also shown in FIG. 86 are the portions for providing the specific address detection signal DET shown in FIG. 77, the write enable signal WE, and the comparator circuit 70 for comparing the expected values E0, E1, E2, E3 with the column coincidence signals Z0, Z1, Z2, Z3. The decoder outputs corresponding to the word lines WL3 and WL0 may be used in place of the outputs from the last address detecting circuit LADET and the first address detection circuit FADET.

The expected value generator circuit 63 comprises the flip-flop FF1, the expected value generator circuit 61, and inverters INVE0, INVE3. The output Xi is applied to the set terminal of the RS flip-flop RSi (as above described, when the circuit of FIG. 80 is used as the decoder DCDR, the connection between the output Xi and the word line WLi should be changed as shown in FIG. 81). The flip-flop FF1 causes the specific address detection signal DET to lag behind by one clock cycle to provide the rest signal RST which in turn is applied to the reset terminal of all of the RS flip-flops RSi.

The $\overline{Q}$ outputs from the RS flip-flops RS0, RS3 are applied to the inputs of the inverters INVE0, INVE3, respectively. The expected values E0, E1, E2, E3 are provided as the output from the inverter INVE0, the Q output from the RS flip-flop RS1, the Q output from the RS flip-flop RS2, and the output from the inverter INVE3, respectively.

When the down signal DMODE is "0", the reset signal RST is changed to "1" during the clock cycle next to setting the last address detection signal LA to "1" (for example, when the output X3 becomes "1" to select the word line WL3. In the description below, the circuit of FIG. 79 is used as the decoder DCDR, but the circuit of FIG. 80 may be used. In this case, the connection between the output Xi and the word line WLi should be changed as shown in FIG. 81 as above described). This resets the RS flip-flops RS1, RS2, RS3. Since the output X0 is "1", the Q output and $\overline{Q}$ output from the RS flip-flop RS0 are "0". Then the set of expected values E0, E1, E2, E3 are (1, 0, 0, 0).

When the down signal DMODE is "1", the reset signal RST is changed to "1" during the clock cycle next to setting the first address detection signal FA (or the output X0) to "1" to reset the RS flip-flops RS0, RS1, RS2. Since the output X3 is "1", the Q output and $\overline{Q}$ output from the RS flip-flop RS3 are "0". Then the set of expected values E0, E1, E2, E3 are (0, 0, 0, 1).

In this manner, the technique illustrated herein uses the RS flip-flops RS0 and RS3 so that the reset terminal R and set terminal S thereof are "1", as is originally inhibited. To cause resetting to precede setting, the expected values E0 and E3 do not directly use the Q outputs from the RS flip-flops RS0, RS3 but the $\overline{Q}$ outputs thereof inverted by the inverters INVE0 and INVE3.

During the clock cycle over which the reset signal RST is "0", the expected value Ei corresponding to the selected decoder output Xi becomes and held at "1" until the reset signal RST is changed to "1" again. Thus, the circuit of FIG. 86, similar to the circuit of FIG. 85, automatically generates all of the expected values Ei shown in Table 5.

(c-2-3) Variation of Second Technique
Eighth Preferred Embodiment

Figure 87:
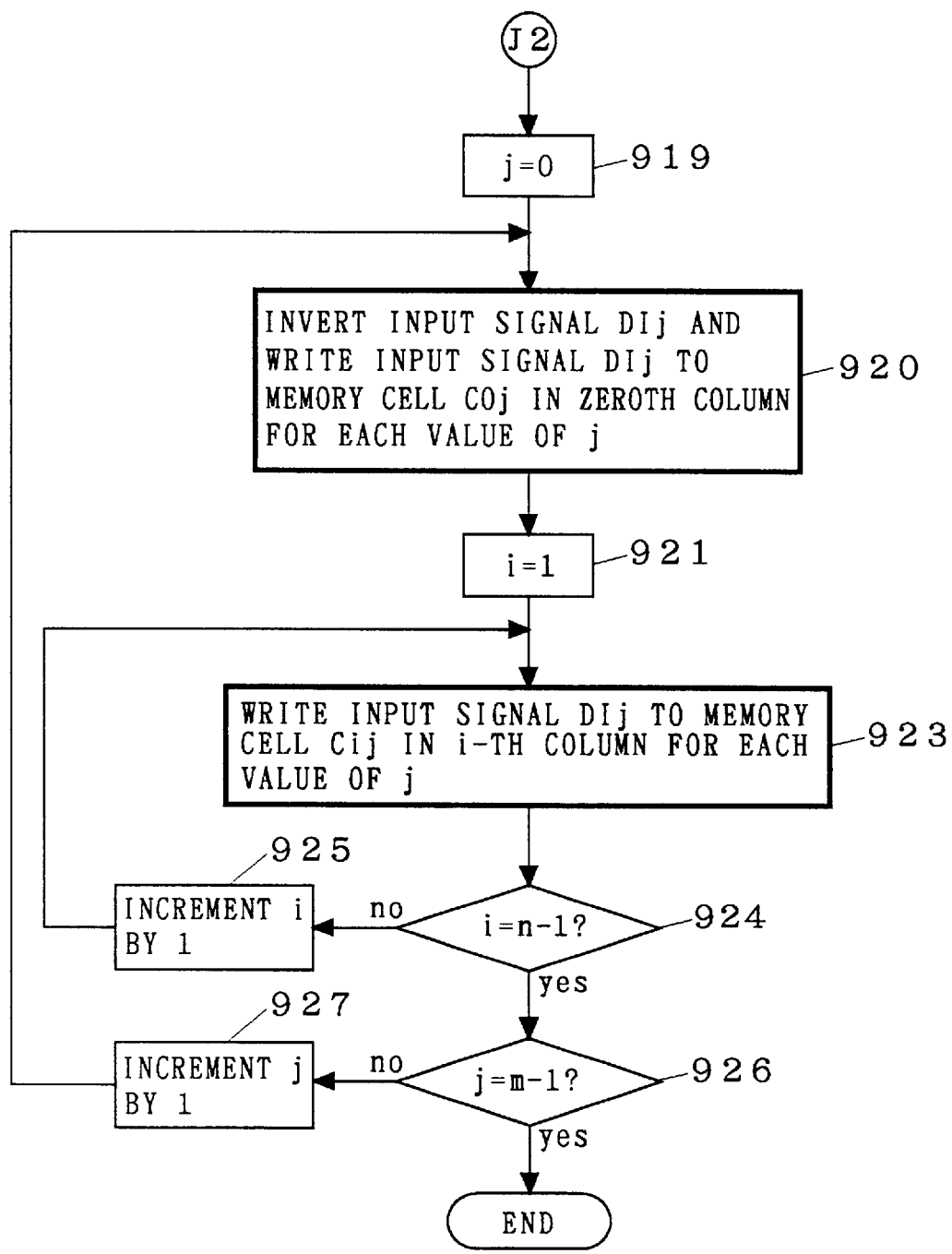
FIG. 87, together with FIG. 51, is a flow chart of an eighth preferred embodiment according to the present invention.

FIG. 87, together with FIG. 51, is a flow chart showing a variation of the second technique. The processing in the second technique prior to the connector J2 is performed prior to the connector J2 in the variation of the second technique. In the processing prior to the connector J2, the memory cells in the zeroth column are not checked in Cases 1 and 3 but in Cases 2 and 4. However, the memory cells in the first to third columns are checked in Cases 1 and 2.

The flow after the connector J2 of FIG. 52 in the second technique is executed to write and read the test pattern (1, 1, 1), (0, 1, 1), (0, 0, 1) into and from the memory cells in each column in descending order of column number.

On the other hand, the variation of the second technique writes and reads the same test pattern into and from the memory cells in each column in ascending order of column number. Thus, the processing after the connector J2 does not check the memory cells in the zeroth column in Cases 1 and 3 but in Cases 2 and 4. The memory cells in the first to third columns are checked in Cases 3 and 4.

Unlike the second technique, the variation thereof may check the memory cells in the third column for failure in all Cases 1 to 4, but does not check the memory cells in the zeroth column for failure in Cases 1 and 3.

To check the memory cells for failure in all Cases 1 to 4, it is necessary to write the memory cells in descending order of column number and to execute the flow of the steps 904, 906, 920, 923 of FIGS. 51 and 87 again.

(c-3) Third Technique
Ninth Preferred Embodiment

The first technique is advantageous in that all of the memory cells may be checked for failure in Cases 1 to 4. Other variations of the CAM test technique are applicable.

Figure 88:
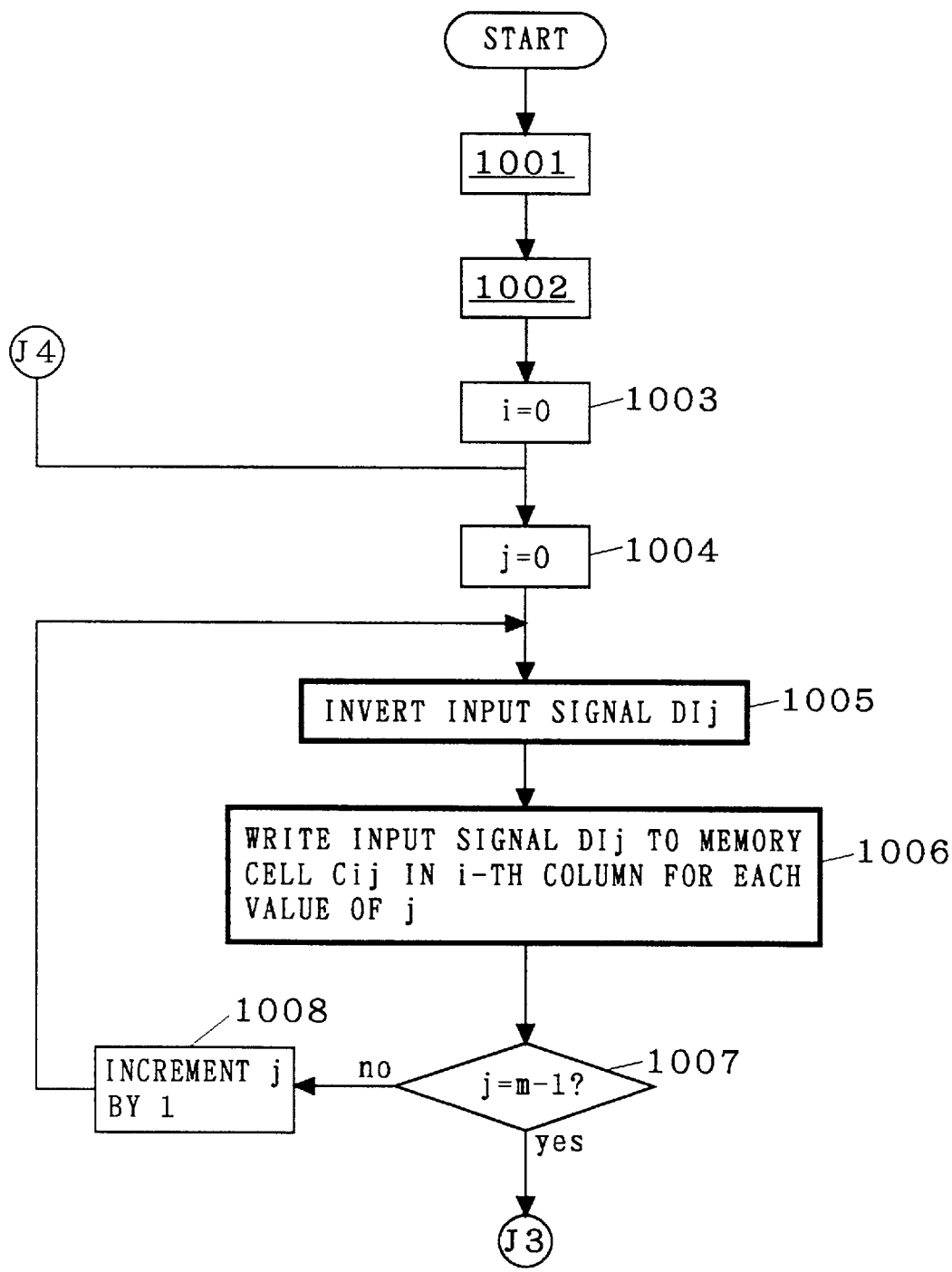
FIGS. 88 and 89 together are a flow chart of a ninth preferred embodiment according to the present invention.
Figure 89:
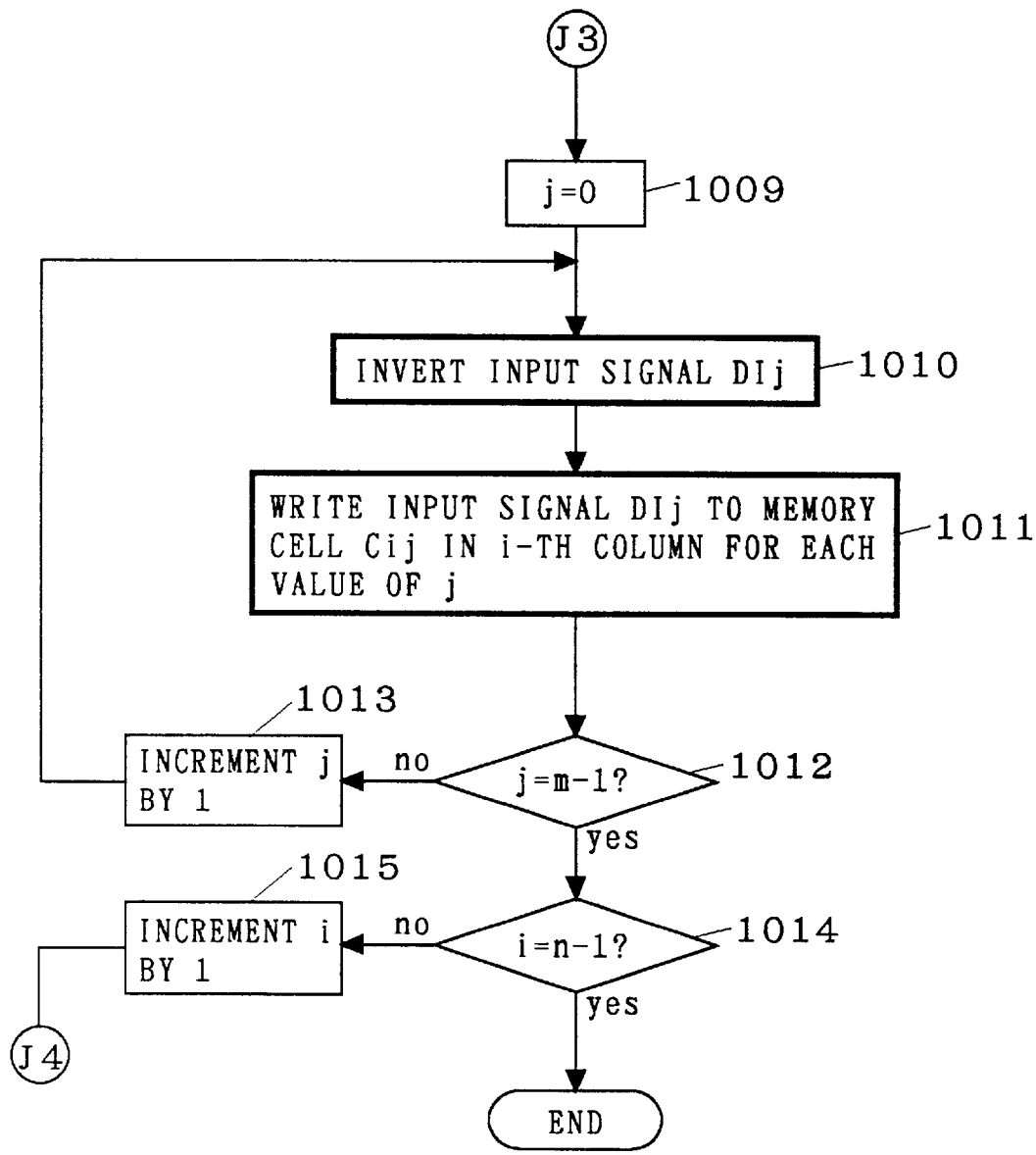

FIGS. 88 and 89 are a flow chart of the third technique according to the present invention, and provide a continuous flow using connectors J3 and J4. The third technique features sequentially testing the memory cells for each column.

FIGS. 90 through 137 conceptually illustrate, in chronological order, the contents stored in the scan flip-flop SFF-DIj (input signal DIj) and in the content addressable memory cell Cij (i=0, 1, 2, 3; j=0, 1, 2) of the CAM 100 which are subjected to the third technique. The sequential states "STATE-C-p" (p=0 to 47) are shown in FIGS. 90 through 137. In these figures, values are depicted in the same manner as in FIGS. 10 through 39.

Figure 90:
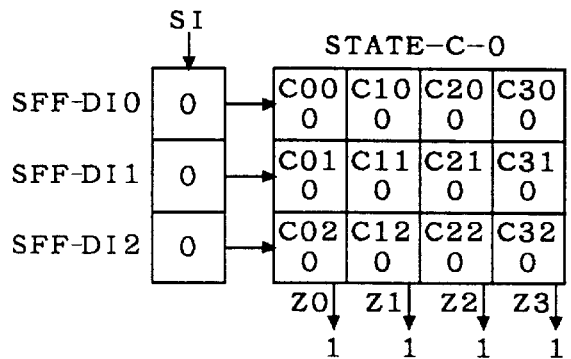
FIGS. 90 through 137 conceptually illustrate states of data being subjected to a third technique in sequential order.

The processing in the steps 1001, 1002 is identical with that in the steps 801, 802 in the first technique. Specifically, the initial value of all of the input signals DIj is set to "0", and the initial value of the content stored in the content addressable memory cell Cij for each value of i and j is set to "0". FIG. 90 shows a state of data after the execution of the steps 1001 and 1002. In the step 1003, the column number is initialized, and the zeroth column is selected herein. In the step 1004, the value j is set to "0" which is initialization for processing the scan flip-flop SFF-DIj.

The input signal DIj is inverted in the step 1005. This processing corresponds to the feedback by the inverter INV1 shown in FIG. 3 as above described. Thus, the execution of the step 1005 on the data of FIG. 90 is equivalent to shift-in of the value "1".

Figure 91:
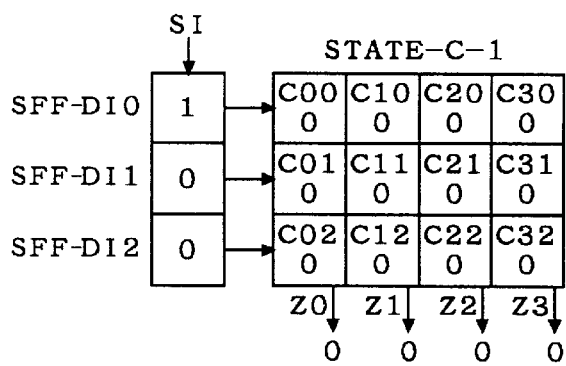

In the steps 1005, 1006, 1010, 1011 indicated by thick blocks in FIGS. 88 and 89, as in FIGS. 8 and 9, the column coincidence signal Zi determined by the execution of the step is also tested. FIG. 91 shows a state of data after the execution of the step 1005. Then the content addressable memory cell C00 may be checked for failure in Case 1.

Figure 92:
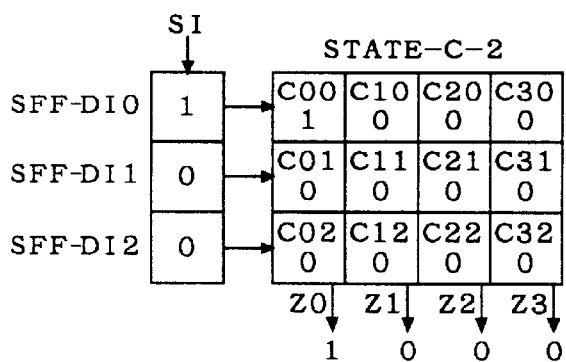

Subsequently, the step 1006 is executed to write the test pattern (1, 0, 0) into the memory cells in the zeroth column (FIG. 92). Then, the content addressable memory cell C00 may be checked for failure in Case 2.

Figure 93:
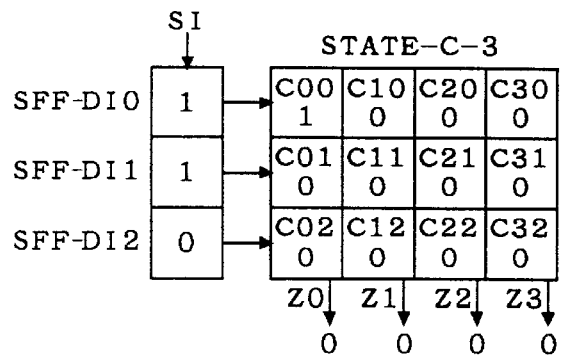
Figure 94:
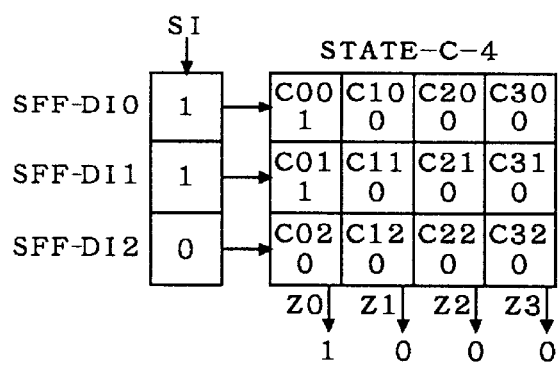

The steps 1007 and 1008 are executed to move to the next row. The value "1" is shifted in the scan flip-flop SFF-DI0 in the step 1005 (FIG. 93). Then the content addressable memory cell C01 may be checked for failure in Case 1. The step 1006 is executed to write the test pattern (1, 1, 0) into the memory cells in the zeroth column (FIG. 94). Then the content addressable memory cell C01 may be checked for failure in Case 2.

Figure 95:
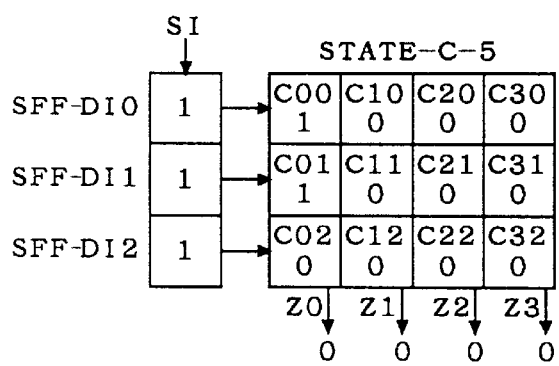
Figure 96:
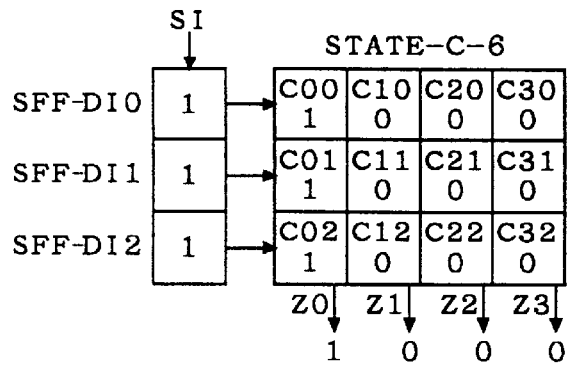
Figure 97:
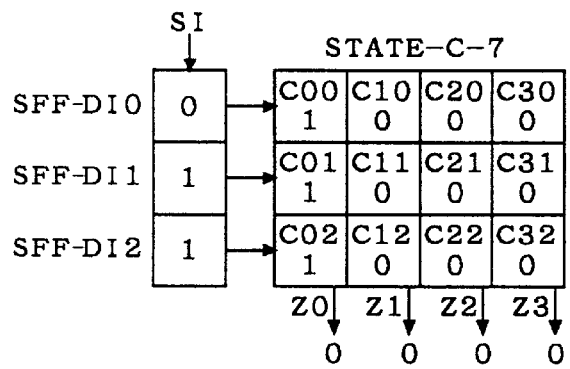
Figure 98:
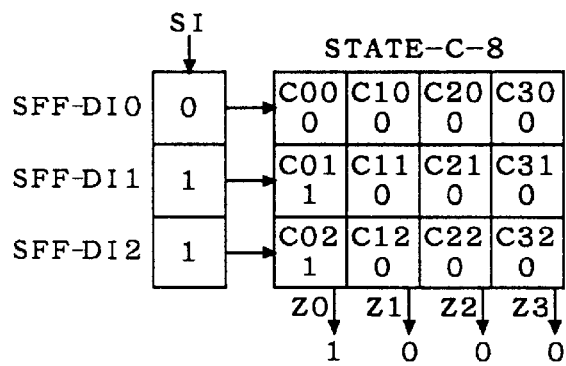
Figure 99:
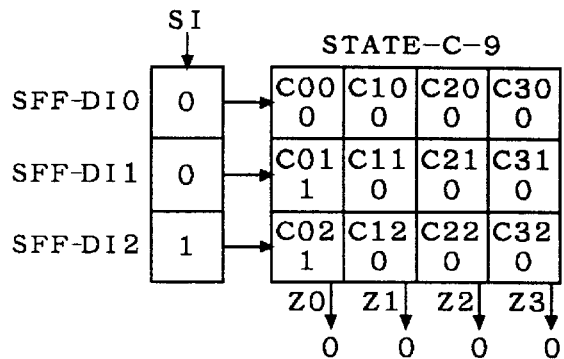
Figure 100:
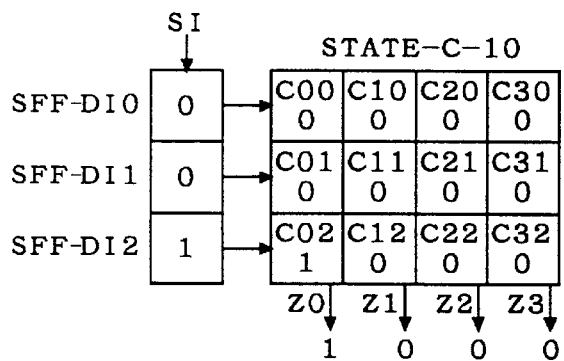

The steps 1005 and 1006 are similarly repeated to check the content addressable memory cell C0j for failure in Cases 1 and 2 until the row number j corresponding to the last row number reaches (m−1) (=3−1=2) (FIGS. 95 and 96).

The row number is initialized again in the step 1009. The processing in the steps 1009 to 1013 is similar to the processing in the steps 1004 to 1008 except that the value "0" is shifted in the scan flip-flop SFF-DI0 since the input signal DI2 has been "1".

The execution of the steps 1009 to 1013 allows the content addressable memory cell C0j to be checked for failure in Cases 3 and 4 (FIGS. 97 through 102).

Figure 102:
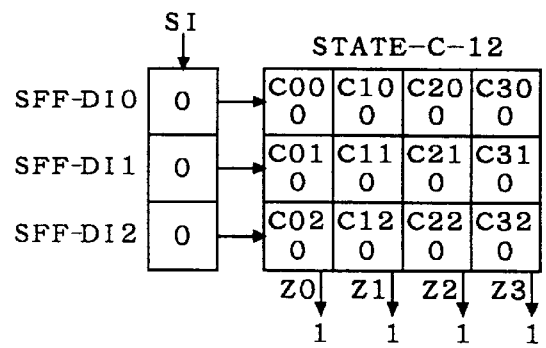
Figure 103:
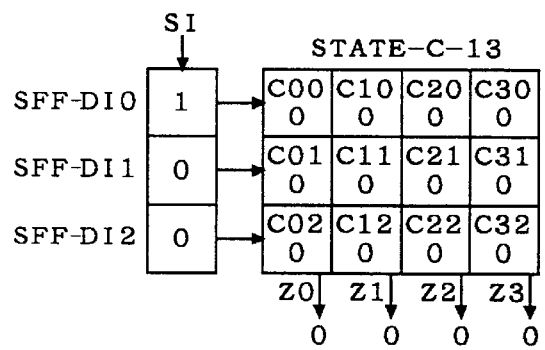
Figure 104:
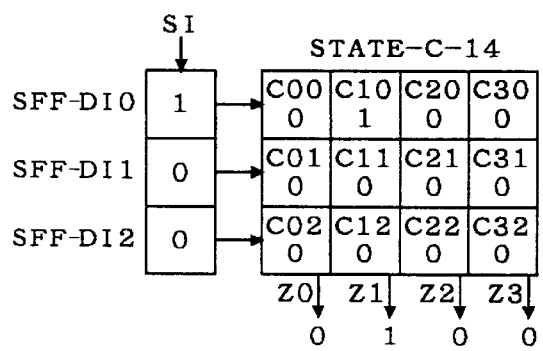
Figure 105:
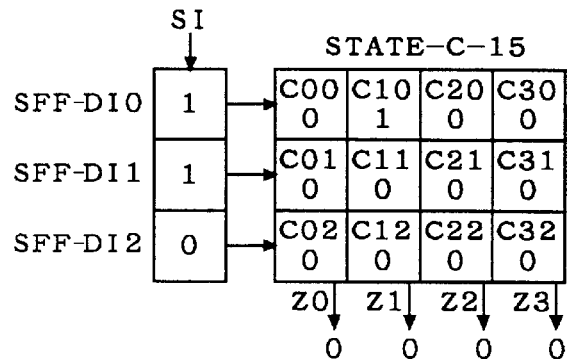
Figure 106:
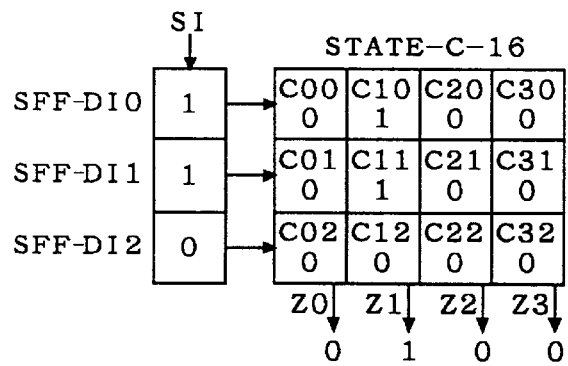
Figure 107:
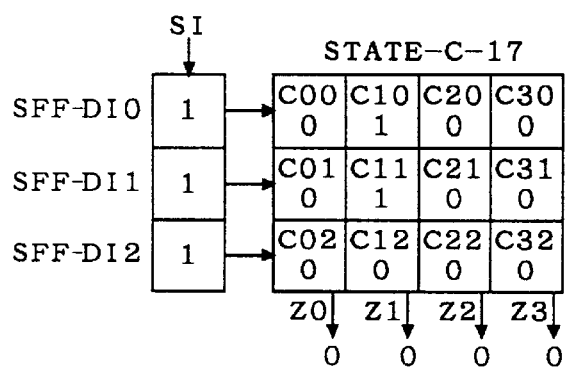
Figure 108:
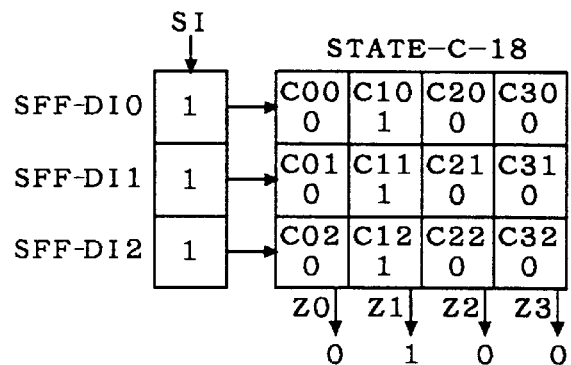
Figure 109:
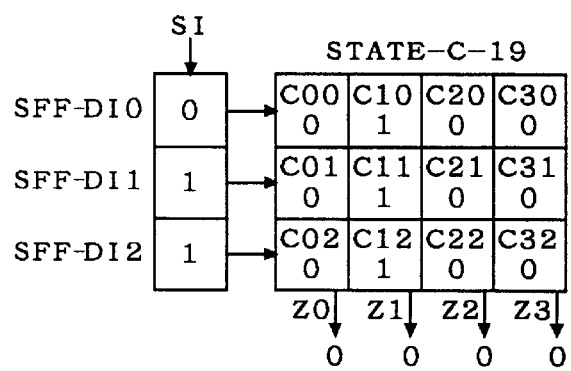
Figure 110:
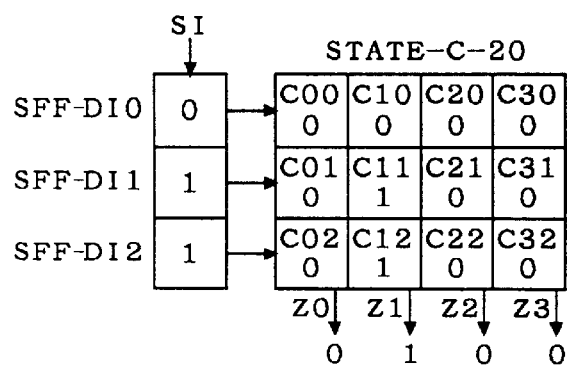
Figure 111:
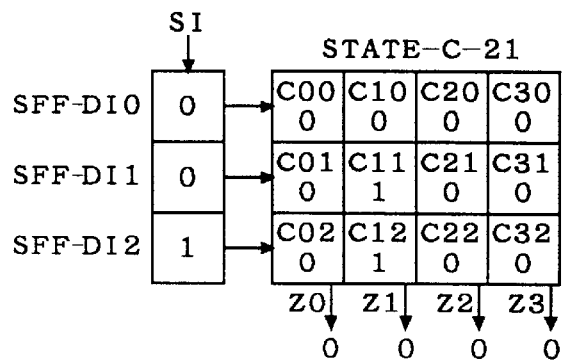
Figure 112:
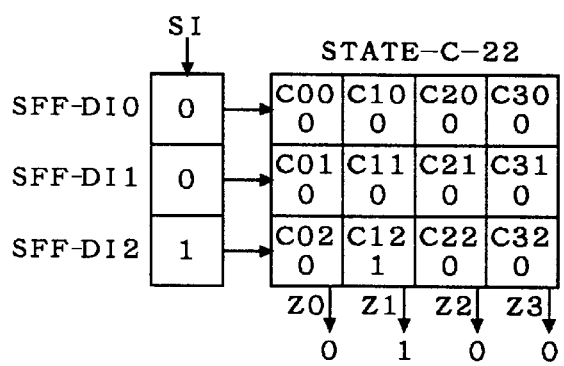
Figure 113:
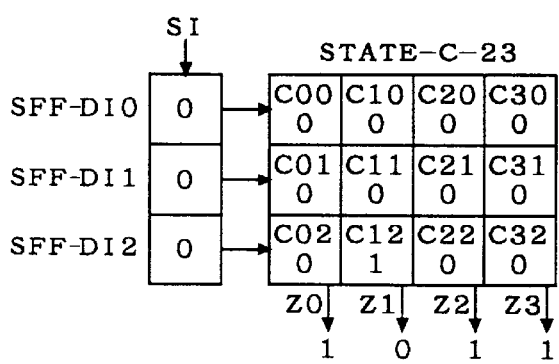
Figure 114:
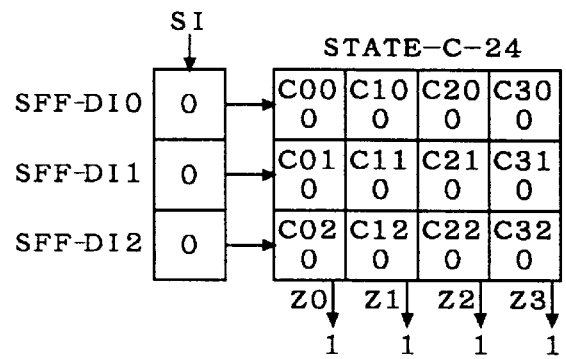
Figure 115:
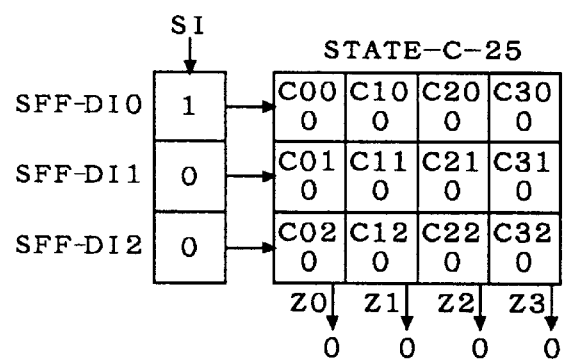
Figure 116:
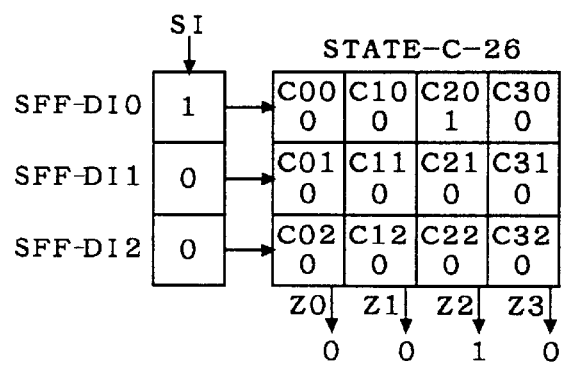
Figure 117:
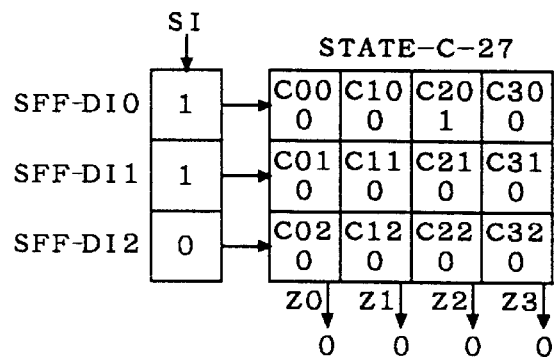
Figure 118:
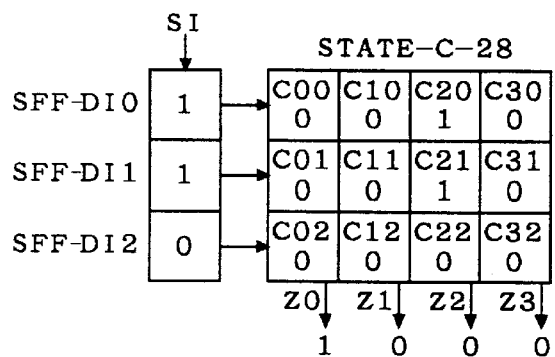
Figure 119:
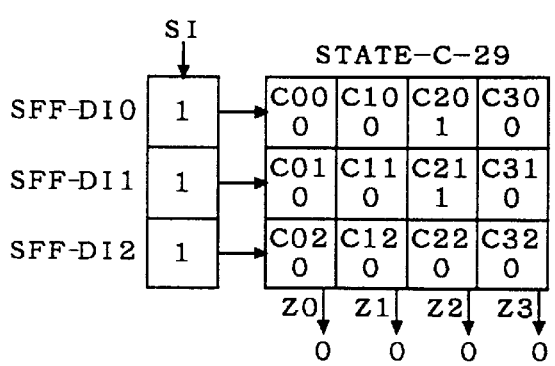
Figure 120:
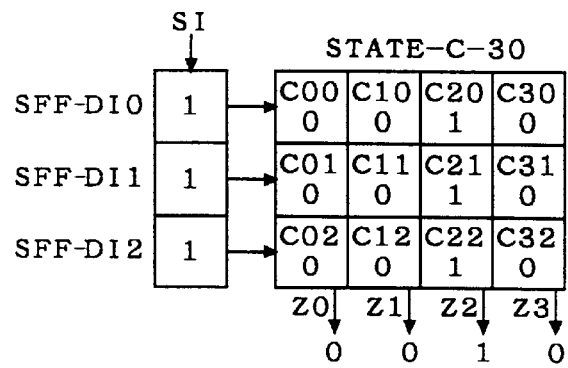
Figure 121:
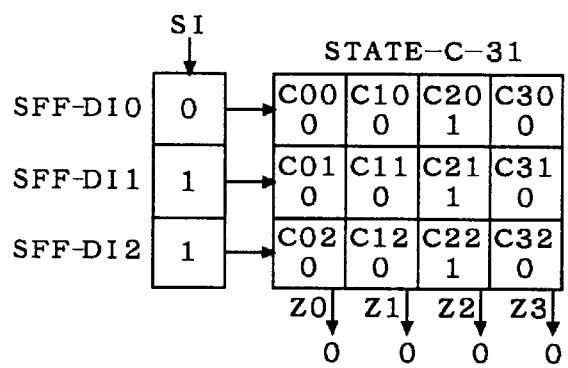
Figure 122:
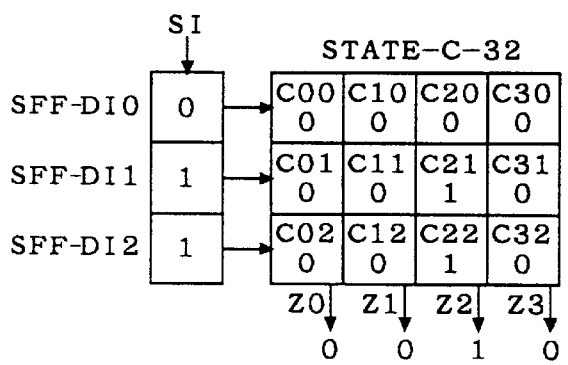
Figure 123:
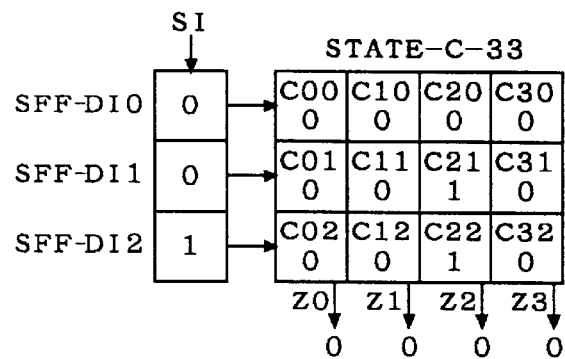
Figure 124:
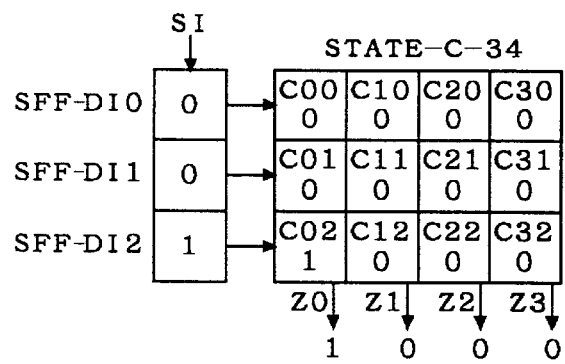
Figure 125:
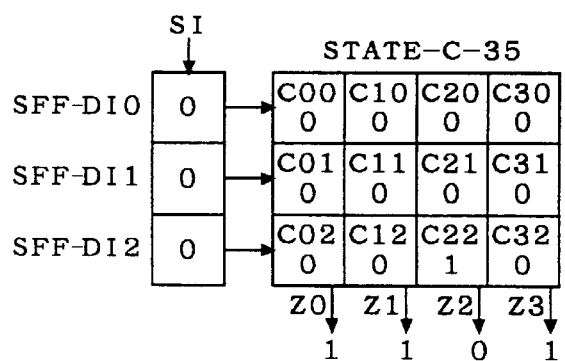
Figure 126:
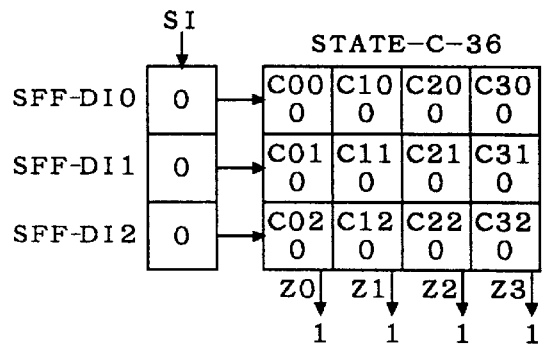
Figure 127:
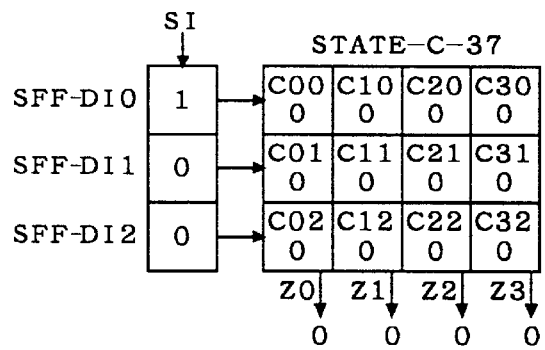
Figure 128:
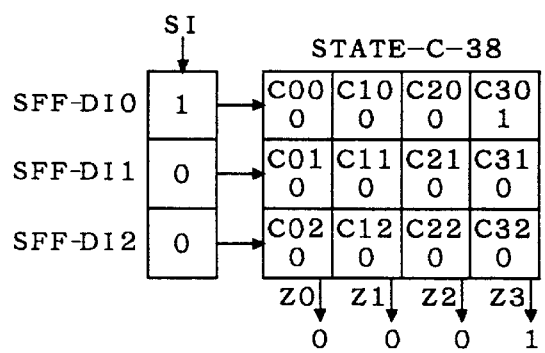
Figure 129:
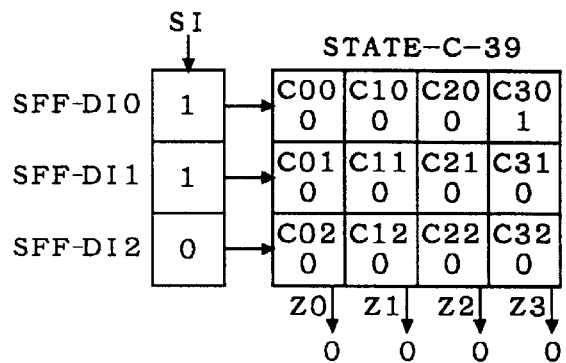
Figure 130:
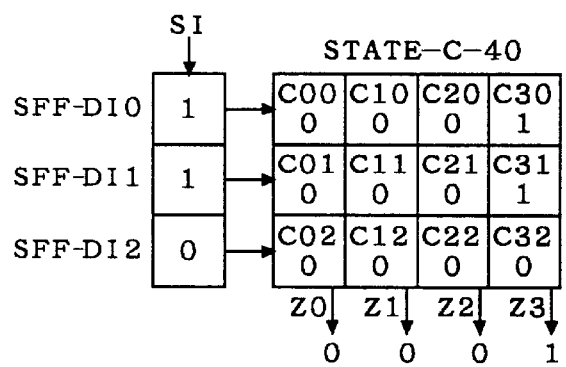
Figure 131:
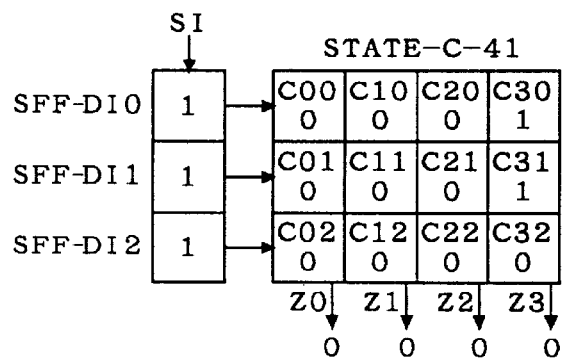
Figure 132:
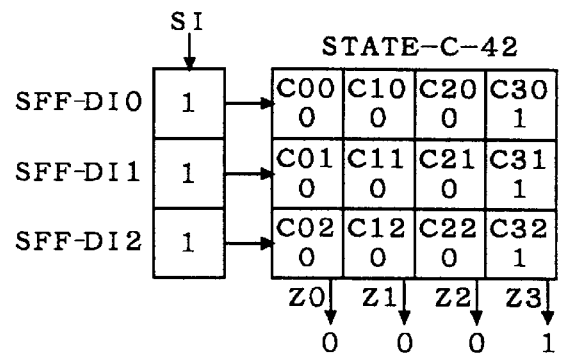
Figure 133:
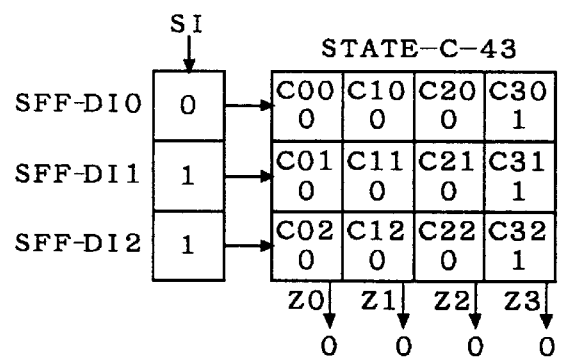
Figure 134:
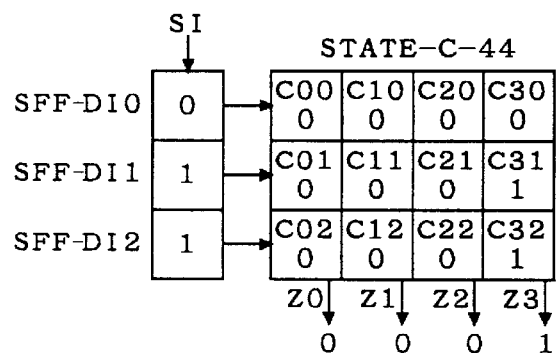
Figure 135:
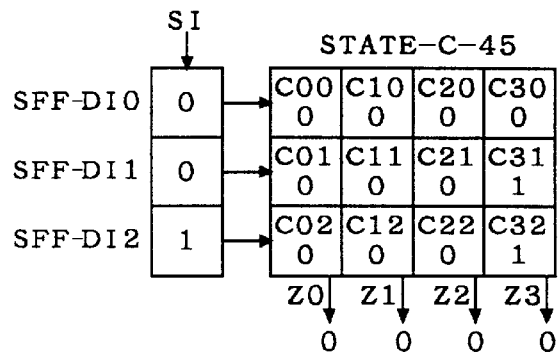
Figure 136:
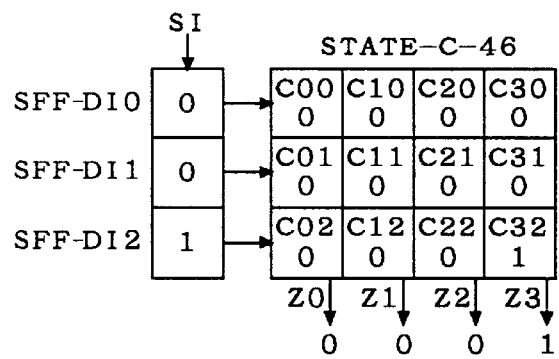
Figure 137:
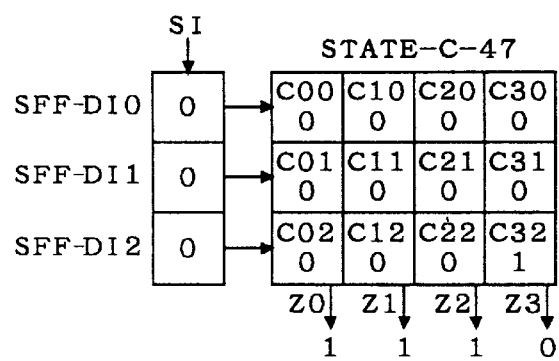

When shift-in up to the (m−1)-th row is completed, the test pattern is (0, 0, 0). When the test pattern (0, 0, 0) is written to the memory cells in the zeroth column (step 1011), the column of the memory cells to be written is updated in the steps 1014 and 1015. Referring to FIG. 102, the memory cells in the first column are to be written next in the step 1015 since the column number i has been "0". The flow returns to the step 1004 through the connector J4, and a new test pattern (1, 0, 0) is written to the content addressable memory cell C1j in the first column in the step 1005. FIGS. 103 through 108 show states of data wherein the content addressable memory cell C1j in the first column is checked for failure in Cases 1 and 2, and FIGS. 109 through 114 show states of data wherein the memory cell C1j is checked for failure in Cases 3 and 4.

Likewise, the column of the memory cells to be written is updated in sequential order. FIGS. 115 through 120 show states of data wherein the content addressable memory cell C2j in the second column is checked for failure in Cases 1 and 2, and FIGS. 121 through 126 show states of data wherein the memory cell C2j is checked for failure in Cases 3 and 4. FIGS. 127 through 132 show states of data wherein the content addressable memory cell C3j in the third column is checked for failure in Cases 1 and 2, and FIGS. 133 through 137 and FIG. 90 show states of data wherein the memory cell C3j is checked for failure in Cases 3 and 4.

In this manner, the third technique, similar to the first technique, may check all memory cells for failure in Cases 1 to 4.

(c-3-1) Circuit for Implementing Third Technique

The circuit shown in FIGS. 1 and 2 showing the precursory concepts of the present invention may be subjected to the third technique shown in FIGS. 88 and 89 by the shift-in of the scan input signal SIDI forming a suitable test pattern. However, the value of the input signal DIj must be held when written to the CAM 100, and it is hence preferred to use the scan flip-flops with a hold function shown in FIG. 7. If not so, the clock signal T must be suitably controlled for the hold operation.

A circuit for automatically producing a suitable test pattern to implement the third technique is described below.

Tenth Preferred Embodiment

Figure 138:
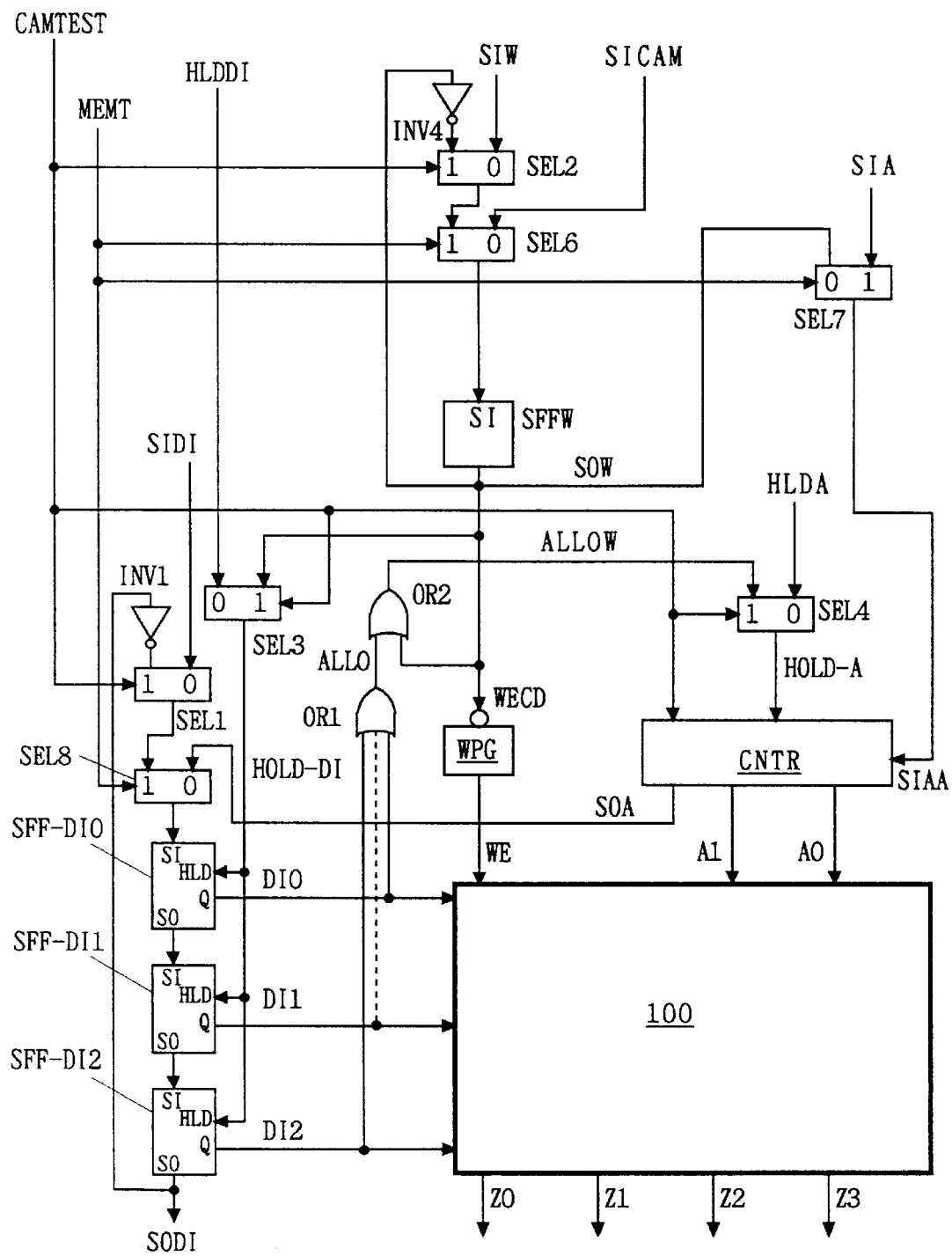
FIG. 138 is a circuit diagram of a tenth preferred embodiment according to the present invention.

FIG. 138 is a circuit diagram of a CAM test circuit for implementing the third technique. The CAM 100 to be tested is illustrated in FIG. 138 such that the number of bits (the number of rows) m of the input signal is 3 and the number of columns n is 4. Similar to the circuit of FIG. 40, this circuit is shown with portions which are not directly related to the test of the CAM 100 dispensed with.

The address signals A0, A1 are generated by the address counter CNTR which performs counting at least during the CAM test. The address hold signal HOLD-A causes the address counter CNTR to hold its value during counting independently of transition of the clock signal T not shown. The selector SEL4 selects the address hold raw signal HLDA or a signal ALLOW as the address hold signal HOLD-A.

The address counter CNTR may update its value in response to the scan address input SIAA. The selector SEL7 selects the scan address input raw signal SIA or the write raw signal WECD as the scan address input SIAA.

The arrangement of FIG. 138 is identical with that of FIG. 40 in connection between the selectors SEL1 to SEL4, SEL8, the flip-flop SFF-DIj, the inverter INV1, the address counter CNTR, the scan flip-flop SFFW, and the write pulse generator WPG, and in portions of these components for receiving the scan path control signal MEMT, the test signal CAMTEST, the scan input signal SIDI, the input hold raw signal HLDDI, the scan signal SOA, and the unified scan input signal SICAM.

The write raw signal WECD is applied to the 1-input of the selector SEL3. The 1-input of the selector SEL2 is connected to the output of an inverter INV4 and receives the inverted version of the write raw signal WECD. The last address detecting circuit LADET is not provided.

OR circuits OR1 and OR2 determine the OR of the write raw signal WECD and the input signal DIj to produce the signal ALLOW.

Tables 6 and 7 are a logic table of the signals for illustrating the circuit operation of FIG. 138 for each period of the clock signal T. The data output DOj and column coincidence signal Zi shown in FIG. 4 are also illustrated in Tables 6 and 7.

TABLE 6

| period | CAM-TEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 0 | x | x | x | x | x | x | x | x | x | x | x | x | x | x | x | x | x | x | x | x | x |
| | | | | | | | | shift in 0 to DI | | | | | | | | | | | | | |
| 1 | 0 | 0 | x | 1 | 0 | 0 | x | x | x | x | 0 | x | x | 1 | x | x | x | x | x | x | x |
| 2 | 0 | 0 | x | 1 | 0 | 0 | x | x | x | x | 0 | 0 | x | 1 | x | x | x | x | x | x | x |
| 3 | 0 | 0 | x | 1 | 0 | 0 | x | x | x | x | 0 | 0 | 0 | 1 | x | x | x | x | x | x | x |
| | | | | | | | | write 0 for all address | | | | | | | | | | | | | |
| 4 | 0 | x | 0 | 1 | 1 | 1 | 0 | 0 | 0 | x | 0 | 0 | 0 | 1 | x | x | x | x | x | x | x |
| 5 | 0 | x | 0 | 0 | 1 | 1 | 0 | 0 | 0 | 0 | 0 | 0 | 0 | 0 | 1 | x | x | x | 0 | 0 | 0 |
| 6 | 0 | x | 1 | 0 | 1 | 1 | 0 | 0 | 1 | 0 | 0 | 0 | 0 | 0 | 1 | x | 1 | x | 0 | 0 | 0 |
| 7 | 0 | x | 1 | 0 | 1 | 1 | 0 | 0 | 1 | 1 | 0 | 0 | 0 | 0 | 1 | x | 1 | 1 | 0 | 0 | 0 |
| 8 | 0 | x | 0 | 0 | 1 | 1 | 0 | 0 | 0 | 1 | 0 | 0 | 0 | 0 | 1 | 1 | 1 | 1 | 0 | 0 | 0 |
| | | | | | | | | shift in last address | | | | | | | | | | | | | |
| 9 | 0 | x | 1 | 1 | 1 | 1 | 0 | 0 | 1 | 0 | 0 | 0 | 0 | 1 | 1 | 1 | 1 | 1 | 0 | 0 | 0 |
| 10 | 0 | x | 1 | 1 | 1 | 1 | 0 | 0 | 1 | 1 | 0 | 0 | 0 | 1 | 1 | 1 | 1 | 1 | 0 | 0 | 0 |
| | | | | | | | | set SFFW(WECD)=0 | | | | | | | | | | | | | |
| 11 | 0 | x | x | 0 | 1 | 1 | 1 | 1 | 1 | 1 | 0 | 0 | 0 | 0 | 1 | 1 | 1 | 1 | 0 | 0 | 0 |
| | | | | | | | | run CAM BIST | | | | | | | | | | | | | |
| 12 | 1 | x | x | x | x | 1 | x | 1 | 0 | 0 | 1 | 0 | 0 | 1 | 0 | 0 | 0 | 0 | 0 | 0 | 0 |
| 13 | 1 | x | x | x | x | 0 | x | 1 | 0 | 0 | 1 | 0 | 0 | 0 | 1 | 0 | 0 | 0 | 1 | 0 | 0 |
| 14 | 1 | x | x | x | x | 1 | x | 1 | 0 | 0 | 1 | 1 | 0 | 1 | 0 | 0 | 0 | 0 | 1 | 0 | 0 |
| 15 | 1 | x | x | x | x | 0 | x | 1 | 0 | 0 | 1 | 1 | 0 | 0 | 1 | 0 | 0 | 0 | 1 | 1 | 0 |
| 16 | 1 | x | x | x | x | 1 | x | 1 | 0 | 0 | 1 | 1 | 1 | 1 | 0 | 0 | 0 | 0 | 1 | 1 | 0 |
| 17 | 1 | x | x | x | x | 0 | x | 1 | 0 | 0 | 1 | 1 | 1 | 0 | 1 | 0 | 0 | 0 | 1 | 1 | 1 |
| 18 | 1 | x | x | x | x | 1 | x | 1 | 0 | 0 | 0 | 1 | 1 | 1 | 0 | 0 | 0 | 0 | 1 | 1 | 1 |
| 19 | 1 | x | x | x | x | 0 | x | 1 | 0 | 0 | 0 | 1 | 1 | 0 | 1 | 0 | 0 | 0 | 0 | 1 | 1 |
| 20 | 1 | x | x | x | x | 1 | x | 1 | 0 | 0 | 0 | 0 | 1 | 1 | 0 | 0 | 0 | 0 | 0 | 1 | 1 |
| 21 | 1 | x | x | x | x | 0 | x | 1 | 0 | 0 | 0 | 0 | 1 | 0 | 1 | 0 | 0 | 0 | 0 | 0 | 1 |
| 22 | 1 | x | x | x | x | 1 | x | 1 | 0 | 0 | 0 | 0 | 0 | 1 | 0 | 1 | 1 | 1 | 0 | 0 | 1 |
| 23 | 1 | x | x | x | x | 0 | x | 0 | 0 | 0 | 0 | 0 | 0 | 0 | 1 | 1 | 1 | 1 | 0 | 0 | 0 |
| 24 | 1 | x | x | x | x | 1 | x | 1 | 0 | 1 | 1 | 0 | 0 | 1 | 0 | 0 | 0 | 0 | 0 | 0 | 0 |
| 25 | 1 | x | x | x | x | 0 | x | 1 | 0 | 1 | 1 | 0 | 0 | 0 | 0 | 1 | 0 | 0 | 1 | 0 | 0 |
| 26 | 1 | x | x | x | x | 1 | x | 1 | 0 | 1 | 1 | 1 | 0 | 1 | 0 | 0 | 0 | 0 | 1 | 0 | 0 |
| 27 | 1 | x | x | x | x | 0 | x | 1 | 0 | 1 | 1 | 1 | 0 | 0 | 0 | 1 | 0 | 0 | 1 | 1 | 0 |
| 28 | 1 | x | x | x | x | 1 | x | 1 | 0 | 1 | 1 | 1 | 1 | 1 | 0 | 0 | 0 | 0 | 1 | 1 | 0 |
| 29 | 1 | x | x | x | x | 0 | x | 1 | 0 | 1 | 1 | 1 | 1 | 0 | 0 | 1 | 0 | 0 | 1 | 1 | 1 |
| 30 | 1 | x | x | x | x | 1 | x | 1 | 0 | 1 | 0 | 1 | 1 | 1 | 0 | 0 | 0 | 0 | 1 | 1 | 1 |
| 31 | 1 | x | x | x | x | 0 | x | 1 | 0 | 1 | 0 | 1 | 1 | 0 | 0 | 1 | 0 | 0 | 0 | 1 | 1 |
| 32 | 1 | x | x | x | x | 1 | x | 1 | 0 | 1 | 0 | 0 | 1 | 1 | 0 | 0 | 0 | 0 | 0 | 1 | 1 |
| 33 | 1 | x | x | x | x | 0 | x | 1 | 0 | 1 | 0 | 0 | 1 | 0 | 0 | 1 | 0 | 0 | 0 | 0 | 1 |

TABLE 6-continued

| period | CAM-TEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 34 | 1 | x | x | x | x | 1 | x | 1 | 0 | 1 | 0 | 0 | 0 | 1 | 1 | 0 | 1 | 1 | 0 | 0 | 1 |
| 35 | 1 | x | x | x | x | 0 | x | 0 | 0 | 1 | 0 | 0 | 0 | 0 | 1 | 1 | 1 | 1 | 0 | 0 | 0 |

TABLE 7

| period | CAM-TEST: | SIDI: | SIA: | SIW: | HLDDI: | HOLD-DI: | HLDA: | HOLD-A: | A1: | A0: | DI0: | DI1: | DI2: | WECD: | Z0: | Z1: | Z2: | Z3: | DO0: | DO1: | DO2: |
|---|---|---|---|---|---|---|---|---|---|---|---|---|---|---|---|---|---|---|---|---|---|
| 36 | 1 | x | x | x | x | 1 | x | 1 | 1 | 0 | 1 | 0 | 0 | 1 | 0 | 0 | 0 | 0 | 0 | 0 | 0 |
| 37 | 1 | x | x | x | x | 0 | x | 1 | 1 | 0 | 1 | 0 | 0 | 0 | 0 | 0 | 1 | 0 | 1 | 0 | 0 |
| 38 | 1 | x | x | x | x | 1 | x | 1 | 1 | 0 | 1 | 1 | 0 | 1 | 0 | 0 | 0 | 0 | 1 | 0 | 0 |
| 39 | 1 | x | x | x | x | 0 | x | 1 | 1 | 0 | 1 | 1 | 0 | 0 | 0 | 0 | 1 | 0 | 1 | 1 | 0 |
| 40 | 1 | x | x | x | x | 1 | x | 1 | 1 | 0 | 1 | 1 | 1 | 1 | 0 | 0 | 0 | 0 | 1 | 1 | 0 |
| 41 | 1 | x | x | x | x | 0 | x | 1 | 1 | 0 | 1 | 1 | 1 | 0 | 0 | 0 | 1 | 0 | 1 | 1 | 1 |
| 42 | 1 | x | x | x | x | 1 | x | 1 | 1 | 0 | 0 | 1 | 1 | 1 | 0 | 0 | 0 | 0 | 1 | 1 | 1 |
| 43 | 1 | x | x | x | x | 0 | x | 1 | 1 | 0 | 0 | 1 | 1 | 0 | 0 | 0 | 1 | 0 | 0 | 1 | 1 |
| 44 | 1 | x | x | x | x | 1 | x | 1 | 1 | 0 | 0 | 0 | 1 | 1 | 0 | 0 | 0 | 0 | 0 | 1 | 1 |
| 45 | 1 | x | x | x | x | 0 | x | 1 | 1 | 0 | 0 | 0 | 1 | 0 | 0 | 0 | 1 | 0 | 0 | 0 | 1 |
| 46 | 1 | x | x | x | x | 1 | x | 1 | 1 | 0 | 0 | 0 | 0 | 1 | 1 | 1 | 0 | 1 | 0 | 0 | 1 |
| 47 | 1 | x | x | x | x | 0 | x | 0 | 1 | 0 | 0 | 0 | 0 | 0 | 1 | 1 | 1 | 1 | 0 | 0 | 0 |
| 48 | 1 | x | x | x | x | 1 | x | 1 | 1 | 1 | 1 | 0 | 0 | 1 | 0 | 0 | 0 | 0 | 0 | 0 | 0 |
| 49 | 1 | x | x | x | x | 0 | x | 1 | 1 | 1 | 1 | 0 | 0 | 0 | 0 | 0 | 0 | 1 | 1 | 0 | 0 |
| 50 | 1 | x | x | x | x | 1 | x | 1 | 1 | 1 | 1 | 1 | 0 | 1 | 0 | 0 | 0 | 0 | 1 | 0 | 0 |
| 51 | 1 | x | x | x | x | 0 | x | 1 | 1 | 1 | 1 | 1 | 0 | 0 | 0 | 0 | 0 | 1 | 1 | 1 | 0 |
| 52 | 1 | x | x | x | x | 1 | x | 1 | 1 | 1 | 1 | 1 | 1 | 1 | 0 | 0 | 0 | 0 | 1 | 1 | 0 |
| 53 | 1 | x | x | x | x | 0 | x | 1 | 1 | 1 | 1 | 1 | 1 | 0 | 0 | 0 | 0 | 1 | 1 | 1 | 1 |
| 54 | 1 | x | x | x | x | 1 | x | 1 | 1 | 1 | 0 | 1 | 1 | 1 | 0 | 0 | 0 | 0 | 1 | 1 | 1 |
| 55 | 1 | x | x | x | x | 0 | x | 1 | 1 | 1 | 0 | 1 | 1 | 0 | 0 | 0 | 0 | 1 | 0 | 1 | 1 |
| 56 | 1 | x | x | x | x | 1 | x | 1 | 1 | 1 | 0 | 0 | 1 | 1 | 0 | 0 | 0 | 0 | 0 | 1 | 1 |
| 57 | 1 | x | x | x | x | 0 | x | 1 | 1 | 1 | 0 | 0 | 1 | 0 | 0 | 0 | 0 | 1 | 0 | 0 | 1 |
| 58 | 1 | x | x | x | x | 1 | x | 1 | 1 | 1 | 0 | 0 | 0 | 1 | 1 | 1 | 1 | 0 | 0 | 0 | 1 |
| 59 | 1 | x | x | x | x | 0 | x | 0 | 1 | 1 | 0 | 0 | 0 | 0 | 1 | 1 | 1 | 1 | 0 | 0 | 0 |

The circuit of FIG. 138 operates on the basis of the timing chart of FIG. 41.

The operation in the steps 1001 and 1002 is similar to the operation in the steps 801 and 802. When the test signal CAMTEST is "0", the address counter CNTR outputs the address signal A1, A0 determined by the scan address input SIAA if the scan path control signal MEMT is "1", the selector SEL6 and scan flip-flop SFFW select the scan write signal SIW as the write raw signal WECD, and the selector SEL1 selects the scan input signal SIDI as a shift-input to the scan flip-flop SFF-DI0. Thus, the logics of the signals during the zeroth to eighth periods are identical with those of Table 1. The state of data after the execution of the steps 1001, 1002 is shown in FIG. 90.

The circuit of FIG. 138, similar to the circuit of FIG. 40, includes one scan path formed when the scan path control signal MEMT is "0" to transmit required logics by the unified scan input SICAM.

Preparations for the step 1003 are made during the ninth and tenth periods. The test signal CAMTEST remains "0", and the scan input signal SIW is set to "1". The write enable signal WE is "0" to inhibit writing to the CAM 100. The selector SEL3 selects the input hold raw signal HLDDI as the input hold signal HOLD-DI which in turn is applied to the scan flip-flop SFF-DIj. The value of the input hold signal HOLD-DI is "1" to inhibit the update of the test pattern. In this state, the scan signal SIA is "1" (ninth period) and "1" (tenth period) to select the word line WL3 in the last column. Thus, the logics of the signals during the ninth and tenth periods are identical with those of Table 1.

During the eleventh period, the address hold raw signal HLDA is set to "1", and the address signals A1, A0 both having been set to "1" are held. Then, the value of the scan address input signal SIA is not specified. The scan write signal SIW is set to "0", and the value "0" is stored in the scan flip-flop SFFW. Thus, the logics of the signals during the eleventh period are identical with those of Table 1.

The CAM is tested during the twelfth to fifty-ninth periods over which the test signal CAMTEST is "1". It is hence unnecessary to specify the scan input signal SIDI, the scan write signal SIW, the input hold raw signal HLDDI, and the address hold raw signal HLDA which are applied to the 0-input of the selectors SEL1 to SEL4 controlled by the test signal CAMTEST. Further, since the address counter CNTR exhibits its counting function in response to the test signal CAMTEST which is "1", the scan address input signal SIA is not specified.

As described with reference to Table 1, the address hold signal HOLD-A becomes "0" when the clock signal T makes a transition which starts the twelfth period, permitting the counting of the address counter CNTR. Then the values of the address signals A1, A0 are updated from (1, 1) to (0, 0). On the other hand, the inverter INV4 functions to invert the write raw signal WECD which has been "0" during the eleventh period to provide the value "1". The value "1" is used as the write raw signal WECD through the selectors SEL2 and SEL6. This sets the write enable signal WE to "0". Writing to the content addressable memory cells C00, C01, C02 is inhibited during the twelfth period.

As indicated by Table 1, the content stored in the scan flip-flop SFF-DIj is updated when the clock signal T makes a transition which starts the twelfth period, that is, before the address signals A1, A0 are updated from (1, 1) to (0, 0) (this update is performed after the operation of the address counter CNTR in response to the clock signal T). Then the test pattern is updated from (0, 0, 0) to (1, 0, 0) to achieve the states shown in FIG. 91.

The inverter INV4 functions to set the write raw signal WECD to "0" during the thirteenth period. The write enable signal WE is changed to "1", permitting writing to the content addressable memory cell C0j as shown in FIG. 92.

In this manner, the inverter INV4 causes the write raw signal WECD to alternately repeat the values "0" and "1" for each clock cycle. That is, the CAM 100 is written in every other clock cycle. During the non-write cycles, the inverter INV1 executes the shift-in operation.

Subsequently, update of the test pattern until (0, 0, 0) and writing to the content addressable memory cell C0j in the zeroth column are alternately executed. This corresponds to the execution of the steps 1005, 1006, 1010, 1011 until the execution of the step 1015 (the twelfth to twenty-third periods).

The OR circuit OR1 monitors the test pattern so as not to change the column number of the memory cells to be written until the test pattern becomes (0, 0, 0). The OR circuit OR1 sets a 0-coincidence signal ALL0 to "0" only when the test pattern is (0, 0, 0). As a result, the signal ALLOW is "1" and the address hold signal HOLD-A is "1" to inhibit the address update by the counter CNTR.

Writing to the CAM requires less test patterns as described in relation to the first technique. The third technique requires the six patterns indicated by the symbol ✗ but does not require patterns including equal values on opposite ends and other values different from the opposite end values such as (1, 0, 1) and (0, 1, 0). The OR circuit OR1 should determine whether or not both of the input signals DI0 and DI2 are "0" but need not consider the value of the input signal DI1. One of the inputs of the OR circuit OR1 which is connected to the input signal DI1 is shown in broken line to mean that it may be dispensed with in view of the above described circumstances.

Figure 101:
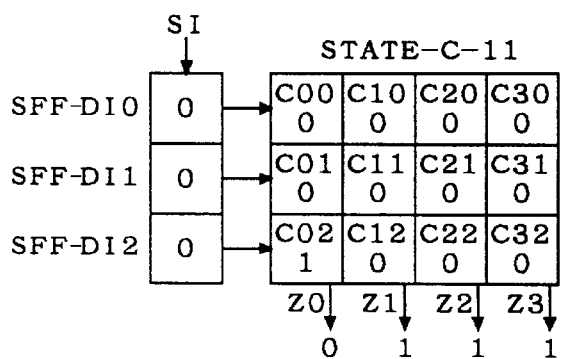

During the twenty-second period, writing to the content addressable memory cell C0j in the zeroth column has not been completed while the test pattern is (0, 0, 0) (FIG. 101). The column number must be updated after writing to the content addressable memory cell C0j is completed. To meet this control requirement, the OR circuit OR2 is provided. The signal ALLOW is "0" when both of the 0-coincidence signal ALL0 and the write raw signal WECD are "0" for write operation (FIG. 102). The signal ALLOW is applied to the counter CNTR through the selector SEL4 to permit the counter CNTR to update the address (the value "0"; the twenty-third period).

Subsequently, the operation similar to that during the twelfth to twenty-third periods (FIGS. 91 through 102) are repeated (the twenty-fourth to thirty-fifth periods: FIGS. 103 through 114, the thirty-sixth to fourth-seventh periods: FIGS. 115 through 126, the forth-eighth to fifty-ninth periods: FIGS. 127 through 139 and FIG. 90) while the column number is updated (step 1015). The third technique is implemented in this manner.

(c-3-2) Generation of Expected Value

To determine failures from the column coincidence signal Zi provided by the third technique like the first and second techniques, it is necessary to obtain the expected value. A technique for providing such an expected value in synchronism with the generation of the column coincidence signal Zi will be discussed below. It is assumed that the number of columns n is 4 herein as in the third preferred embodiment.

Table 8 is a logic table showing the expected values E0, E1, E2, E3 in the respective states in chronological order. These contents are shown in FIGS. 90 through 137 in the form of the column coincidence signals Z0, Z1, Z2, Z3. The arrow in the table indicates that the states form a loop.

TABLE 8

| | E0 | E1 | E2 | E3 | | E0 | E1 | E2 | E3 |
|---|---|---|---|---|---|---|---|---|---|
| STATE-C-0 | 1 | 1 | 1 | 1 | STATE-C-24 | 1 | 1 | 1 | 1 |
| STATE-C-1 | 0 | 0 | 0 | 0 | STATE-C-25 | 0 | 0 | 0 | 0 |
| STATE-C-2 | 1 | 0 | 0 | 0 | STATE-C-26 | 0 | 0 | 1 | 0 |
| STATE-C-3 | 0 | 0 | 0 | 0 | STATE-C-27 | 0 | 0 | 0 | 0 |
| STATE-C-4 | 1 | 0 | 0 | 0 | STATE-C-28 | 0 | 0 | 1 | 0 |
| STATE-C-5 | 0 | 0 | 0 | 0 | STATE-C-29 | 0 | 0 | 0 | 0 |
| STATE-C-6 | 1 | 0 | 0 | 0 | STATE-C-30 | 0 | 0 | 1 | 0 |
| STATE-C-7 | 0 | 0 | 0 | 0 | STATE-C-31 | 0 | 0 | 0 | 0 |
| STATE-C-8 | 1 | 0 | 0 | 0 | STATE-C-32 | 0 | 0 | 1 | 0 |
| STATE-C-9 | 0 | 0 | 0 | 0 | STATE-C-33 | 0 | 0 | 0 | 0 |
| STATE-C-10 | 1 | 0 | 0 | 0 | STATE-C-34 | 0 | 0 | 1 | 0 |
| STATE-C-11 | 0 | 1 | 1 | 1 | STATE-C-35 | 1 | 1 | 0 | 1 |
| STATE-C-12 | 1 | 1 | 1 | 1 | STATE-C-36 | 1 | 1 | 1 | 1 |
| STATE-C-13 | 0 | 0 | 0 | 0 | STATE-C-37 | 0 | 0 | 0 | 0 |
| STATE-C-14 | 0 | 1 | 0 | 0 | STATE-C-38 | 0 | 0 | 0 | 1 |
| STATE-C-15 | 0 | 0 | 0 | 0 | STATE-C-39 | 0 | 0 | 0 | 0 |
| STATE-C-16 | 0 | 1 | 0 | 0 | STATE-C-40 | 0 | 0 | 0 | 1 |
| STATE-C-17 | 0 | 0 | 0 | 0 | STATE-C-41 | 0 | 0 | 0 | 0 |
| STATE-C-18 | 0 | 1 | 0 | 0 | STATE-C-42 | 0 | 0 | 0 | 1 |
| STATE-C-19 | 0 | 0 | 0 | 0 | STATE-C-43 | 0 | 0 | 0 | 0 |
| STATE-C-20 | 0 | 1 | 0 | 0 | STATE-C-44 | 0 | 0 | 0 | 1 |
| STATE-C-21 | 0 | 0 | 0 | 0 | STATE-C-45 | 0 | 0 | 0 | 0 |
| STATE-C-22 | 0 | 1 | 0 | 0 | STATE-C-46 | 0 | 0 | 0 | 1 |
| STATE-C-23 | 1 | 0 | 1 | 1 | STATE-C-47 | 1 | 1 | 1 | 0 |

Figure 139:
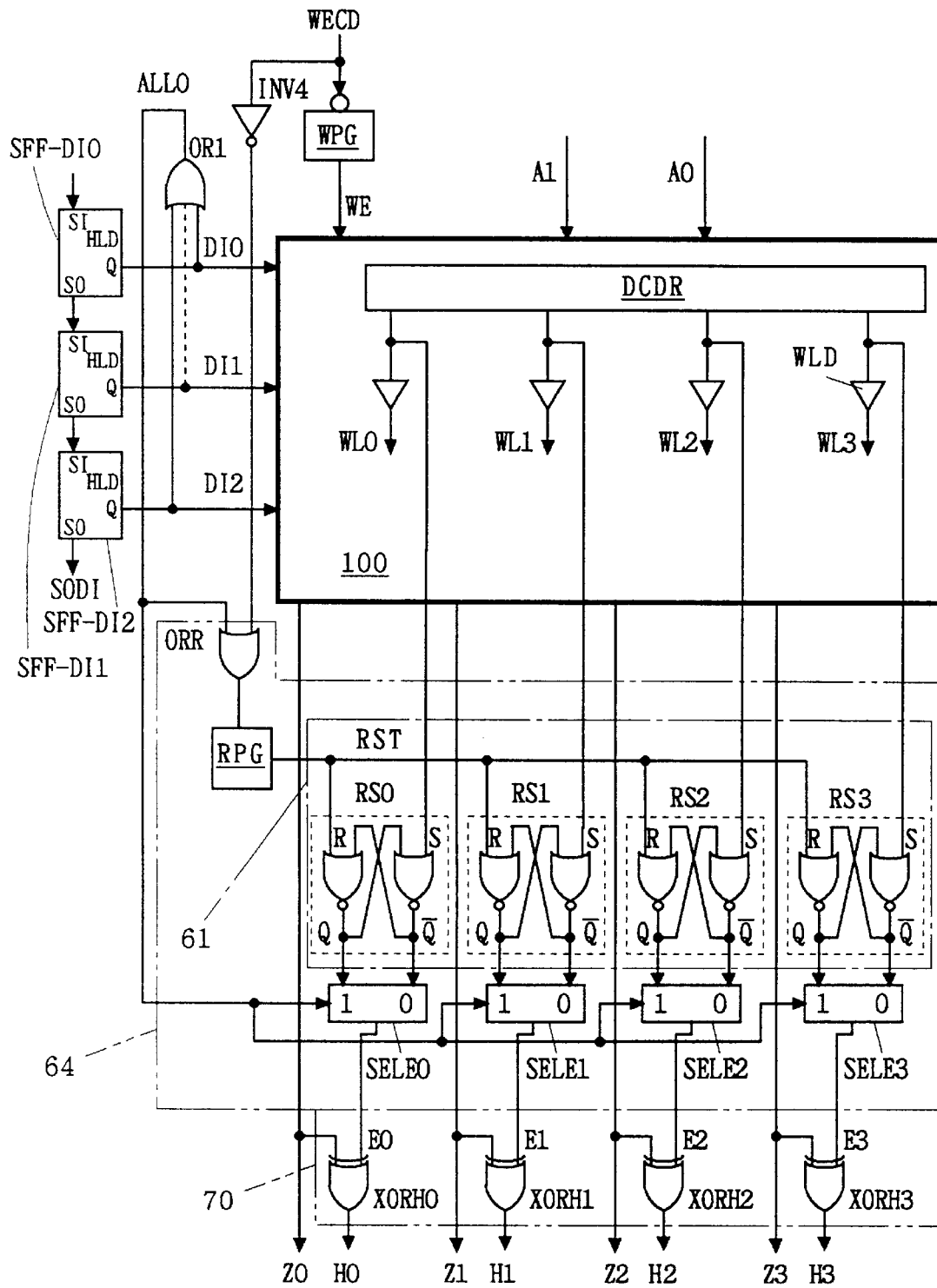

FIG. 139 illustrates an expected value generator circuit 64 for generating the expected values E0, E1, E2, E3. Also shown in FIG. 139 are the write pulse generator WPG of FIG. 138, the write raw signal WECD to be applied to the write pulse generator WPG, the 0-coincidence signal ALL0, the inverter INV4 for inverting the write raw signal WECD, and the comparator circuit 70 for comparing the expected values E0, E1, E2, E3 with the column coincidence signals Z0, Z1, Z2, Z3.

The expected value generator circuit 64 comprises the expected value generator circuit 61, an OR circuit ORR, a reset pulse generator circuit RPG, and selectors SELE0, SELE1, SELE2, SELE3.

The output Xi is applied to the set terminal S of the RS flip-flop RSi of the expected value generator circuit 61. The reset pulse generator circuit RPG applies the reset signal RST to the reset terminal R of all of the RS flip-flops RSi.

The Q and $\overline{Q}$ outputs from the RS flip-flop RSi are applied to the 1-input and 0-input of the selector SELEi, respectively. The selector SELEi is controlled by the 0-coincidence signal ALL0 and has an output serving as the excepted value Ei.

The OR circuit ORR applies the OR of the 0-coincidence signal ALL0 and the output from the inverter INV4 to the reset pulse generator circuit RPG.

The reset pulse is not generated only when the write raw signal WECD is "1" and the 0-coincidence signal ALL0 is "0" (corresponding to STATE-C-11, STATE-C-23, STATE-C-35, STATE-C-47). In other cases wherein the write raw signal WECD is "0" (the output from the inverter INV4 is "1") or the 0-coincidence signal ALL0 is "1", the reset pulse RST is "1".

Thus, the RS flip-flop RSi is reset each time the write raw signal WECD becomes "0" (STATE-C-1, STATE-C-3, STATE-C-5, STATE-C-7, STATE-C-9) to set all expected values Ei to "0" until immediately before STATE-C-11 (until STATE-C-10) corresponding to the twenty-second period of Table 6 over which the 0-coincidence signal ALL0 is "0". In other states, the word line WL0 is selected to set the RS flip-flop RS0. Since the selector SELEi outputs the signal receiving at its 1-input, the set of expected values (E0, E1, E2, E3) in STATE-C-2, STATE-C-4, STATE-C-6, STATE-C-8, STATE-C-10 are (1, 0, 0, 0).

The decoder output corresponding to the word line WLi determines the data finally held by the RS flip-flop RSi during each clock cycle. Therefore, the reset pulse generator circuit RPG is designed so that the reset pulse RST falls earlier.

Then, in STATE-C-11 corresponding to the twenty-second period of Table 6, the 0-coincidence signal ALL0 is "0" and the write raw signal WECD is "1". Accordingly, the RS flip-flop RSi is not reset. The selector SELEi which outputs the signal received at its 0-input at this time selects the $\overline{Q}$ output from the RS flip-flop RSi as the expected value Ei. Then, the set of expected values (E0, E1, E2, E3) in STATE-C-11 are (0, 1, 1, 1) complementary to the set of expected values (E0, E1, E2, E3) in STATE-C-2, STATE-C-4, STATE-C-6, STATE-C-8, STATE-C-10.

In STATE-C-11 corresponding to the twenty-third period of Table 6, the 0-coincidence signal ALL0 is "0" and the write raw signal WECD is "0". Accordingly, the RS flip-flop RSi is reset. The selector SELEi selects the $\overline{Q}$ output from the RS flip-flop RSi as the expected value Ei. The set of expected values (E0, E1, E2, E3) are (1, 1, 1, 1).

The expected values are generated in the same manner during the thirteenth period (Table 6) to the fifty-eighth period (Table 7) (STATE-C-24 to STATE-C-47). The expected values in STATE-C-0 are generated during the fifty-ninth period (Table 7).

FIG. 140 illustrates another expected value generator circuit 65 for generating the expected values E0, E1, E2, E3. The expected value generator circuit 65 comprises an exclusive-OR circuit XORW, AND circuits ANDX0, ANDX1, ANDX2, ANDX3, and exclusive-NOR circuits XNOR0, XNOR1, XNOR2, XNOR3.

The exclusive-OR circuit XORW applies the exclusive OR of the write raw signal WECD and the 0-coincidence signal ALL0 to a first input of all of the AND circuits ANDXi. The AND circuit ANDXi has a second input for receiving the output Xi from the decoder for selecting the word line WLi. Each exclusive-NOR circuit XNORi has a first input receiving the 0-coincidence signal ALL0 and a second input receiving the output from the AND circuit ANDXi. The expected value Ei is provided as the output from the exclusive-NOR circuit XNORi.

The 0-coincidence signal ALL0 is "1" and the output from the exclusive-OR circuit XORW is "0"/"1" in response to the value "1"/"0" of the write raw signal WECD, respectively, until the twenty-first period of Table 6 corresponding to STATE-C-10. Until STATE-C-10, since the word line WL0 is selected, the value "1" is applied to the second input of the AND circuit ANDX0, and the value "0" is applied to the second input of the AND circuits ANDX1, ANDX2, ANDX3. Then, a set of outputs from the AND circuits ANDX0, ANDX1, ANDX2, ANDX3 are (0, 0, 0, 0) and (1, 0, 0, 0) in response to the values "1" and "0" of the write raw signal WECD, respectively. With the 0-coincidence signal ALL0 being "1", the exclusive-NOR circuit XNORi allows the output from the AND circuit ANDXi to pass through. Then the set of expected values (E0, E1, E2, E3) are (0, 0, 0, 0) and (1, 0, 0, 0) in response to the values "1" and "0" of the write raw signal WECD, respectively.

During the twenty-second period corresponding to STATE-C-11, the 0-coincidence signal ALL0 is "0" and the write raw signal WECD is "1". The AND circuit ANDXi allows the output Xi from the decoder DCDR for selecting the word line WLi to pass through. With the 0-coincidence signal ALL0 being "0", the exclusive-NOR circuit XNORi inverts the output from the AND circuit ANDXi. Then, the set of expected values (E0, E1, E2, E3) are (0, 1, 1, 1) complementary to (1, 0, 0, 0).

During the twenty-third period corresponding to STATE-C-12, the 0-coincidence signal ALL0 is "0" and the write raw signal WECD is "0". The output from the exclusive-OR circuit XORW is "0" and the output from the AND circuit ANDXi is all "0". The exclusive-NOR circuit XNORi inverts the output from the AND circuit ANDXi. Then, the set of expected values (E0, E1, E2, E3) are (1, 1, 1, 1).

Similar to the circuit of FIG. 139, the circuit of FIG. 140 repeats the above described operation to automatically generate the expected values using the third technique.

D. Scan Path for Receiving Column Coincidence Signal

As described with reference to FIG. 1, the scan path receives and shifts the column coincidence signal Zi to sequentially provide the scan signal SOZ. The hit signal HIT may be provided from the column coincidence signal Zi. Description will be given on such a scan path and the scan flip-flops forming the scan path. The scan flip-flops to be described below may be applied to any of the above stated first to third techniques.

(d-1) Twelfth Preferred Embodiment

Figure 141:
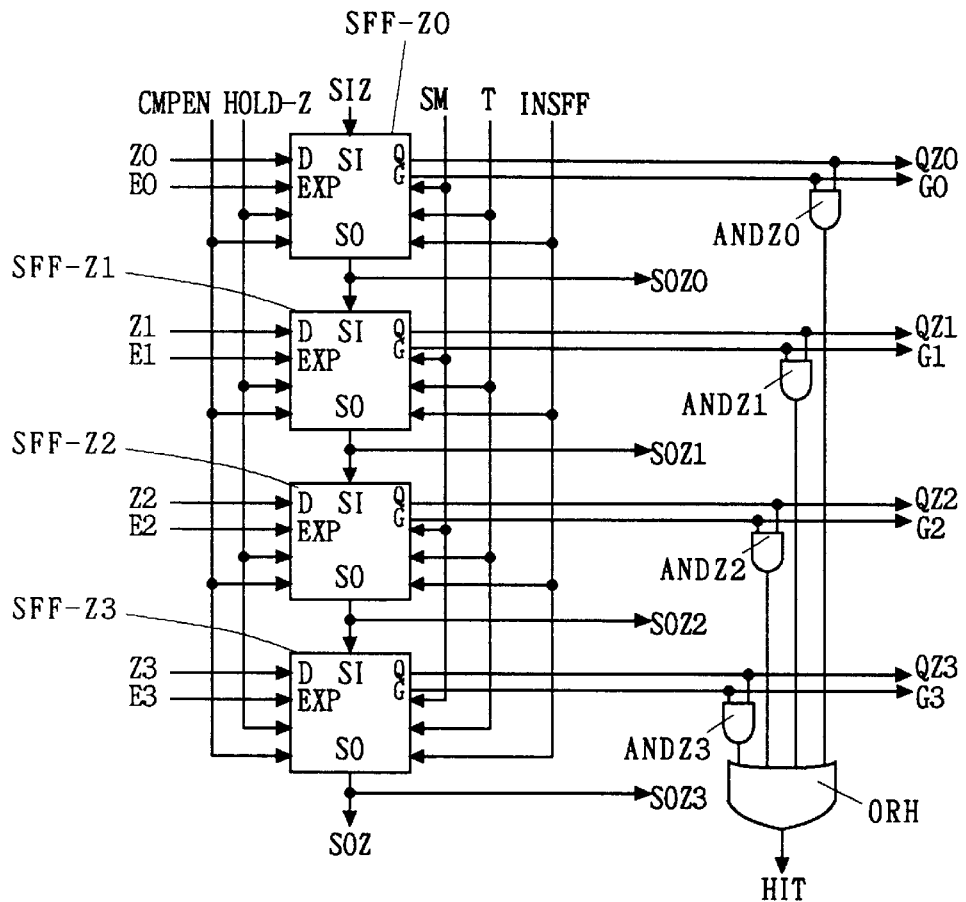
FIGS. 141 and 142 are circuit diagrams of a twelfth preferred embodiment according to the present invention.
Figure 142:
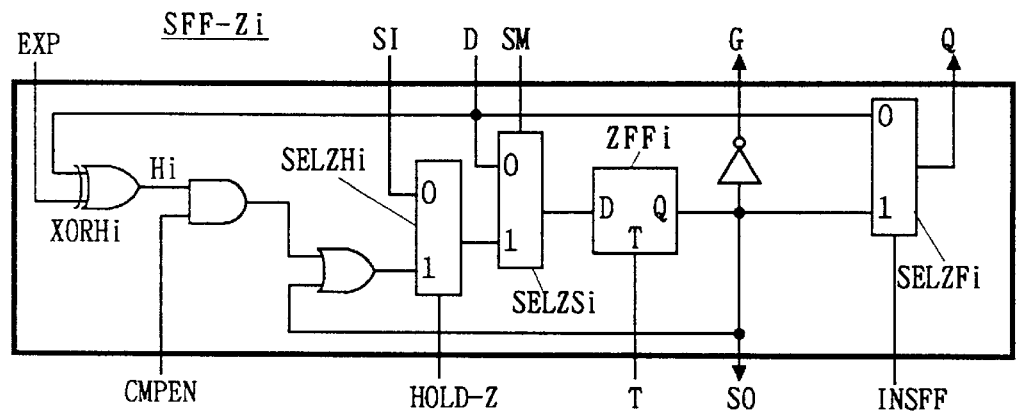

FIG. 141 is a circuit diagram of a scan path for receiving the column coincidence signal Zi and expected value Ei. FIG. 142 is a circuit diagram of a scan flip-flop SFF-Zi for forming the scan path of FIG. 141.

The scan flip-flops SFF-Z0 to SFF-Z3 are connected in series. The scan flip-flop SFF-Zi has a D terminal receiving the column coincidence signal Zi, a terminal EXP for receiving the expected value Ei, a Q output for outputting a signal QZi, and a terminal G for outputting a signal Gi.

The scan output terminal SO of one scan flip-flop is connected to the scan input terminal SI of the scan flip-flop of the next stage. Specifically, the scan input terminal SI of the scan flip-flop SFF-Z0 receives the scan signal SIZ, and the scan input terminals SI of the scan flip-flops SFF-Z1, SFF-Z2, SFF-Z3 receive scan output signals SOZ0, SOZ1, SOZ2 from the scan flip-flops SFF-Z0, SFF-Z1, SFF-Z2, respectively. A scan output signal SOZ3 from the scan flip-flop SFF-Z3 is provided as the scan signal SOZ.

The signal Gi indicates the presence or absence of a failure (abnormal condition) detected in its associated column and is "0"/"1" in corresponding relation to the abnormal/normal condition, as will be described later. The signal QZi employs the column coincidence signal Zi as will be described later. An AND circuit ANDZi applies the AND of the signals Gi and QZi to the OR circuit ORH. Thus, the column coincidence signal associated with the column containing a failed memory cell does not contribute to the generation of the hit signal HIT. This allows the system for using the CAM to avoid the failed portion.

A comparison permission signal CMPEN, an output hold signal HOLD-Z, the shift mode signal SM, and a flip-flop insertion signal INSFF are commonly applied to all of the scan flip-flops SFF-Zi.

The scan flip-flop SFF-Zi comprises a two-input exclusive-OR circuit XORHi connected to the terminal EXP and D terminal for comparing the column coincidence signal Zi with the expected value Ei to output a determination signal Hi which is "1"/"0" corresponding to mismatch/match. Since the exclusive-OR circuit XORHi of FIG. 142 is similar in this function to the exclusive-OR circuit XORHi of the comparator circuit 70, the same reference character is used. The exclusive-OR circuit XORHi may be shared between the comparator circuit 70 and the scan flip-flop SFF-Zi, or individual exclusive-OR circuits XORHi may be provided for the comparator circuit 70 and the scan flip-flop SFF-Zi, respectively.

The output hold signal HOLD-Z controls a selector SELZHi. The selector SELZHi has a 0-input connected to the scan input terminal SI and an output connected to a 1-input of a selector SELZSi. A 0-input of the selector SELZSi is connected to the D terminal. The output of the selector SELZSi is connected to the D terminal of a flip-flop ZFFi. An inverter inverts the Q output from the flip-flop ZFFi to provide the signal Gi.

The Q output from the flip-flop ZFFi is applied to the scan output terminal SO and is ORed with the AND of the determination signal Hi and the comparison permission signal CMPEN. The OR is applied to the 1-input of the selector SELZHi.

A selector SELZFi has a 0-input connected to the D terminal and a 1-input receiving the Q output from the flip-flop ZFFi, and selects the signal from the D terminal or the Q output from the flip-flop ZFFi as the Q output from the scan flip-flop SFF-Zi in response to the flip-flop insertion signal INSFF.

Figure 143:
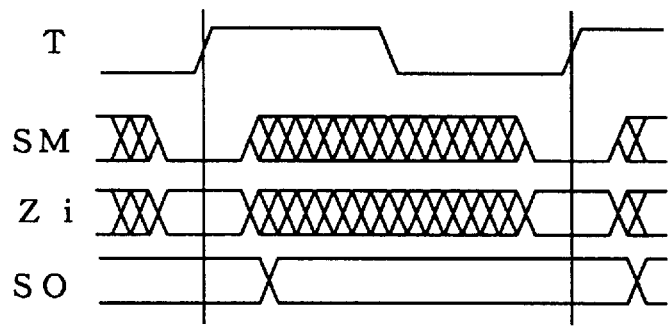
FIGS. 143 through 146 are timing charts showing the twelfth preferred embodiment according to the present invention.

To receive the column coincidence signal Zi (under normal operation), the shift mode signal SM is set to "0". FIG. 143 is a timing chart showing the relation between the clock signal T, the shift mode signal SM, the column coincidence signal Zi, and the Q output from the flip-flop ZFFi (the value to be applied to the scan output terminal SO).

The column coincidence signal Zi at the D terminal is applied to the 1-input of the selector SELZFi through the flip-flop ZFFi. Setting the flip-flop insertion signal INSFF to "1" places the scan flip-flop SFF-Zi into operation as a normal flip-flop (substantially by the function of the flip-flop ZFFi).

The flip-flop insertion signal INSFF should be set to "0" if the scan flip-flop SFF-Zi is required only to allow the column coincidence signal Zi to pass through without the need for this normal operation as the flip-flop. If the scan flip-flop SFF-Zi is not required to act as a normal flip-flop but to allow the column coincidence signal Zi to constantly pass through, the selector SELZFi is not required and the D terminal of the scan flip-flop SFF-Zi may be directly connected to the Q output thereof.

The signal Gi is outputted during the above stated normal operation. As above described, when the associated column contains a failed memory cell, the signal QZi which is the column coincidence signal Zi is not caused to contribute to the generation of the hit signal HIT.

Figure 144:
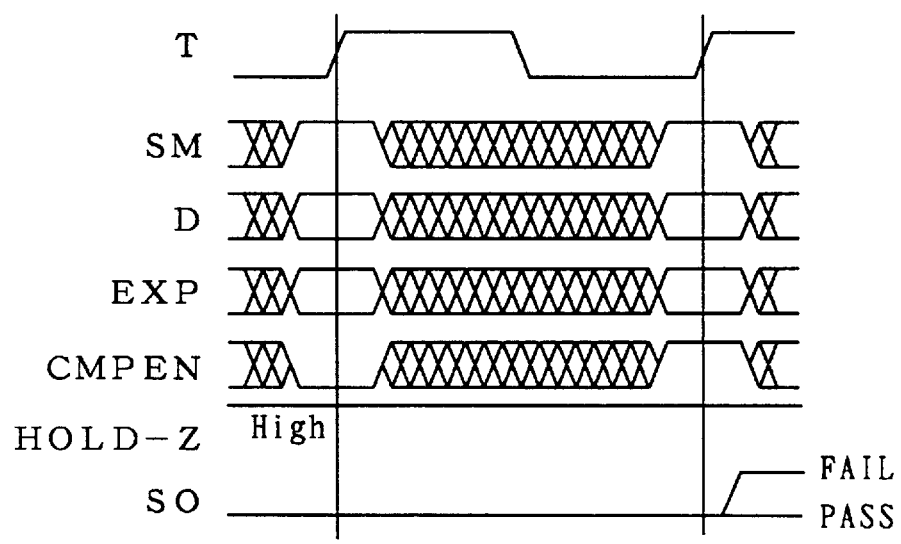

The generation of the signal Gi is described below. FIG. 144 is a timing chart showing the operation when the signal Gi is generated. The shift mode signal SM, the output hold signal HOLD-Z and the comparison permission signal CMPEN are all set to "1". This performs the OR operation between the determination signal Hi and the Q output from the flip-flop ZFFi to provide the OR to the flip-flop ZFFi.

If the column coincidence signal Zi matches the expected value Ei, the determination signal Hi is "0", and accordingly the AND of the determination signal Hi and the comparison permission signal CMPEN is "0". Then, the value previously stored in the flip-flop ZFFi is not updated. However, if the column coincidence signal Zi does not match the expected value Ei, that is, if a failure occurs in a memory cell in the associated column, the determination signal Hi is "1", and the flip-flop ZFFi stores the value "1" therein independently of the value previously stored therein.

In other words, the value "1" is stored in the flip-flop ZFFi and the signal Gi is "0" during the normal operation if a failure is detected in the content addressable memory cell Cij by using the first to third techniques to result in the presence of at least one test pattern which causes the determination signal Hi to be "1" whereas other test patterns may cause the determination signal Hi to be "0".

Figure 145:
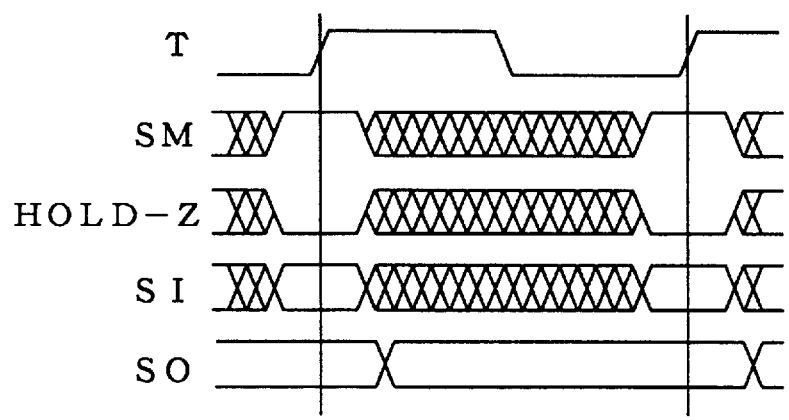

To insure this operation, it is necessary to previously store the value "0" in the flip-flop ZFFi. This is accomplished by scan-in of the value "0" into the scan path. More specifically, the shift mode signal SM is set to "1" and the output hold signal HOLD-Z is set to "0". FIG. 145 is a timing chart showing such a shift operation. Then, the value applied to the scan input terminal SI is transmitted to the flip-flop ZFFi. Since the Q output from the flip-flop ZFFi is applied to the scan output terminal SO, the scan signal SIZ set to "0" may be shifted in sequential order to cause all of the flip-flops ZFFi to store the value "0" therein.

Figure 146:
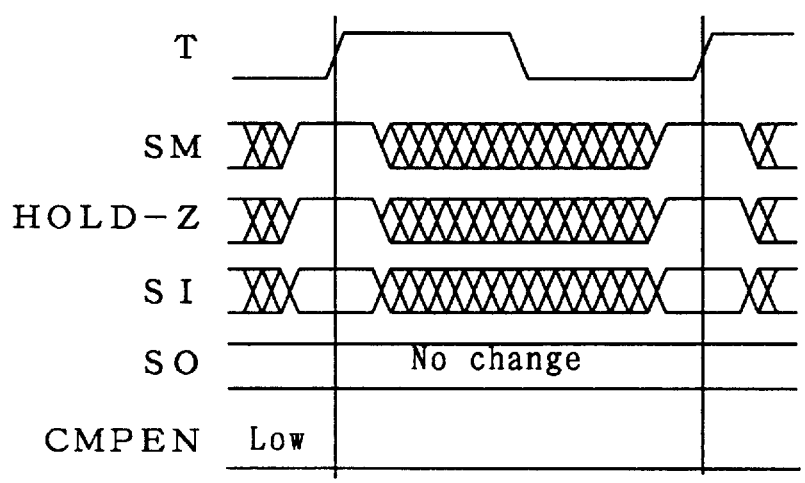

The scan flip-flop SFF-Zi may be placed in hold operation by setting the shift mode signal SM and output hold signal HOLD-Z to "1" and setting the comparison permission signal CMPEN to "0". FIG. 146 is a timing chart for hold operation.

This permits the flip-flop ZFFi to hold the information about the presence or absence of failure stored therein, providing test results in sequential order by subsequent shift operation.

(d-2) Thirteenth Preferred Embodiment

Figure 147:
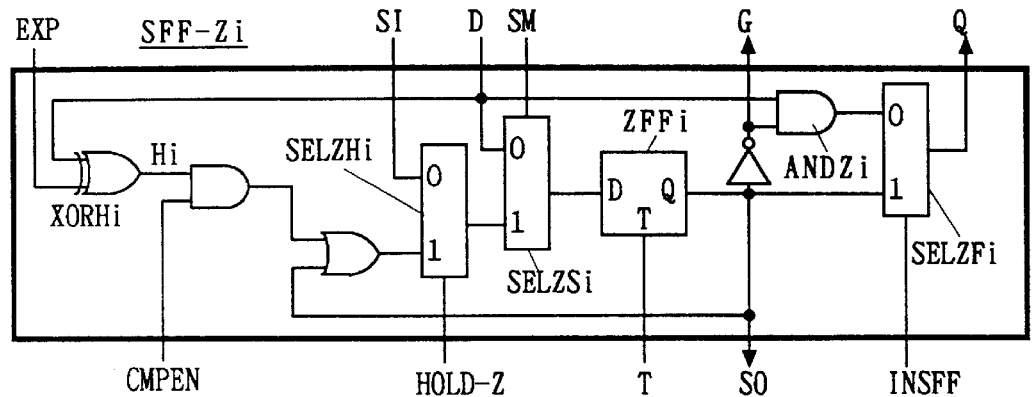
FIGS. 147 and 148 are circuit diagrams of a thirteenth preferred embodiment according to the present invention.

FIG. 147 is a circuit diagram of another form of the scan flip-flop SFF-Zi which further comprises an AND circuit ANDZi in addition to the components of the twelfth preferred embodiment of FIG. 142.

The AND circuit ANDZi of FIG. 147 is identical with that of the twelfth preferred embodiment shown in FIG. 141 and determines the AND of the column coincidence signal Zi serving as the signal QZi within the scan flip-flop SFF-Zi and the signal Gi. The AND is applied to the 0-input of the selector SELZFi. Then, the failure is masked only when the flip-flop insertion signal INSFF is "1" or during the normal operation.

Figure 148:
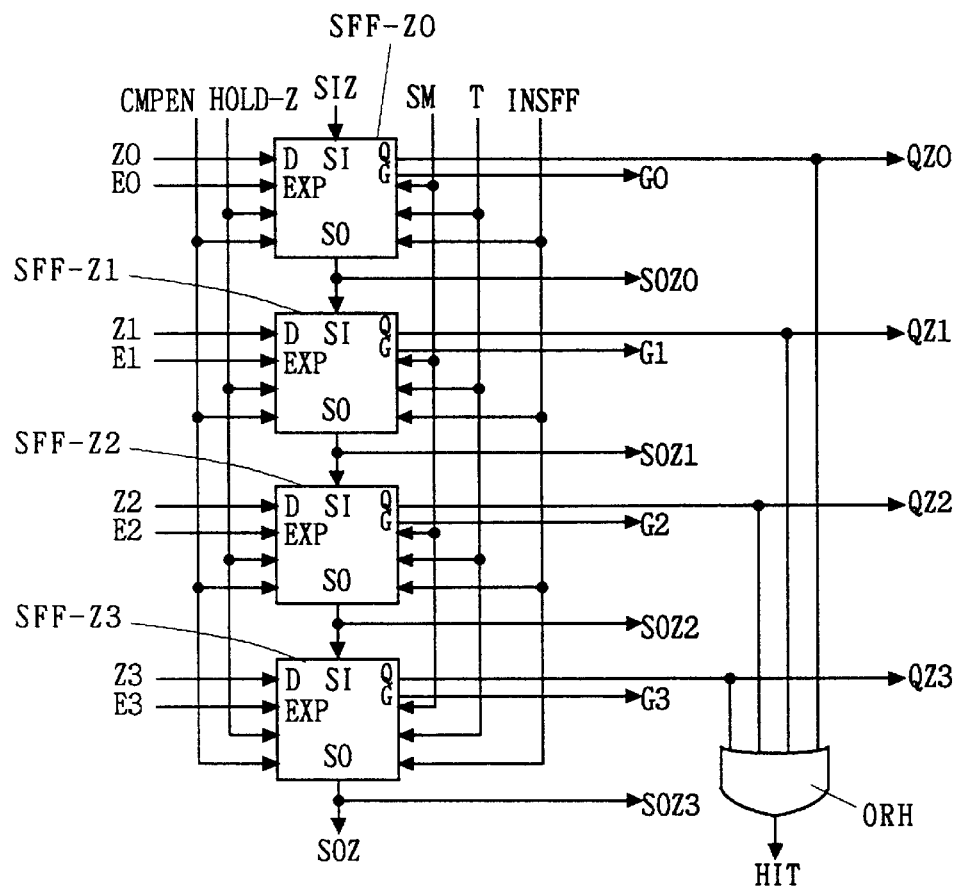

FIG. 148 is a circuit diagram of a scan path wherein the scan flip-flop SFF-Zi of FIG. 147 is used. The AND circuit ANDZi contained in the scan flip-flop SFF-Zi is not shown in FIG. 148.

(d-3) Fourteenth Preferred Embodiment

Figure 149:
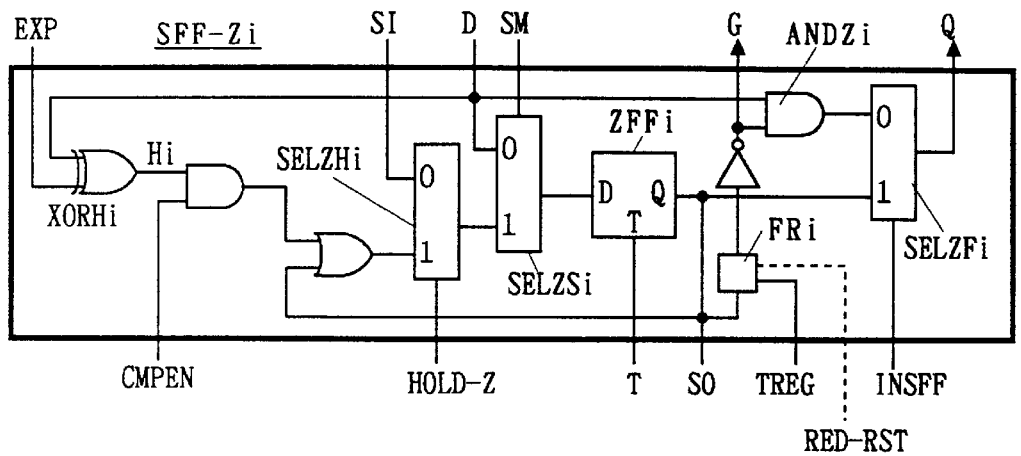
FIGS. 149 and 150 are circuit diagrams of a fourteenth preferred embodiment according to the present invention.

FIG. 149 is a circuit diagram of still another form of the scan flip-flop SFF-Zi which further comprises a failure information holding register FRi in addition to the components of FIG. 147 of the thirteenth preferred embodiment. The register FRi is controlled by a register-only clock signal TREG and a reset signal RED-RST to receive and store the Q output from the flip-flop ZFFi therein. The output from the register FRi is applied to the terminal G through the inverter.

The register FRi may receive and hold the signal (test result) indicative of the presence or absence of a failure which is stored in the flip-fop ZFFi. Thus, when the test result is read from the flip-flop ZFFi by the shift operation, the file information about the presence or absence of the failure is not lost. The reset signal RED-RST may be dispensed with.

Figure 150:
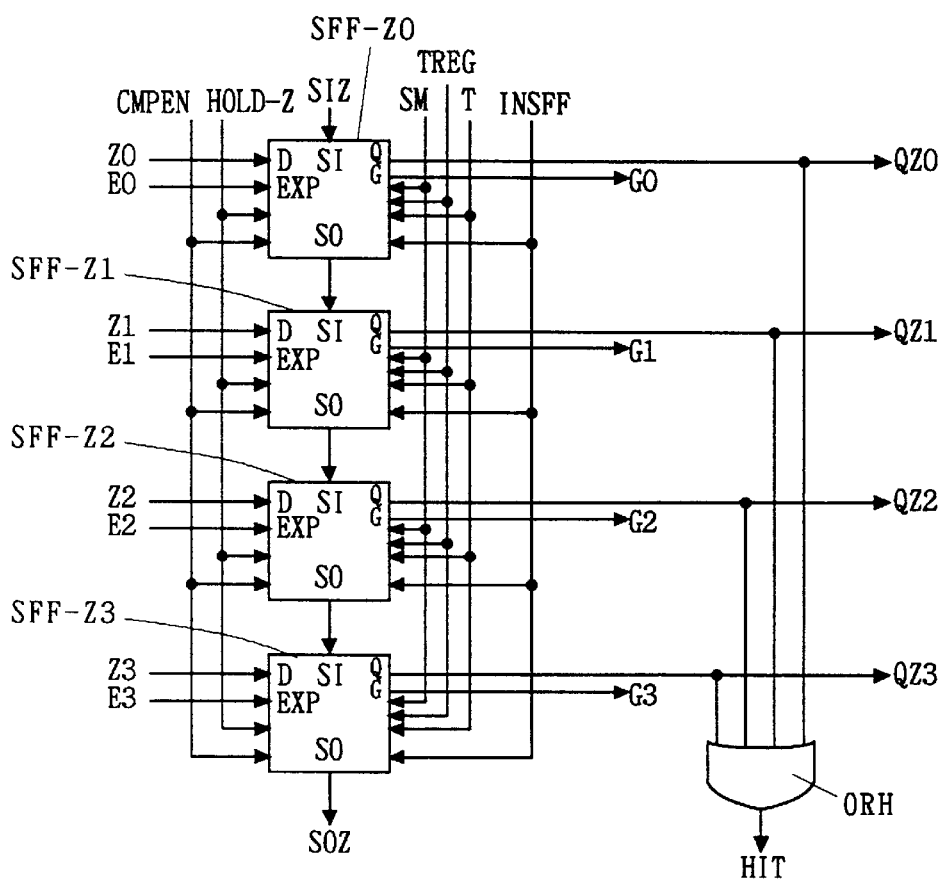

FIG. 150 is a circuit diagram of a scan path wherein the scan flip-flop SFF-Zi of FIG. 149 is used. The arrangement of FIG. 150 differs from that of the thirteenth preferred embodiment of FIG. 148 in that the register-only clock signal TREG is applied to all of the scan flip-flops SFF-Zi.

(d-4) Fifteenth Preferred Embodiment

Figure 151:
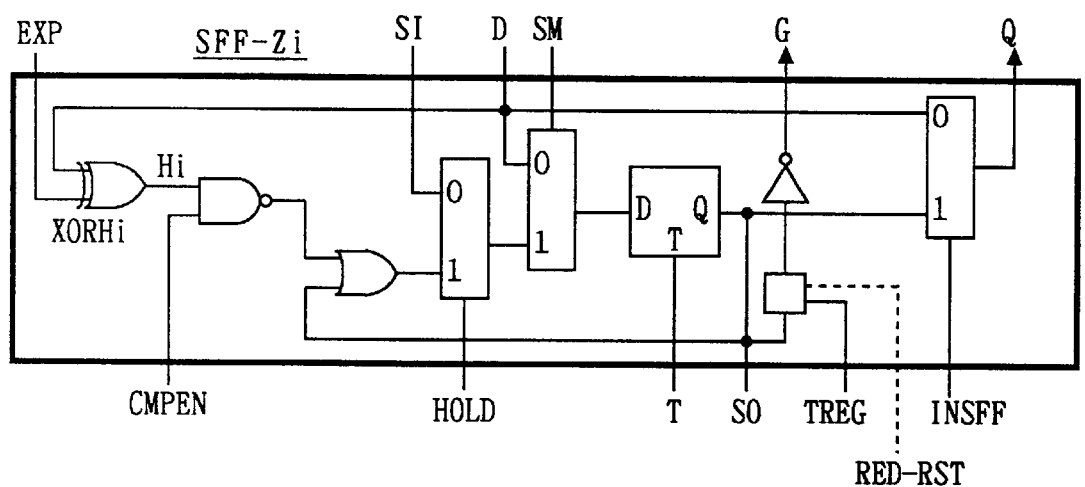
FIG. 151 is a circuit diagram of a fifteenth preferred embodiment according to the present invention.

FIG. 151 is a circuit diagram of still another form of the scan flip-flop SFF-Zi wherein the AND circuit ANDZi is removed from the arrangement of the thirteenth preferred embodiment of FIG. 149. Specifically, the D terminal is directly connected to the 0-input of the selector SELZFi. In other words, the arrangement of FIG. 151 includes the failure information holding register FRi between the Q output of the flip-flop ZFFi and the inverter for outputting the signal Gi in addition to the arrangement of the twelfth preferred embodiment of FIG. 142.

It is apparent that the scan flip-flop SFF-Zi of such a construction may form the scan path of FIG. 150.

E. Content Addressable Memory Circuit with Redundancy Function

A content addressable memory circuit with redundancy function may be provided which comprises a content addressable memory row or a content addressable memory column to be substituted for a content addressable memory row or column having a failed memory cell if detected.

(e-1) Sixteenth Preferred Embodiment

Figure 152:
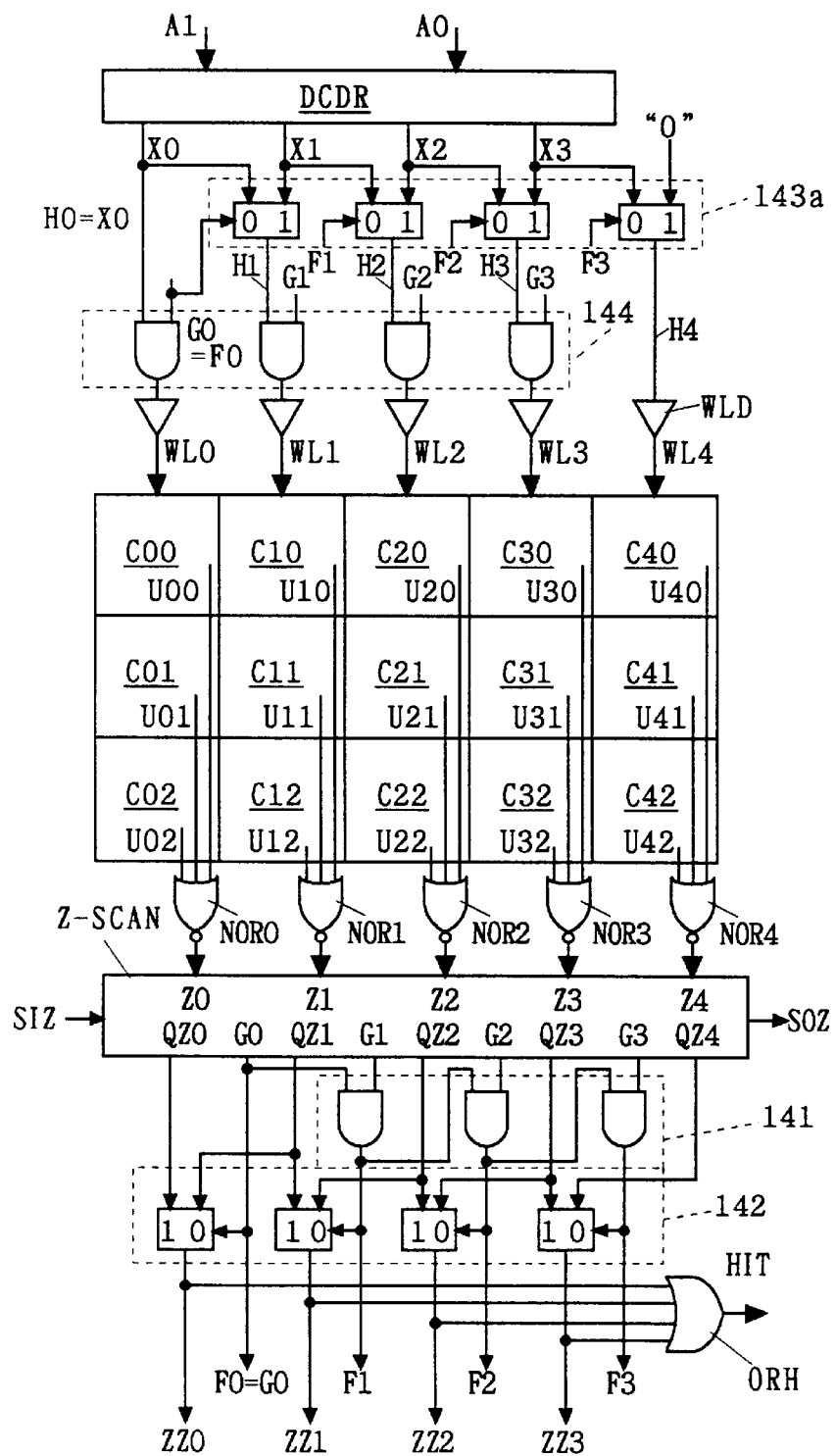
FIGS. 152 through 154 are circuit diagrams of a sixteenth preferred embodiment according to the present invention.

FIG. 152 is a circuit diagram of a content addressable memory circuit which comprises zeroth to (n−1)-th columns of content addressable memory cells arranged in m rows each, and an n-th column of content addressable memory cells arranged in m rows, where m=3 and n=4 herein. If a failure occurs in one of the content addressable memory cells C0j to C3j in the zeroth to third columns, the content addressable memory cells C40, C41, C42 in the fourth column function to substitute for the memory cells in the column containing the failed memory cell.

A determination is made as to whether or not the test data given from the input signal DIj are stored in the content addressable memory cells except the content addressable memory cells in the column having the failed memory cell. As described with reference to FIG. 163, the OR of the coincidence outputs Uij is inverted to provide the column coincidence signal Zi for each column.

Figure 153:
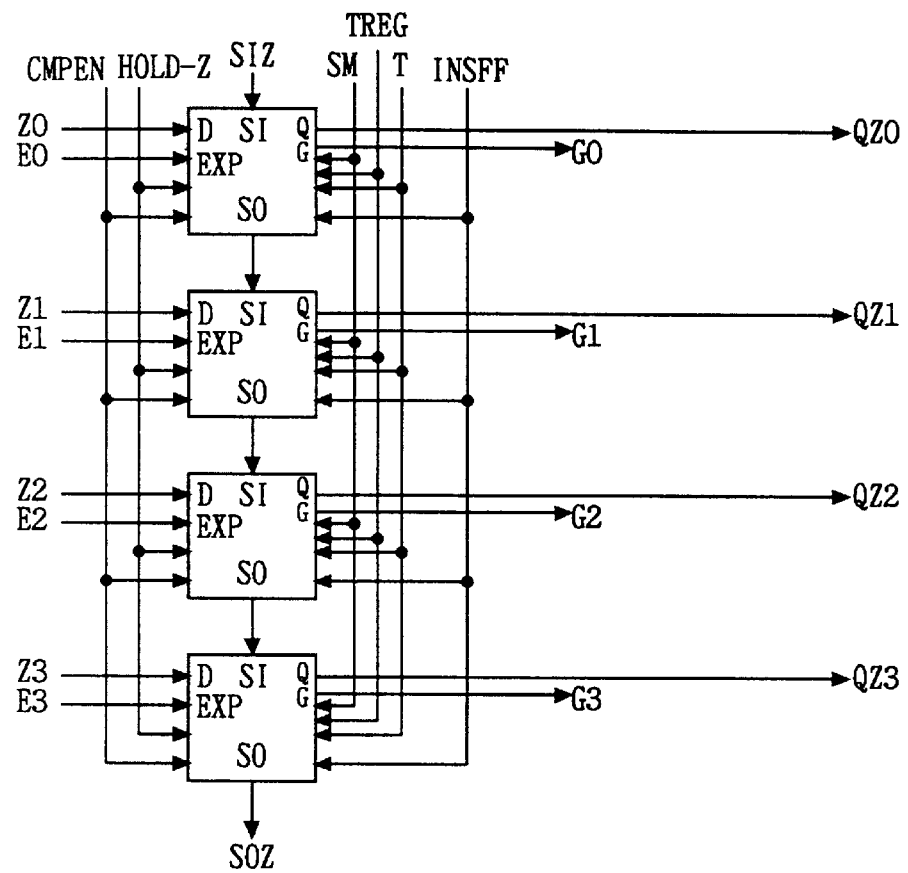

An output portion Z-SCAN stores therein signals G0 to G4 indicative of zeroth to fourth acceptance/failure data which are active/inactive when the zeroth to fourth columns of content addressable memory cells are acceptable/failed, respectively. The output portion Z-SCAN outputs signals QZ0 to QZ4 serving as zeroth to fourth coincidence determination signal candidates indicative of whether or not the comparison data stored in the zeroth to fourth columns of content addressable memory cells match the test data. The output portion Z-SCAN can be achieved by removing the OR circuit ORH from the arrangement of the scan path of the twelfth, thirteenth, fourteenth preferred embodiments shown in FIGS. 141, 148, 150. FIG. 153 shows the output portion Z-SCAN wherein the scan flip-flop SFF-Zi of FIG. 149 is used.

All columns are not necessarily be acceptable. Only some of the coincidence determination signal candidates QZ0 to QZ4 which are not associated with the failed portion are provided as zeroth to third coincidence determination signals ZZ0 to ZZ3.

The zeroth to third coincidence determination signals ZZ0 to ZZ3 are produced by a group of gates 141 and a group of selectors 142 from the zeroth to third acceptance/failed data G0 to G3 and the zeroth to fourth coincidence determination signal candidates QZ0 to QZ4.

The group of gates 141 output zeroth to third control signals F0 to F3. The zeroth acceptance/failure data G0 is used as the zeroth control signal F0. The AND of the first acceptance/failure data G1 and the zeroth control signal F0 is used as the first control signal F1. Likewise, the AND of the second acceptance/failure data G2 and the first control signal F1 is used as the second control signal F2. The AND of the third acceptance/failure data G3 and the second control signal F2 is used as the third control signal F3.

The group of selector 142 selects one of the coincidence determination signal candidates QZi and QZ(i+1) associated with two adjacent columns in corresponding relation to the active/inactive state of the i-th control signal Fi to output the i-th coincidence determination signal ZZi.

The outputs from the decoder DCDR are described herein assuming that the output Xi selects the word line WLi. When the relation between the output from the decoder DCDR and the selected word line is the relations shown in FIGS. 46 and 48, the connection between the outputs and word line drivers WLD should be arranged on the basis of the relations.

A group of selectors 143a receive the zeroth to third control signals F0 to F3 and the decoder outputs X0 to X3 to output first to fourth column specifying signal candidates H1 to H4. The output X0 or X1 is selected as the first column specifying signal candidate H1 in response to the control signal F0 that is inactive or active, respectively. Likewise, the output X1 or X2 is selected as the second column specifying signal candidate H2 in response to the control signal F1 that is inactive or active, respectively. The output X2 or X3 is selected as the third column specifying signal candidate H3 in response to the control signal F2 that is inactive or active, respectively. If the control signal F3 is inactive, the output X3 is used as the fourth column specifying signal candidate H4. If the control signal F3 is active, the fourth column specifying signal candidate H4 is "0".

A group of gates 144 receive the zeroth to third acceptance/failure data G0 to G3 and the zeroth to fourth column specifying signal candidates H0 to H4 to determine which one of the word lines WL0 to WL4 is to be selected. The decoder output X0 is used as the zeroth column specifying signal candidate H0.

The word line WLi is selected if the AND of the i-th column specifying signal candidate Hi and the i-th acceptance/failure data Gi is active. However, the word line WL4 is selected if the fourth column specifying signal candidate H4 is active.

Table 9 is a logic table showing the relation between the values of the zeroth to third acceptance/failure data G0 to G3, the zeroth to third control signals F0 to F3, the word lines WL0 to WL4, and the zeroth to third coincidence determination signals ZZ0 to ZZ3.

Figure 156:
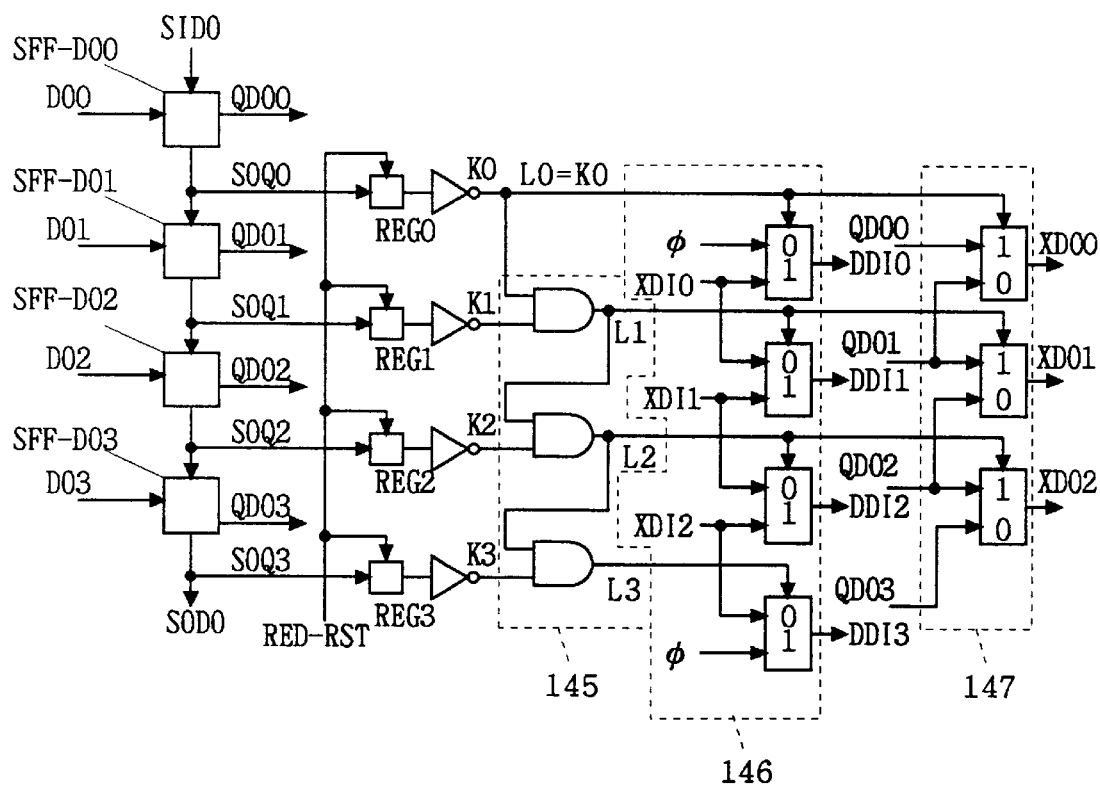

CMPEN, the output hold signal HOLD-Z, and the flip-flop insertion signal INSFF are not shown in FIGS. 155 and 156.

Figure 157:
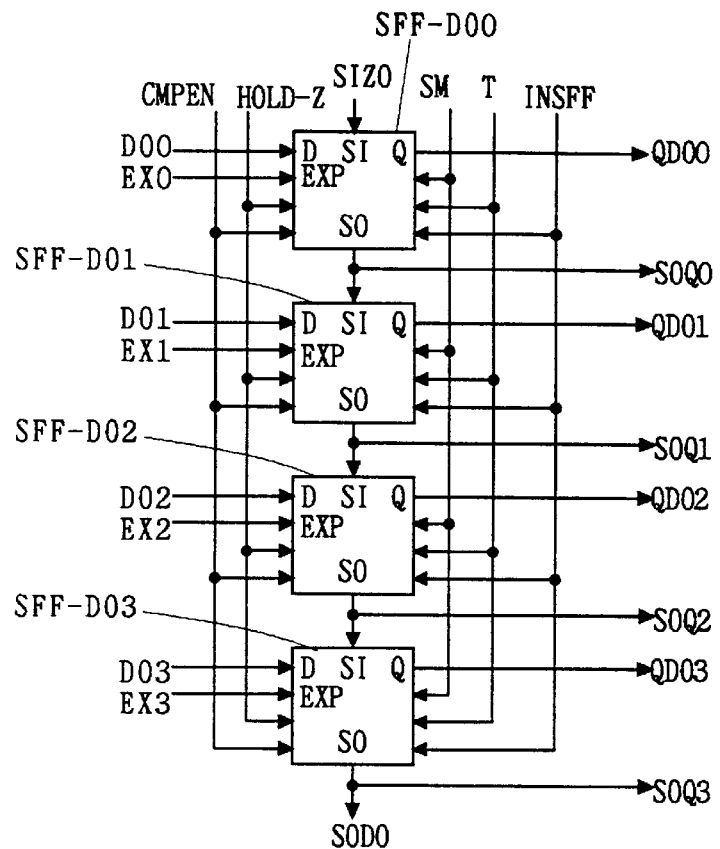

FIG. 157 is a circuit diagram showing output scan flip-flops SFF-DO0, SFF-DO1, SFF-DO2, SFF-D03 and their adjacent connections in detail. The output scan flip-flop

TABLE 9

| G0 | G1 | G2 | G3 | F0 | F1 | F2 | F3 | WL0 | WL1 | WL2 | WL3 | WL4 | ZZ0 | ZZ1 | ZZ2 | ZZ3 |
|----|----|----|----|----|----|----|----|-----|-----|-----|-----|-----|-----|-----|-----|-----|
| 1  | 1  | 1  | 1  | 1  | 1  | 1  | 1  | X0  | X1  | X2  | X3  | 0   | QZ0 | QZ1 | QZ2 | QZ3 |
| 0  | 1  | 1  | 1  | 0  | 0  | 0  | 0  | 0   | X0  | X1  | X2  | X3  | QZ1 | QZ2 | QZ3 | QZ4 |
| 1  | 0  | 1  | 1  | 1  | 0  | 0  | 0  | X0  | 0   | X1  | X2  | X3  | QZ0 | QZ2 | QZ3 | QZ4 |
| 1  | 1  | 0  | 1  | 1  | 1  | 0  | 0  | X0  | X1  | 0   | X2  | X3  | QZ0 | QZ1 | QZ3 | QZ4 |
| 1  | 1  | 1  | 0  | 1  | 1  | 1  | 0  | X0  | X1  | X2  | 0   | X3  | QZ0 | QZ1 | QZ2 | QZ4 |

Where F0 = G0

If no failure occurs in the content addressable memory cells in the zeroth to third columns, all acceptance/failure data G0 to G3 are "1" and, accordingly, all control signals F0 to F3 are "1". As a result, the fourth column specifying signal candidate H4 is "0", and the redundancy function is not performed.

If a failure occurs in one of the zeroth to third columns of content addressable memory cells, the acceptance/failure data Gb ($0 \leq b \leq 3$) associated with the column having the failed memory cell becomes "0". As a result, the fourth column of the memory cells is used in place of the column having the failed memory cell to select the word line, with the sequence of the outputs X0 to X3 held unchanged.

Four of the zeroth to fourth coincidence determination signal candidates QZ0 to QZ4 are selected as the zeroth to third coincidence determination signals ZZ0 to ZZ3 in corresponding relation to the selected word line. Thus, the circuit of FIG. 152 may function as the content addressable memory circuit in the form of a 3 by 4 array without using the column having the failed memory cell.

Figure 154:
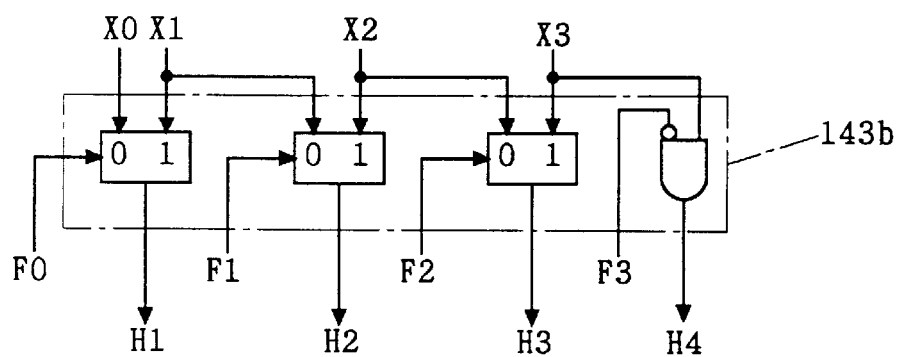

The selector controlled by the third control signal F3 may be replaced with a simpler logic gate. FIG. 154 is a circuit diagram of a group of selectors 143b subjected to the replacement. The use of a logic gate for outputting the AND of the inverted version of the third control signal F3 and the output X3 as the fourth column specifying signal candidate H4 allows the selector group 143b to perform equivalent function to the selector group 143a of FIG. 152.

(e-2) Seventeenth Preferred Embodiment

FIGS. 155 and 156 together are a circuit diagram of a content addressable memory circuit which comprises zeroth to (m–1)-th rows of content addressable memory cells arranged in n columns each, and an m-th row of content addressable memory cells arranged in n columns, where m=3 and n=4 herein. If a failure occurs in one of the content addressable memory cells Ci0 to Ci2 in the zeroth to second rows, the content addressable memory cells C03 to C33 in the third row function to substitute for the memory cells in the row containing the failed memory cell.

A determination is made as to whether or not the test data given from the input signal DIj are stored in the content addressable memory cells except the content addressable memory cells in the row having the failed memory cell. Prior to the determination, the memory cell Mij of the content addressable memory cell Cij is tested for failure, and the content addressable memory circuit is tested by using the first to third techniques.

For the purpose of simplicity, the decoder DCDR for selecting the column, the shift mode signal SM, the input hold signal HOLD-DI, the comparison permission signal SFF-DOj receives and compares the data output DOj and expected value EXj with each other to output a signal SOQj indicative of match/mismatch therebetween.

Figure 158:
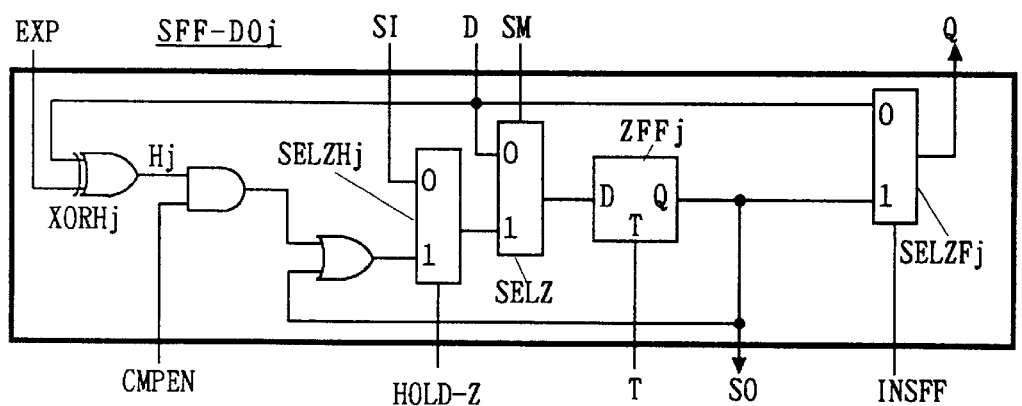

FIG. 158 is a circuit diagram of the output scan flip-flop SFF-DOj. The arrangement of FIG. 158 is similar to that of FIG. 142 except that the inverter for generating the signal G is not provided. The output scan flip-flop SFF-DOj has an adscript "j", not "i", since it is provided in corresponding relation to the rows, not columns, in FIG. 158.

First, the memory cell Mij is checked for failure. The output scan flip-flop SFF-DOj has a D terminal receiving the data output DOj from a sense amplifier SA and a terminal EXP receiving the expected value EXj. To check the content addressable memory circuit for failure for each row, the specific value "1" is written to all of the content addressable memory cells Cij (thereby writing the specific value "1" to the memory cell Mij) and then the memory cell Cij is read to provide the data output DOj, for example. Thus, the expected value EXj of the data output DOj may have the same value "1". In this case, the terminal EXP of all output scan flip-flops SFF-DOj may be connected commonly.

The comparison permission signal CMPEN is set to "1" to apply the signal indicative of match/mismatch between the data output DOj and expected value EXj to the 1-input of the selector SELZHi. Then, setting the output hold signal HOLD-Z and shift mode signal SM to "1" permits the flip-flop ZFFj to receive the data indicative of the presence or absence of a failure in the content addressable memory cell in the associated row. The flip-flop ZFFj in the row once determined as failed continuously stores the value "1" therein as described in the twelfth preferred embodiment with reference to FIG. 142.

The signal SOQj thus obtained is stored in a register REGj. The registers REG0 to REG3 may be reset in unison by the reset signal RED-RST. When the signal SOQj is not scanned out, the registers REG0 to REG3 may be dispensed with.

An acceptance/failure data Kj may be provided by inverting the logic of the signal SOQj. The value "0" of the acceptance/failure data Kq indicates that at least one of the content addressable memory cells Cqj in the q-th row is failed.

A group of gates 145 receive the acceptance/failure data K0 to K3 to output control signals L1 to L3. The gate group 145 is similar in construction to the gate group 141 of the sixteenth preferred embodiment of FIG. 152. Replacing the acceptance/failure data G0 to G3 and control signals F1 to F3 of FIG. 152 with the acceptance/failure data K0 to K3 and control signals L1 to L3 respectively provides the arrangement of the gate group 145.

Table 10 is a logic table showing the relation between the acceptance/failure data K0 to K3, the control signals L1 to L3, the raw input signals DDI0 to DDI3 and output signals XDO0 to XDO2 to be described later.

TABLE 9

| K0 | K1 | K2 | K3 | L0 | L1 | L2 | L3 | DDI0 | DDI1 | DDI2 | DDI3 | XDO0 | XDO1 | XDO2 |
|----|----|----|----|----|----|----|----|------|------|------|------|------|------|------|
| 1 | 1 | 1 | 1 | 1 | 1 | 1 | 1 | XDI0 | XDI1 | XDI2 | φ    | QDO1 | QDO1 | QDO2 |
| 0 | 1 | 1 | 1 | 0 | 0 | 0 | 0 | φ    | XDI0 | XDI1 | XDI2 | QDO1 | QDO2 | QDO3 |
| 1 | 0 | 1 | 1 | 1 | 0 | 0 | 0 | XDI0 | XDI0 | XDI1 | XDI2 | QDO0 | QDO2 | QDO3 |
| 1 | 1 | 0 | 1 | 1 | 1 | 0 | 0 | XDI0 | XDI1 | XDI1 | XDI2 | QDO0 | QDO1 | QDO3 |
| 1 | 1 | 1 | 0 | 1 | 1 | 1 | 0 | XDI0 | XDI1 | XDI2 | XDI2 | QDO0 | QDO1 | QDO2 |

A group of selectors 146 produce the raw input signals DDI0 to DDI3 in response to three input signal candidates XDI0 to XDI2 and the control signals L0 to L3. The acceptance/failure data K0 is used as the control signal L0. The raw input signal DDI0 has the value φ or the value of the input signal candidate XDI0 in response to the value "0" or "1" of the control signal L0, respectively. The raw input signal DDI3 has the value of the input signal candidate XDI2 or the value φ in response to the value "0" or "1" of the control signal L3, respectively. The value φ may be either "1" or "0".

The raw input signal DDI1 has the value of the input signal candidate XDI0 or XDI1 in response to the value "0" or "1" of the control signal L1, respectively. Similarly, the raw input signal DDI2 has the value of the input signal candidate XDI1 or XDI2 in response to the value "0" or "1" of the control signal L2, respectively.

The raw input signal DDIj thus obtained and the acceptance/failure data Kj are applied to an input scan flip-flop SFF-DKj.

Figure 159:
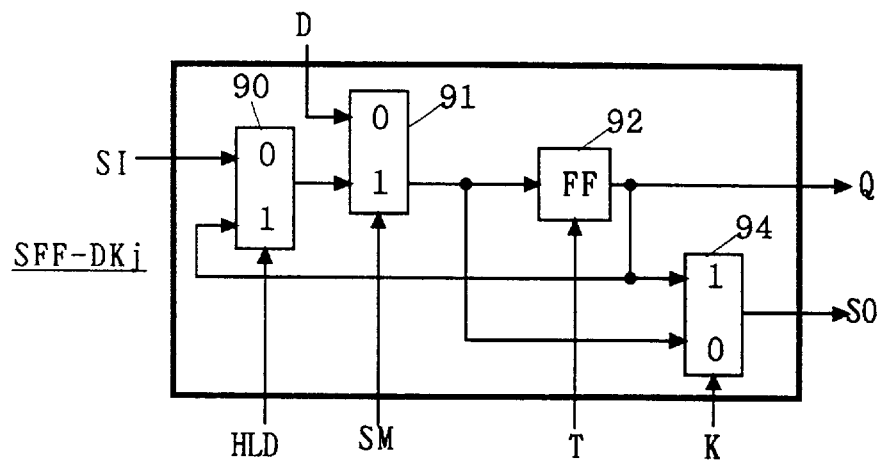

FIG. 159 is a circuit diagram of the input scan flip-flop SFF-DKj used in the circuit of FIG. 155. The input scan flip-flop SFF-DKj of FIG. 159 further includes a selector 94 for changing its output in response to the acceptance/failure data Kj in addition to the components of FIG. 7.

In the input scan flip-flop SFF-DKJ of FIG. 159, the Q output thereof does not necessarily match the input signal DIj at the scan output SO. The selector 94 has a 1-input receiving the Q output from the flip-flop 92 and a 0-input connected to the scan input SI through the selectors 90 and 91. The acceptance/failure data Kj is applied to the terminal K of the selector 94 for controlling the selection of the selector 94.

Next, the content addressable memory circuit is tested. Assuming that a failure in the zeroth row is detected by the failure determination of the memory cell Mij, the acceptance/failure data K0 is "0" and other acceptance/failure data K1 to K3 are all "1". It will be seen from Table 10 that the raw input signal DDI0 has the value φ. However, since the selector 94 connects the scan input terminal SI to the scan output terminal SO, not through the flip-flop 92, in the input scan flip-flop SFF-DK0 associated with the zeroth row, the input scan flip-flop SFF-DK0 allows the shifted-in test pattern described in the first to third techniques to pass through. The same is true for the first to third rows.

The memory cells in the row having the failed memory cell are not read. This is because search drivers SDK function as the search driver SD of FIG. 4 only when the acceptance/failure data Kj is "1".

Figure 160:
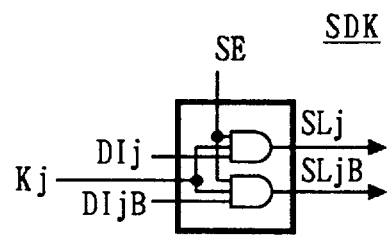

FIG. 160 is a circuit diagram of the search driver SDK. As compared with the search driver SD of FIG. 6, the search driver SDK of FIG. 160 performs the search operation only when both of the search enable signal SE and the acceptance/failure data Kj are "1".

Therefore, if there is one failed row, the content addressable memory circuit is tested by using the first to third techniques without using the failed row.

For normal operation of the content addressable memory circuit, three of the output signal candidates QDO0 to QDO3 outputted from the Q output of the flip-flop SFF-DOj which are associated with the unfailed rows are used as the output signals XDO0 to XDO2. A group of selectors 147 generate the row selection signals XDO0 to XDO2 in response to the control signals L0 to L3. The output signal candidate QDOj or QDO(j+1) is used as the output signal XDOj in response to the value "1" or "0" of the control signal Lj. This allows the use of the content addressable memory circuit without using the failed row.

Since the failed row is not used in this manner, the normal operation is not affected if the row input signal DDI0 has the value φ or the row input signals DDIq, DDI(q+1) (q=0, 1, 2) are equal to each other as shown in Table 10. Further, when no failure occurs, the fourth row is not selected, exerting no influence on the normal operation if the signal DDI3 associated with the fourth row has the value φ. In other words, a dummy raw input signal is produced.

When any row is unfailed, the test pattern for the test of the content addressable memory circuit must be a 4-bit pattern so that no input scan flip-flop SFF-DKj allows the test pattern to pass through.

Figure 161:
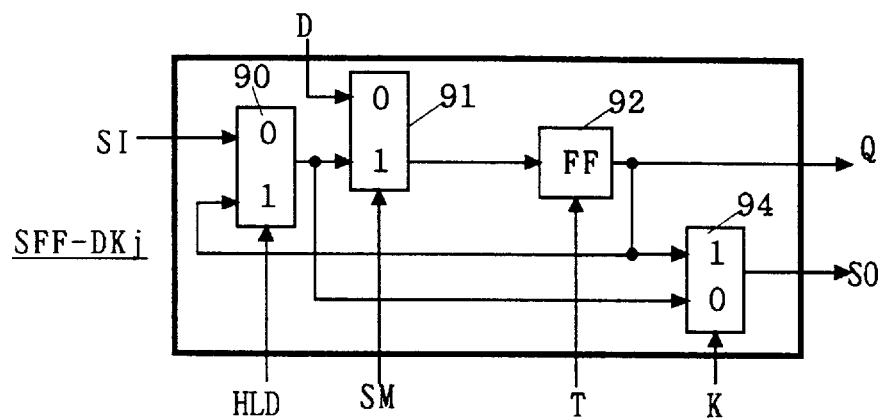
Figure 162:
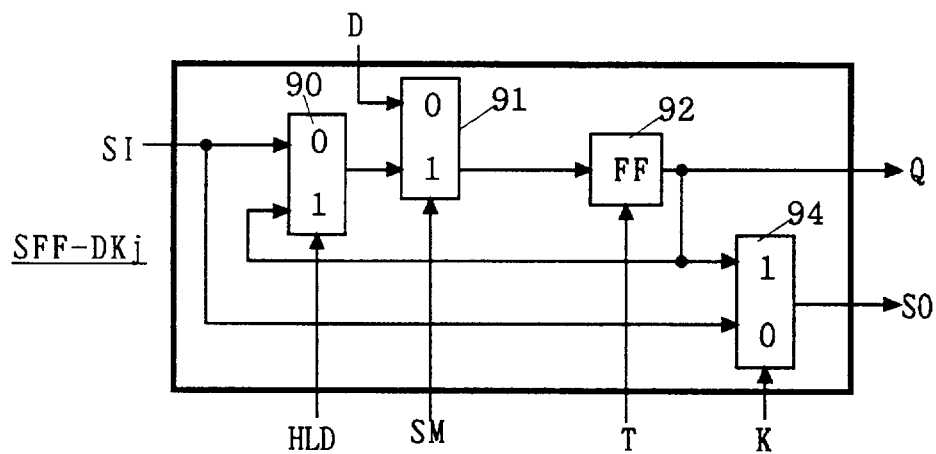

FIGS. 161 and 162 are circuit diagrams of other forms of the input scan flip-flop SFF-DKj. The scan output terminal SO should be connected to the scan input terminal SI when the acceptance/failure data Kj is "0". Thus, the 0-input of the selector 94 may be connected to the output of the selector 90 or directly connected to the scan input terminal SI as shown in FIGS. 161 and 162.

While the invention has been described in detail, the foregoing description is in all aspects illustrative and not restrictive. It is understood that numerous other modifications and variations can be devised without departing from the scope of the invention.

We claim:

1. A method of testing a content addressable memory circuit having an m by n array of content addressable memory cells and n match signal lines, each of said content addressable memory cells being located at an intersection of an i-th column, with $0 \leq i \leq n-1$, and a j-th row, with $0 \leq j \leq m-1$, in said array, said method comprising the steps of:

initializing all of said content addressable memory cells with a set of initial logic value for each column of said array;

forming an initial pattern including m input signals corresponding to said set of initial logic value;

inverting the logic value of one of said m input signals of said initial pattern to form a test pattern;

conducting a search operation with said test pattern in said content addressable memory circuit by applying said test pattern to the content addressable memory cells in said array while checking signals on said n match signal lines; and writing said test pattern into an i-th column and updating a column number i.

2. The method of claim 1, wherein said conducting search operation and checking signals step and the writing step are repeated with a newly formed test pattern each time a logic value of one of said m input signals is inverted to form each new test pattern.

3. The method of claim 1, wherein said conducting said search operation and checking signals step is performed whenever said inverting step is performed and whenever said writing step is performed.

4. The method of claim 1, wherein said conducting said search operation and checking signals step is repeated each time said column number i is updated.

5. A test circuit for testing a content addressable memory circuit having an m by n array of content addressable memory cells and n match signal lines, each of said content addressable memory cells being located at an intersection of an i-th column, with $0 \leq i \leq n-1$, and a j-th row, with $0 \leq j \leq m-1$, in said array, said test circuit comprising:

a first inverter having an input and an output;

m scan flip-flops for input corresponding to each of m rows of said array, said m scan flip-flops for input each having a scan input and a scan output, said m scan flip-flops for input forming a scan path having a serial input and a serial output with said m scan flip-flops for input being connected in series with a said scan input of one of said m scan flip-flops for input being connected to a said scan output of another of said m scan flip-flops for input, and said scan path being controlled by a clock supplying a same clock signal to each of the m scan flip-flops for input;

wherein said serial input of said scan path is connected to said output of said first inverter;

wherein said serial output of said scan path is connected to said input of said first inverter;

wherein a j-th one of said m scan flip-flops for input holds a j-th input signal to be written into each j-th row of said array for each of said n columns of said arrays; and wherein a content held in the j-th row of said array is searched in said content addressable memory circuit.

6. The test circuit of claim 5, wherein whether an input hold signal for causing zeroth to (m-1)-th ones of said m scan flip-flops for input to hold zeroth to (m-1)-th input signals, respectively, is active/inactive is determined in response to a last address detection signal for detecting a selection of an (n-1)-th column of content addressable memory cells, said test circuit further comprising:

a counter for executing/stopping a counting function responsive to said clock signal when an address hold signal is inactive/active, respectively, to update a column number i by said counting function;

a scan-flip-flop for holding said last address detection signal in response to said clock signal to output said last address detection signal as said address hold signal after an elapse of one clock cycle; and a write enable signal generating portion for generating a write enable signal for permitting said zeroth to (m-1)-th input signals to be written into said content addressable memory cells in response to said clock signal when said address hold signal is inactive.

7. The test circuit of claim 6, wherein said content addressable memory circuit further includes a decoder for decoding the output from said counter to output an i-th decode output for selecting said i-th column of said content addressable memory cells, said test circuit further comprising:

an expected value generator circuit receiving the output from said scan flip-flop and zeroth to (n-1)-th decode outputs, said expected value generator circuit generating a group of expected values indicative of the results of comparison between the content held in said content addressable memory cells and said j-th input signal held in said j-th one of said m scan flip-flops for input when said content addressable memory cells are under normal condition, said expected value generator circuit including a q-th OR circuit with $0 \leq q \leq n-2$, for outputting an OR of q-th to (n-1)-th decode outputs, a q-th AND circuit for receiving the output from said q-th OR circuit and an inverted logic of the output from said scan flip-flop to output a q-th expected value associated with a q-th column, and an (n-1)-th AND circuit for receiving said (n-1)-th decode output and the output from said scan flip-flop to output an (n-1)-th expected value associated with an (n-1)-th column, wherein said group of expected values are zeroth to said (n-1)-th expected values.

8. The test circuit of claim 6, wherein said content addressable memory circuit further has a decoder for decoding the output from said counter to output an i-th decode output for selecting said i-th column of said content addressable memory cells, said test circuit further comprising:

an expected value generator circuit receiving the output from said scan flip-flop and zeroth to (n-1)-th decode outputs, said expected value generator circuit generating a group of expected values indicative of the results of comparison between the content held in said content addressable memory cells and said j-th input signal held in said j-th one of said m scan flip-flops for input when said content addressable memory cells are under normal condition, said expected value generator circuit including, an i-th RS flip-flop having a reset terminal receiving the output from said scan flip-flop, a set terminal receiving said i-th decode output, and an output for outputting an i-th expected value associated with said i-th column, wherein said group of expected values are zeroth to (n-1)-th expected values.

9. The test circuit of claim 5, further comprising:

a counter for executing/stopping a counting function responsive to said clock signal when an address hold signal is inactive/active, respectively, to update a column number i by said counting function, said counter counting up/down when a count direction signal is inactive/active, respectively, while said counting function is performed;

a selector having a first input receiving a last address detection signal for detecting a selection of an (n-1)-th column of content addressable memory cells, a second input receiving a first address detection signal for detecting a selection of a zeroth column of content addressable memory cells, and an output for outputting a specific address detection signal, said specific address detection signal being the value at said first/second input when said count direction signal is inactive/active, respectively; and a first logic circuit for generating said count direction signal in response to a zeroth input signal; and a second logic circuit for outputting as said address hold signal an AND of the output from said selector and an exclusive OR of said zeroth input signal and an inverted version of a logic at said serial output of said scan path, wherein whether an input hold signal for causing zeroth to (m−1)-th ones of said m scan flip-flops for input to hold zeroth to (m−1)-th input signals, respectively, is active/inactive is determined in response to said specific address detection signal.

10. The test circuit of claim 9, wherein said content addressable memory circuit further has a decoder for decoding the output from said counter to output an i-th decode output for selecting said i-th column of said content addressable memory cells, said test circuit further comprising:

an expected value generator circuit receiving said specific address detection signal, signal count direction signal, and zeroth to (n−1)-th decode outputs, said expected value generator circuit generating a group of expected values indicative of the results of comparison between the content held in said content addressable memory cells and said j-th input signal held in said j-th one of said m scan flip-flops for input when said content addressable memory cells are under normal condition, said expected value generator circuit including, a flip-flop receiving said specific address detection signal for operating in response to said clock signal, an i-th RS flip-flop having a reset terminal receiving the output from said flip-flop, and a set terminal receiving said i-th decode output, a first OR circuit for outputting an OR of an inverted logic of said count direction signal and an output from a zeroth RS flip-flop as a zeroth expected value associated with a zeroth column, and a second OR circuit for outputting an OR of said count direction signal and an output from an (n−1)-th RS flip-flop as an (n−1)-th expected value associated with an (n−1)-th column, wherein the outputs from first to (n−2)-th RS flip-flops are used as first to (n−2)-th expected values associated with first to (n−2)-th columns, respectively, and wherein said group of expected values are said zeroth to (n−1)-th expected values.

11. The test circuit of claim 9, wherein said content addressable memory circuit further has a decoder for decoding the output from said counter to output an i-th decode output for selecting said i-th column of said content addressable memory cells, said test circuit further comprising:

an expected value generator circuit receiving said specific address detection signal and zeroth to (n−1)-th decode outputs, said expected value generator circuit generating a group of expected values indicative of the results of comparison between the content held in said content addressable memory cells and said j-th input signal held in said j-th one of said m scan flip-flops for input when said content addressable memory cells are under normal condition, said expected value generator circuit including, a flip-flop receiving said specific address detection signal for operating in response to said clock signal, an i-th RS flip-flop having a reset terminal receiving an output from said flip-flop, a set terminal receiving said i-th decode output, a non-inverted output, and an inverted output, a first inverter having an input connected to an inverted output of a zeroth RS flip-flop, and an output for outputting a zeroth expected value associated with a zeroth column, and a second inverter having an input connected to an inverted output of an (n−1)-th RS flip-flop, and an output for outputting an (n−1)-th expected value associated with an (n−1)-th column, wherein the values at said non-inverted outputs of first to (n−2)-th RS flip-flops are used as first to (n−2)-th expected values associated with first to (n−2)-th columns, respectively, and wherein said group of expected values are said zeroth to (n−1)-th expected values.

12. The test circuit of claim 5, further comprising:

a counter for executing/stopping a counting function responsive to said clock signal when an address hold signal is inactive/active, respectively, to update a column number i by said counting function;

a scan flip-flop having an input and an output for holding a value at its input in response to said clock signal to output said value after an elapse of one clock cycle;

a second inverter having an input connected to said output of said scan flip-flop, and an output connected to said input of said scan flip-flop; and a write enable signal generating portion for generating a write enable signal for permitting said i-th input signal to be written into said content addressable memory cells in response to said clock signal when the output from said scan flip-flop is inactive, wherein said address hold signal is active when said j-th input signal has a specific logic and the output from said scan flip-flop is inactive, and wherein the output from said scan flip-flop acts as an input hold signal for causing zeroth to (m−1)-th ones of said m scan flip-flops for input to hold zeroth to (m−1)-th input signals, respectively.

13. The test circuit of claim 12, further comprising:

a logic circuit for receiving said zeroth and (m−1)-th input signals and the output from said scan flip-flop to output said address hold signal.

14. The test circuit of claim 12, wherein said content addressable memory circuit further has a decoder for decoding the output from said counter to output an i-th decode output for selecting said i-th column of said content addressable memory cells, said test circuit further comprising:

an input value detecting circuit for detecting said j-th input signal having a specific logic; and an expected value generator circuit receiving the output from said input value detecting circuit, the output from said scan flip-flop, and zeroth to (n−1)-th decode outputs, said expected value generator circuit generating a groups of expected values indicative of the results of comparison between the content held in said content addressable memory cells and said j-th input signal held in said j-th one of said m scan flip-flops for input when said content addressable memory cells are under normal condition, said expected value generator circuit including, a reset pulse generator circuit for outputting a reset signal in response to an OR of the output from said input value detecting circuit and the output from said scan flip-flop, an i-th RS flip-flop having a reset terminal receiving said reset signal, a set terminal receiving said i-the decode output, a non-inverted output, and an inverted output, and an i-th selector having first and second inputs connected to said inverted output and non-inverted output of said i-th RS flip-flop, respectively, and an output for selectively outputting the value at its first or second input as an i-th expected value associated with said i-th column in response to the output from said input value detecting circuit, wherein said group of expected values are zeroth to (n−1)-th expected values.

15. The test circuit of claim 12, wherein said content addressable memory circuit further has a decoder for decoding the output from said counter to output an i-th decode output for selecting said i-th column of said content addressable memory cells, said test circuit further comprising:

an input value detecting circuit for detecting said j-th input signal having a specific logic; and an expected value generator circuit receiving the output from said input value detecting circuit, the output from said scan flip-flop, and zeroth to (n−1)-th decode outputs, said expected value generator circuit for generating a group of expected values indicative of the results of comparison between the content held in said content addressable memory cells and said j-th input signal held in said j-th one of said m scan flip-flops for input when said content addressable memory cells are under normal condition, said expected value generator circuit including, an exclusive-OR circuit for receiving the output from said input value detecting circuit and the output from said scan flip-flop, an i-th AND circuit for receiving the output from said exclusive-OR circuit and said i-th decode output, and an i-th exclusive-NOR circuit for receiving the output from said i-th AND circuit and the output from said input value detecting circuit to output an i-th expected value associated with the i-th column, wherein said group of expected values are zeroth to (n−1)-th expected values.

16. A content addressable memory circuit with redundancy function having zeroth to (n−1)-th columns of content addressable memory cells arranged in m rows each, and an n-th column of content addressable memory cells arranged in m rows, said content addressable memory circuit with redundancy function for determining whether or not external test data match comparison data stored in said zeroth to n-th columns of content addressable memory cells, said content addressable memory circuit with redundancy function comprising:

(a) an output portion for storing an i-th acceptance/failure data indicative of an active/inactive state when an i-th column of content addressable memory cells are acceptable/failed to output an i-th coincidence determination signal candidate and an n-th coincidence determination signal candidate, wherein $0 \leq i \leq n-1$, and said i-th coincidence determination signal candidate indicating whether or not said comparison data stored in said i-th column of content addressable memory cells match said test data, said n-th coincidence determination signal candidate indicating whether or not said comparison data stored in said i-th column of content addressable memory cells match said test data;

(b) a first control circuit receiving said zeroth to (n−1)-th acceptance/failure data and said zeroth to n-th coincidence determination signal candidates and including, (b-1) a group of gates outputting zeroth to (n−1)-th control signals, and (b-2) a group of selectors for outputting as an i-th coincidence determination signal said i-th coincidence determination signal candidate or an (i+1)-th coincidence determination signal candidate in response to an active/inactive state of said i-th control signal;

(c) a second control circuit receiving first to n-th column specifying raw signals corresponding respectively to said zeroth to (n−1)-th columns of content addressable memory cells and alternatively activated, said second to n-th control signals, and said first to n-th acceptance/failure data and including, (c-1) a group of selectors for outputting as a (t+1)-th column specifying signal candidate, with $0 \leq t \leq n-2$, and a t-th column specifying raw signal or said (t+1)-th column specifying raw signal in response to an active/inactive state of a t-th control signal, and outputting as an n-th column signal specifying candidate said (n−1)-th column specifying raw signal or "0" in response to an inactive/active state of said (n−1)-th control signal, and (c-2) a group of gates for determining an AND state of said i-th column specifying signal candidate and said i-th acceptance/failure data to output an i-th column specifying signal;

said group of gates of said first control circuit outputting said zeroth acceptance/failure data as said zeroth control signal and an AND state of a k-th acceptance/failure data and a (k−1)-th control signal as a k-th control signal, with $1 \leq k \leq n-1$;

said zeroth column specifying signal candidate being said zeroth column specifying raw signal;

said n-th column specifying signal candidate being said n-th column specifying signal; and said zeroth to n-th columns of content addressable memory cells being selected in response to said zeroth to n-th column specifying signals.

17. The content addressable memory circuit with redundancy function of claim 16, wherein said group of selectors of said second control circuit include a logic gate for outputting as said n-th column signal specifying candidate the AND of the inverted logic of said (n−1)-th control signal and said (n−1)-th column specifying raw signal.

18. The content addressable memory circuit with redundancy function of claim 17, wherein said output portion comprises zeroth to n-th output elements, each s-th output element, with $0 \leq s \leq 1$, including, (a-1) a flip-flop for storing said s-th acceptance/failure data, and (a-2) a first selector having an output connected to the input of said flip-flop, a first input receiving said s-th coincidence determination signal candidate, a second input receiving the result of comparison between said s-th coincidence determination signal candidate and its associated expected value, and a control end receiving a shift mode signal, said output of said first selector being connected to said first or second input when said shift mode signal is inactive/active, respectively.

19. A content addressable memory circuit with redundancy function having zeroth to (m−1)-th rows of content addressable memory cells arranged in n columns each, and an m-th row of content addressable memory cells arranged in n columns, said content addressable memory circuit with redundancy function for determining whether or not external test data match comparison data stored in said zeroth to n-th columns of content addressable memory cells, said content addressable memory circuit with redundancy function comprising:

(a) an output portion receiving the outputs from said zeroth to m-th rows of content addressable memory cells and their associated expected values to output zeroth to m-th acceptance/failure data and zeroth to m-th output signal candidates, said zeroth to m-th acceptance/failure data being active/inactive when said zeroth to m-th rows of content addressable memory cells are acceptable/failed, respectively, said zeroth to m-th output signal candidates being the outputs from said zeroth to m-th rows of content addressable memory cells;

(b) a j-th input scan flip-flop, with $0 \leq j \leq m$, including a selector, said j-th input scan can flip-flop having,
(b-1) a scan input terminal,
(b-2) a flip-flop, and
(b-3) a scan output terminal having a first input connected to said scan input terminal, a second input connected to said scan input terminal through said flip-flop, and an output connected to said first or second input when said j-th acceptance/failure data is active/inactive, respectively;

wherein zeroth to m-th input scan flip-flops are sequentially connected in series; and (c) an inverter having an input connected to an m-th scan output terminal of an m-th scan flip-flop, and an output connected to a zeroth scan input terminal of a zeroth scan flip-flop.

20. The content addressable memory circuit with redundancy function of claim 19, further comprising:

(d) a group of gates receiving the zeroth to m-th acceptance/failure data to output zeroth to m-th control signals;

(e) a first group of selectors receiving zeroth to (m−1)-th input signal candidates, said first group of selectors using said zeroth input signal candidate as a zeroth raw input signal when said zeroth control signal is active, said first group of selectors using as a p-th raw input signal, with $1 \leq p \leq m-1$, a (p−1)-th input signal candidate or a p-th input signal candidate when a p-th control signal is inactive/active, respectively, said first group of selectors using an (m−1)-th input signal candidate as an m-th raw input signal when an m-th control signal is inactive, said first group of selectors applying said zeroth to m-th raw input signals to said zeroth to m-th input scan flip-flops, respectively;

(f) a second group of selectors receiving zeroth to m-th output signal candidates outputted respectively from said zeroth to m-th rows of content addressable memory cells, said second group of selectors outputting as a u-th output signal, with $0 \leq u \leq m-1$, a u-th output signal candidate or a (u+1)-th output signal candidate when a u-th control signal is inactive/active, respectively;

said zeroth acceptance/failure data being used as the zeroth control signal; and said j-th input scan flip-flop applying said j-th raw input signal to said j-th row of content addressable memory cells through said flip-flop thereof.

* * * * *